(12) United States Patent
Smith et al.

(10) Patent No.: US 10,796,123 B2
(45) Date of Patent: Oct. 6, 2020

(54) SYSTEMS AND METHODS FOR OPTICAL SENSING USING POINT-BASED ILLUMINATION

(71) Applicant: WILL SEMICONDUCTOR (SHANGHAI) CO., LTD., Shanghai (CN)

(72) Inventors: Patrick Smith, San Jose, CA (US); Arash Akhavan Fomani, Saratoga, CA (US); Marek Mienko, San Jose, CA (US); Bob Lee Mackey, San Jose, CA (US); Guozhong Shen, San Jose, CA (US)

(73) Assignee: Will Semiconductor (Shanghai) Co. Ltd., Shanghai (CN)

( * ) Notice: Subject to any disclaimer, the term of this patent is extended or adjusted under 35 U.S.C. 154(b) by 72 days.

(21) Appl. No.: 16/006,639

(22) Filed: Jun. 12, 2018

(65) Prior Publication Data

US 2018/0357460 A1 Dec. 13, 2018

Related U.S. Application Data

(60) Provisional application No. 62/518,582, filed on Jun. 12, 2017.

(51) Int. Cl.
*G06K 9/00* (2006.01)
*G02F 1/137* (2006.01)
(Continued)

(52) U.S. Cl.
CPC ........ *G06K 9/00013* (2013.01); *G01J 1/0429* (2013.01); *G02B 5/3025* (2013.01); *G02F 1/137* (2013.01); *G02F 1/13318* (2013.01); *G02F 1/13338* (2013.01); *G06K 9/0004* (2013.01); *G06K 9/00026* (2013.01);
(Continued)

(58) Field of Classification Search
CPC ........... G06K 9/00013; G06K 9/00026; G06K 9/0004; G06T 7/74; G02F 1/13318; G02F 1/13338; H01L 25/167
See application file for complete search history.

(56) References Cited

U.S. PATENT DOCUMENTS

| 8,749,529 | B2 * | 6/2014 | Powell | G06F 3/0421 |
| | | | | 345/175 |
| 10,282,581 | B2 * | 5/2019 | Park | G06K 9/0002 |

(Continued)

FOREIGN PATENT DOCUMENTS

| KR | 10-2016-0056389 | 5/2016 |
| WO | WO16-154378 A1 | 9/2016 |

OTHER PUBLICATIONS

Search Report, dated Sep. 21, 2018, in International Patent Application No. PCT/US2018/037144.
(Continued)

*Primary Examiner* — Utpal D Shah
(74) *Attorney, Agent, or Firm* — Christensen O'Connor Johnson Kindness PLLC

(57) ABSTRACT

Optical sensing systems and methods for imaging objects include under-display optical sensors with one or multiple discrete light sources positioned on, in or under the display. The optical sensors may include an array of optical sensing elements, e.g., photodetectors, arranged in or under the display. The displays include OLED or LCD displays.

18 Claims, 36 Drawing Sheets

(51) Int. Cl.

| | |
|---|---|
| *H01L 27/32* | (2006.01) |
| *G01J 1/04* | (2006.01) |
| *G02B 5/30* | (2006.01) |
| *G02F 1/1333* | (2006.01) |
| *H01L 51/52* | (2006.01) |
| *G06T 7/73* | (2017.01) |
| *G02F 1/133* | (2006.01) |
| *G06K 9/20* | (2006.01) |
| *G06K 9/42* | (2006.01) |
| *G06K 9/46* | (2006.01) |
| *G06T 3/40* | (2006.01) |
| *H01L 25/16* | (2006.01) |
| *G02F 1/1368* | (2006.01) |

(52) U.S. Cl.
CPC ....... *G06K 9/00087* (2013.01); *G06K 9/2054* (2013.01); *G06K 9/42* (2013.01); *G06K 9/4661* (2013.01); *G06T 3/40* (2013.01); *G06T 7/74* (2017.01); *H01L 25/167* (2013.01); *H01L 27/323* (2013.01); *H01L 27/3227* (2013.01); *H01L 27/3234* (2013.01); *H01L 51/5281* (2013.01); *G02F 1/1368* (2013.01); *G02F 2001/133331* (2013.01); *G02F 2201/50* (2013.01); *G06T 2207/20221* (2013.01)

(56) References Cited

U.S. PATENT DOCUMENTS

| | | | |
|---|---|---|---|
| 10,339,359 | B2* | 7/2019 | Zhang ................ G09G 3/3225 |
| 10,381,387 | B2* | 8/2019 | Mainguet ............ G06K 9/2054 |
| 2007/0206842 | A1 | 9/2007 | Hamid |
| 2014/0355846 | A1 | 12/2014 | Lee et al. |
| 2016/0078270 | A1 | 3/2016 | Lee et al. |
| 2017/0147850 | A1* | 5/2017 | Liu ..................... G06K 9/0002 |
| 2017/0262686 | A1* | 9/2017 | Gao .................. G06K 9/00046 |
| 2018/0012069 | A1 | 1/2018 | Chung et al. |
| 2018/0046837 | A1* | 2/2018 | Gozzini ............. G06K 9/0004 |
| 2018/0239146 | A1 | 8/2018 | Bierhuizen et al. |
| 2018/0267307 | A1 | 9/2018 | Yoshida et al. |
| 2018/0357462 | A1 | 12/2018 | Mackey et al. |
| 2019/0041746 | A1 | 2/2019 | Qi et al. |
| 2019/0114457 | A1 | 4/2019 | Li et al. |
| 2019/0196174 | A1 | 6/2019 | Park et al. |
| 2019/0235145 | A1 | 8/2019 | Sharp et al. |
| 2019/0280039 | A1* | 9/2019 | Jia .................... H01L 27/14692 |

OTHER PUBLICATIONS

Written Opinion, dated Sep. 21, 2018, in International Patent Application No. PCT/US2018/037144.

Jain, Anil K., "Filterbank-Based Fingerprint Matching," IEEE Transactions on Image Processing, vol. 9, No. 5, May 2000, pp. 846-859, Department of Computer Science and Engineering, Michigan State University, East Lansing, MI.

U.S. Appl. No. 15/990,353, filed May 25, 2018.

\* cited by examiner

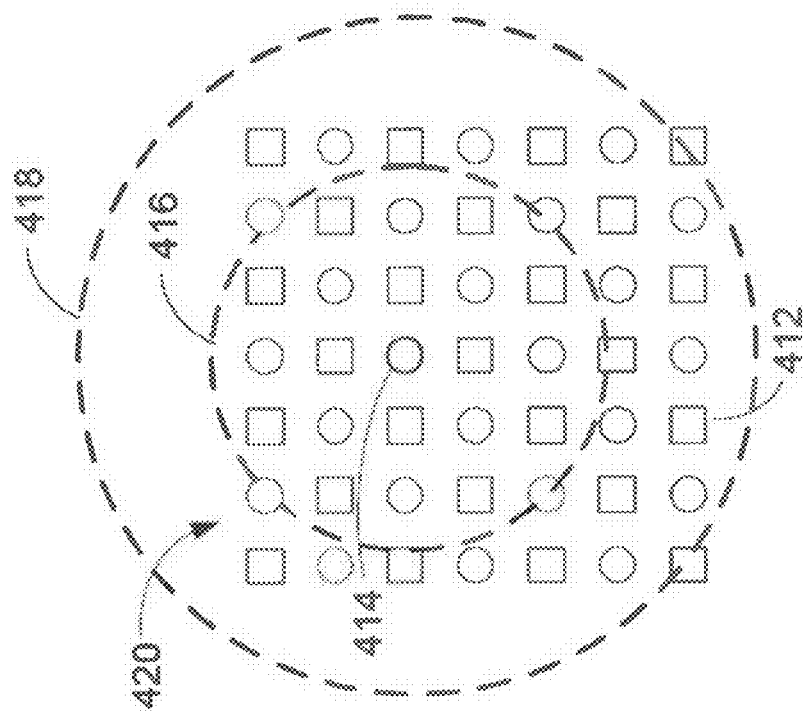
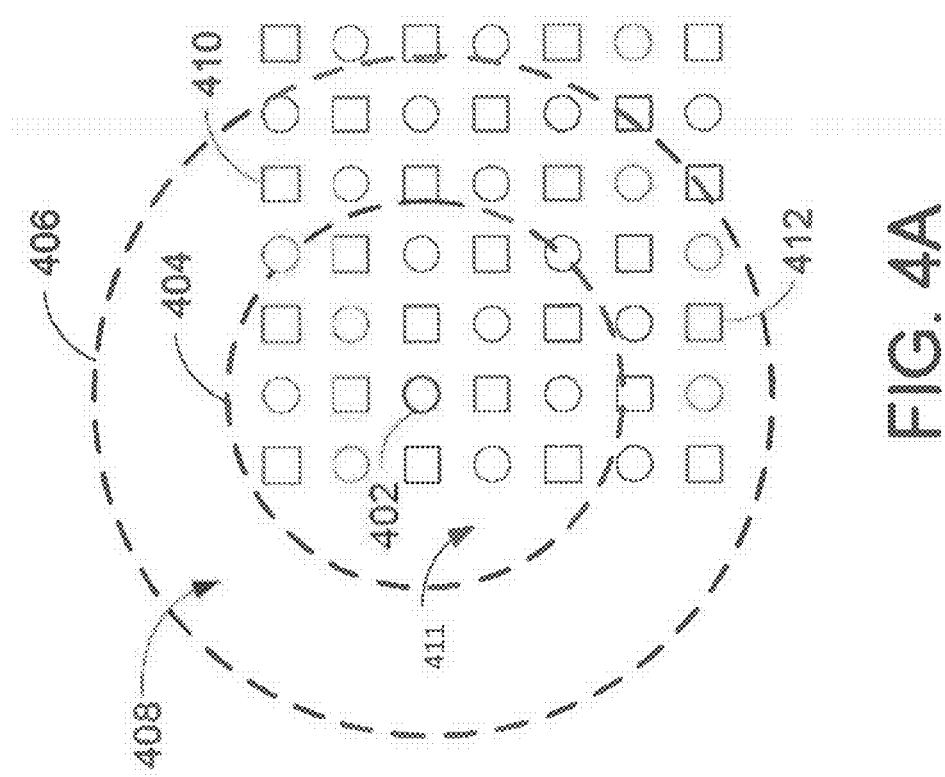

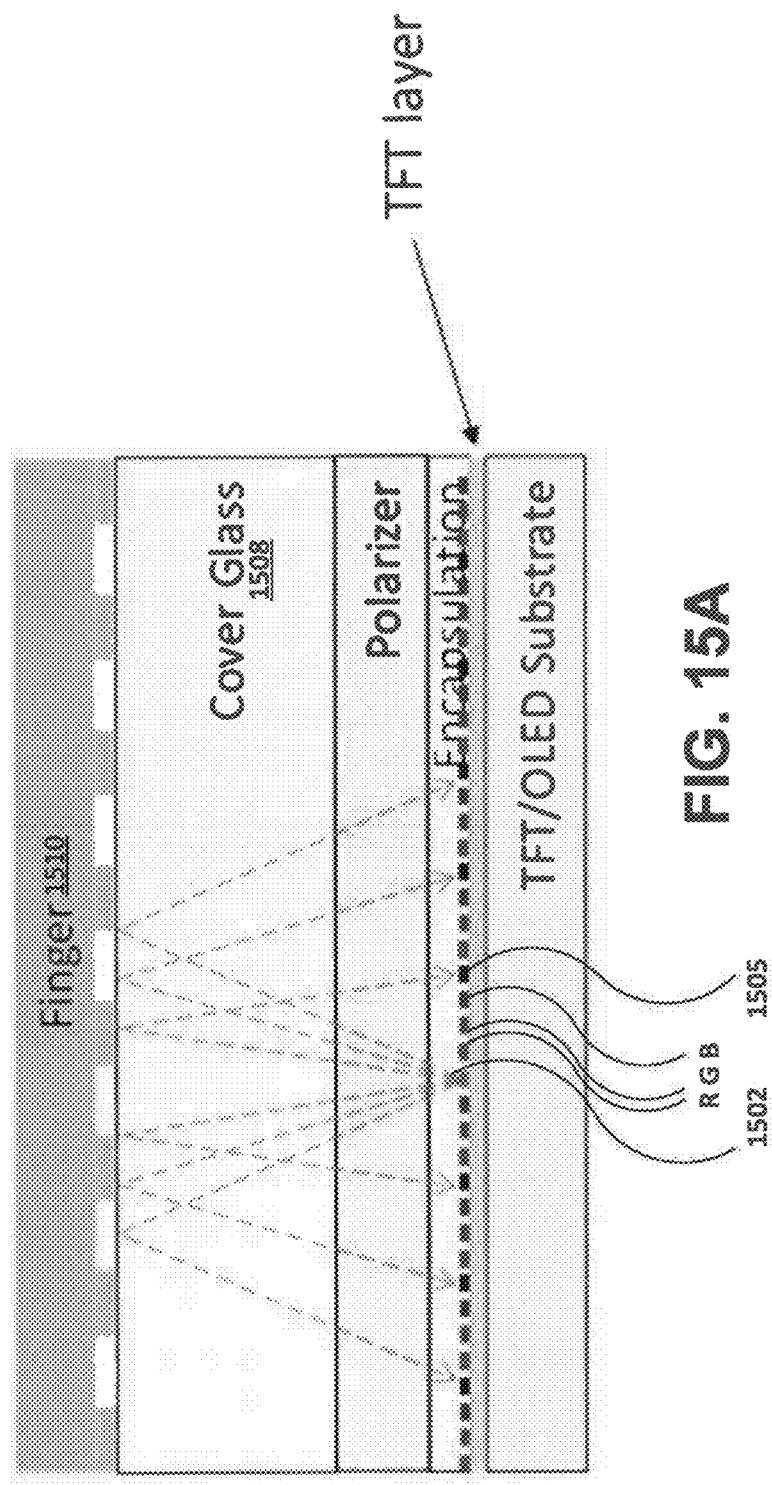

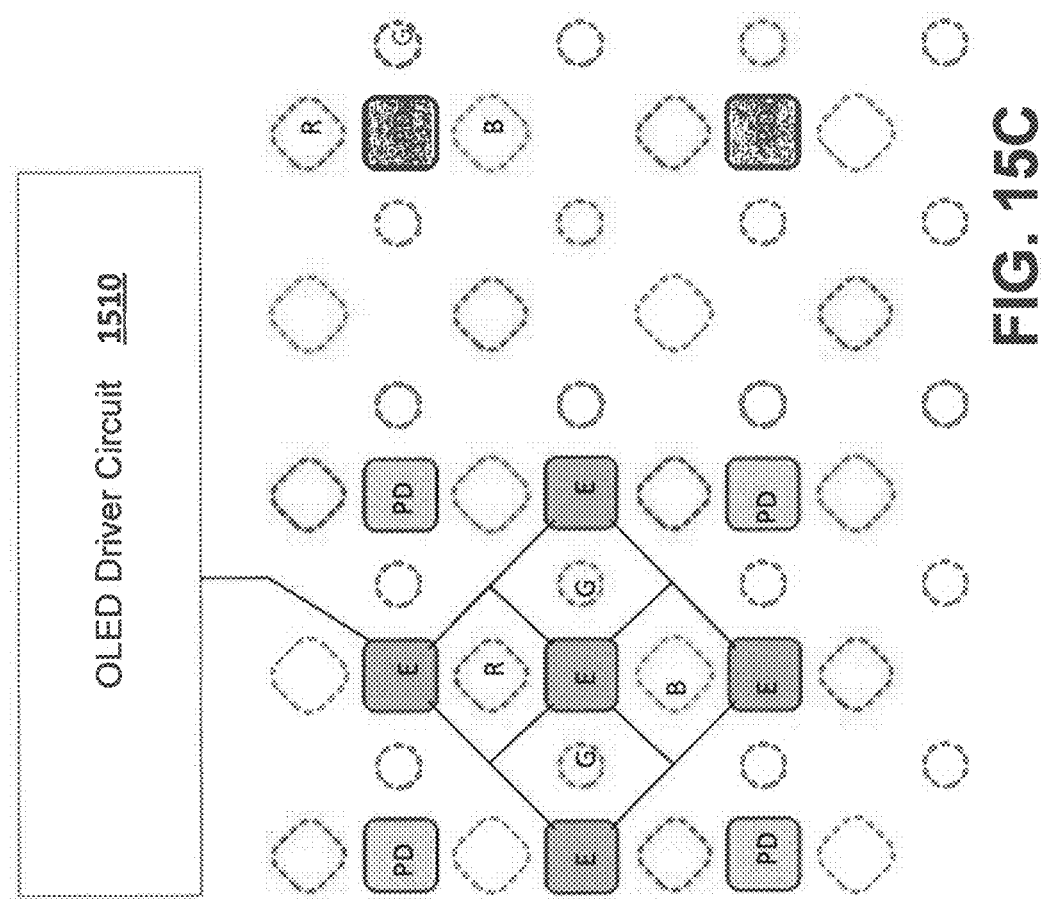

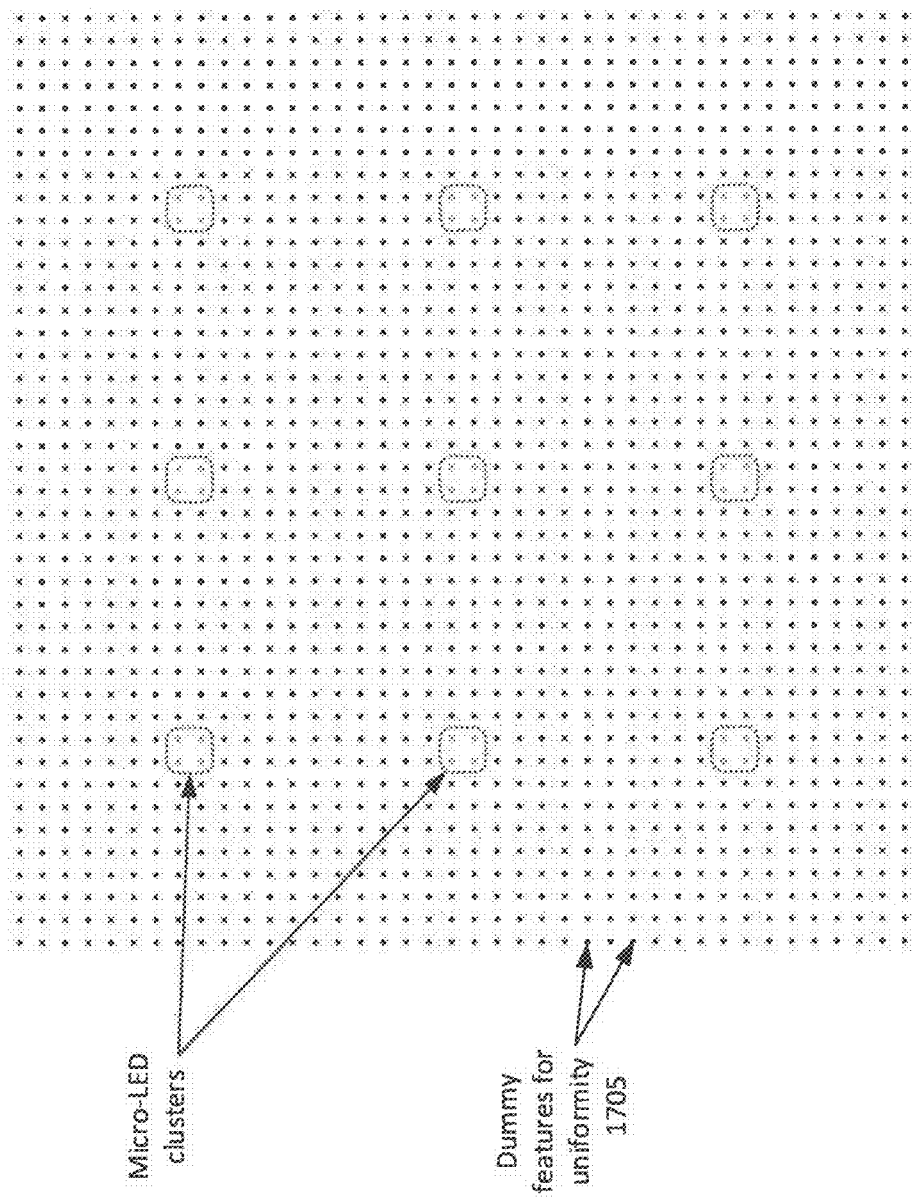

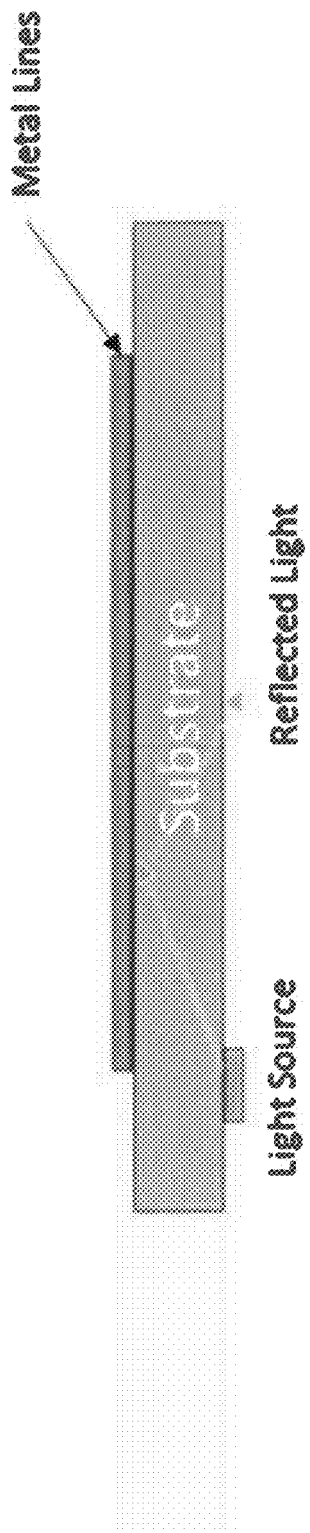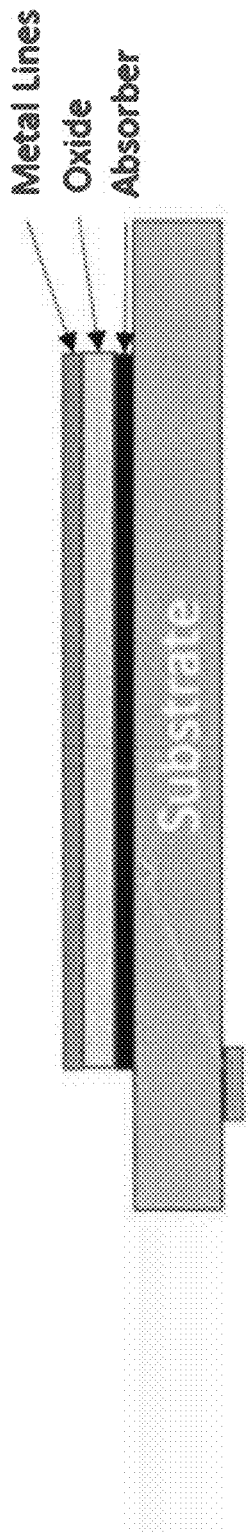
FIG. 29A
FIG. 29B

SYSTEMS AND METHODS FOR OPTICAL SENSING USING POINT-BASED ILLUMINATION

CROSS-REFERENCE TO RELATED APPLICATIONS

The present application claims the benefit under 35 U.S.C. § 119(e) of U.S. Provisional Application Ser. No. 62/518,582, filed Jun. 12, 2017, and titled "SYSTEMS AND METHODS FOR OPTICAL SENSING USING POINT-BASED ILLUMINATION," which is hereby incorporated by reference in its entirety.

BACKGROUND

Object imaging is useful in a variety of applications. By way of example, biometric recognition systems image biometric objects for authenticating and/or verifying users of devices incorporating the recognition systems. Biometric imaging provides a reliable, non-intrusive way to verify individual identity for recognition purposes. Various types of sensors may be used for biometric imaging including optical sensors.

SUMMARY

The present disclosure generally provides optical sensing systems and methods for imaging objects. Various embodiments include under-display optical sensors with one or multiple discrete light sources positioned on, in or under the display. The optical sensors may include an array of optical sensing elements, e.g., photodetectors.

According to an embodiment, an optical sensing system is provided that includes a display substrate, a plurality of display elements, e.g., for displaying visible images, a sensor light source for illuminating a sensing region, wherein the sensor light source is separate from the plurality of display elements, and a detector for detecting light from the sensing region. In certain aspects, the plurality of display elements comprises a color filter, a liquid crystal material disposed between the display substrate and the color filter, and a backlight disposed under the display substrate. In certain aspects, the sensor light source comprises a light emitting diode (LED) disposed over the display substrate, or under the display substrate, or in the display substrate. In certain aspects, the sensor light source comprises a light emitting diode (LED) disposed in an opaque region of an active area of the display substrate. In certain aspects, the optical sensing system further includes a dummy pattern disposed over the backlight, the dummy pattern comprising a plurality of light blocking features disposed between the backlight and the display substrate. In certain aspects, the sensor light source comprises a micro LED arranged in a cluster of multiple micro LEDs. In certain aspects, a width of the sensor light source or a width of a cluster containing the sensor light source is configured to emit light around a shadowing feature disposed in an illumination path between the sensor light source and the sensing region.

In certain aspects, the detector includes a detector array disposed over the display substrate, wherein the detector array comprises a plurality of photosensors arranged a plurality of rows and a plurality of columns; wherein the sensor light source is disposed in a first position aligned with one of the rows and one of the columns, wherein the first position is free of any photosensor. In certain aspects, the optical sensing system further includes processing circuitry coupled to the detector array, wherein the processing circuitry is configured to receive a plurality of pixel values from the plurality of photosensors, and wherein the processing circuitry is configured to determine a value of a pixel corresponding to the first position based on one or more pixel values of the plurality of pixel values. In certain aspects, the processing circuitry is configured to determine the value of the pixel by interpolating a plurality of surrounding pixel values that surround the first position.

In certain aspects, the optical sensing system further includes display pixel circuitry disposed over the display substrate, wherein the plurality of display elements includes a plurality of organic light emitting diode (OLED) sub-pixels for displaying visible images, and wherein the sensor light source includes a sensor OLED separate from the plurality of OLED sub-pixels, wherein the sensor OLED is disposed over the display substrate. In certain aspects, the sensor OLED is configured to be driven with a higher current than the plurality of OLED sub-pixels. In certain aspects, the sensor OLED is configured to emit higher intensity light than the plurality of OLED sub-pixels. In certain aspects, the optical sensing system further includes one or more other sensor OLEDs in addition to the sensor OLED, wherein the sensor OLED and the one or more other sensor OLEDs are arranged in a cluster.

In certain aspects, the plurality of display elements comprises display pixel circuitry disposed over the display substrate, and the sensing system further includes a transparent cover sheet disposed over the display pixel circuitry, wherein a top surface of the transparent cover sheet provides a sensing surface for an object, wherein the sensor light source is disposed under the display substrate, and wherein the detector includes a plurality of photosensors disposed under the display substrate. In certain aspects, the optical sensing system further includes a low index layer disposed below the display substrate and disposed over the plurality of photosensors, wherein the low index layer is not disposed over the sensor light source, and wherein the low index layer has an index of refraction lower than the display substrate. In certain aspects, the optical sensing system further includes a light absorbing layer disposed in an area between the plurality of photosensors.

In certain aspects, the plurality of display elements comprises display pixel circuitry disposed over the display substrate, and the sensing system further includes a transparent cover sheet disposed over the display pixel circuitry, wherein a top surface of the transparent cover sheet provides a sensing surface for an object, wherein the sensor light source is disposed over the display substrate, and wherein the detector includes a plurality of photosensors disposed under the display substrate, wherein the plurality of photosensors are configured to capture a magnified image of a fingerprint based on point illumination from the sensor light source. In certain aspects, a photosensor in the plurality of photosensors has a larger area than a display pixel associated with the display pixel circuitry.

In certain aspects, the color filter comprises a color filter layer having an opaque portion and a plurality of different subpixel color filters, wherein the color filter layer is disposed over the liquid crystal material. In certain aspects, the optical sensing system further includes display pixel circuitry for applying current to the liquid crystal material, wherein the display pixel circuitry is disposed over the display substrate, and a transparent cover sheet disposed over the color filter, wherein a top surface of the transparent cover sheet comprises a fingerprint sensing surface disposed within an areal extent of the active area of the display substrate. In certain aspects, the sensor light source comprises a micro light emitting diode (LED) for illuminating a finger contacting the fingerprint sensing surface with emitted light, wherein the micro LED is disposed within the areal extent of the active area, and the detector comprises a detector array having a plurality of photosensors for detecting returned light from the fingerprint sensing surface, wherein the returned light corresponds to interaction of the emitted light with the finger, wherein the plurality of photosensors are disposed within the areal extent of the active area. In certain aspects, the micro LED is disposed between the backlight and the display substrate or is disposed between the display substrate and the color filter layer. In certain aspects, the opaque portion of the color filter layer comprises a black matrix. In certain aspects, the plurality of photosensors are disposed over the display substrate.

In certain aspects, the micro LED is disposed between the backlight and the transparent display substrate. In certain aspects, the optical sensing system further includes a plurality of micro LEDs in addition to the micro LED, wherein the plurality of micro LEDs and the micro LED are arranged in a pattern within the areal extent of the active area, wherein the plurality of micro LEDs and the micro LED partially occlude the display light from the backlight. In certain aspects, the optical sensing further includes a dummy pattern disposed within the areal extent of the active area, wherein the dummy pattern partially occludes the display light from the backlight. In certain aspects, the dummy pattern comprises a plurality of light blocking features disposed between the backlight and the transparent display substrate. In certain aspects, the dummy pattern periodically varies in accordance with the pattern formed by the plurality of micro LEDs and the micro LED. In certain aspects, the micro LED is disposed between the display substrate and the color filter layer. In certain aspects, the micro LED is disposed under a transparent opening in the opaque portion and is configured to emit the emitted light through the transparent opening. In certain aspects, a top surface of the micro LED comprises an anti-reflective (AR) coating. In certain aspects, the optical sensing system further includes a signal line for activating the micro LED, wherein the signal line is electrically connected to the micro LED, wherein the signal line is formed over the transparent display substrate, and wherein the signal line shares a patterned conductive layer with the display pixel circuitry. In certain aspects, the micro LED is disposed between the color filter layer and the transparent cover sheet. In certain aspects, the opaque portion of the color filter layer comprises a black matrix. In certain aspects, the plurality of photosensors are disposed over the display substrate. In certain aspects, the optical sensing system further includes a sensor line for receiving a signal from a photosensor in the plurality of photosensors, wherein the sensor line shares a patterned conductive layer with the display pixel circuitry.

According to an embodiment, an optical sensing system is provided that includes a liquid crystal display (LCD) cell, a display illuminator for illuminating the LCD cell, a sensor light source for illuminating a sensing region, wherein the sensor light source is separate from the display illuminator, and a detector for detecting light from the sensing region In certain aspects, the LCD cell comprises a display substrate, a color filter, and a liquid crystal material disposed between the display substrate and the color filter. In certain aspects, the display illuminator comprises a backlight disposed under a display substrate of the LCD cell. In certain aspects, the sensor light source includes a light emitting diode (LED) disposed over a display substrate of the LCD cell or under the display substrate of the LCD cell or disposed in the LCD cell. In certain aspects, the sensor light source comprises a light emitting diode (LED) disposed in an opaque region of an active area of the LCD cell.

According to another embodiment, an optical sensor system is provided that includes a sensor substrate, a detector array disposed over the sensor substrate, wherein the detector array includes a plurality of photosensors arranged a plurality of rows and a plurality of columns, and a light source disposed in a first position aligned with one of the rows and one of the columns, wherein the first position is free of any photosensor.

According to yet another embodiment, an organic light emitting diode (OLED) display panel is provided that includes a display substrate, display pixel circuitry disposed over the display substrate, a plurality of OLED sub-pixels for displaying visible images, and a sensor OLED separate from the plurality of OLED sub-pixels, the sensor OLED disposed over the display substrate. In certain aspects, the sensor OLED is configured to be driven with a higher current than the plurality of OLED sub-pixels and/or to emit higher intensity light than the plurality of OLED sub-pixels.

According to a further embodiment, an optical sensor system is provided that includes a display substrate, display pixel circuitry disposed over the display substrate, a transparent cover sheet disposed over the display pixel circuitry, wherein a top surface of the transparent cover sheet provides a sensing surface for an object, a sensor light source disposed under the display substrate, and a plurality of photosensors disposed under the display substrate. In certain aspects, the optical sensor system further includes a circular polarizer disposed below the display substrate, wherein the circular polarizer is disposed above the sensor light source and the plurality of light sources. In certain aspects, the optical sensor system further includes an absorbing layer disposed over the display substrate and under the display pixel circuitry. In certain aspects, the absorbing layer is patterned in accordance with a pattern of the display pixel circuitry. In certain aspects, the absorbing layer comprises a multilayer thin film absorber stack. In certain aspects, the optical sensor system further includes a high index layer disposed under the thin film absorber stack, wherein the high index layer has an index of refraction higher than the display substrate. In certain aspects, the absorbing layer comprises a black layer. In certain aspects, the optical sensor system further includes a low index layer disposed below the display substrate and disposed over the plurality of photosensors, wherein the low index layer is not disposed over the sensor light source, and wherein the low index layer has an index of refraction lower than the display substrate. In certain aspects, the optical sensor system further includes a light absorbing layer disposed in an area between the plurality of photosensors.

According to yet a further embodiment, an optical sensor system is provided that includes a display substrate, display pixel circuitry disposed over the display substrate, a transparent cover sheet disposed over the display pixel circuitry, wherein a top surface of the transparent cover sheet provides a sensing surface for an object, a sensor light source disposed over the display substrate, and a plurality of photosensors disposed under the display substrate, wherein the plurality of photosensors are configured to capture a magnified image of a fingerprint based on point illumination from the sensor light source. In certain aspects, a photosensor in the plurality of photosensors has a larger area than a display pixel associated with the display pixel circuitry.

According to another embodiment, an image processing method is provided that includes receiving, with processing circuitry, an image associated with an optical sensor system, wherein the optical sensor system comprises a light source and an array of photosensors for capturing the image, generating, with the processing circuitry, an intensity model based on an intensity variation in the image, wherein the intensity model models the intensity variation according to a radial distance from a position in the image, and normalizing, with the processing circuitry, the image based on the generated intensity model. In certain aspects, the image processing method further includes determining an acceptable segment of the normalized image based on at least one of a contrast and a radial distance. In certain aspects, the image processing method further includes discarding a portion of the image falling outside of a radius from the position in the image. In certain aspects, the image processing method further includes discarding a portion of the image falling below a local contrast threshold.

According to another embodiment, an image processing method is provided that includes receiving, with processing circuitry, a first image and a second image associated with an optical sensor system, wherein the optical sensor system comprises a first light source, a second light source, and an array of photosensors for capturing the image, wherein the first image corresponds to the first light source and the second image corresponds to the second light source, scaling, with the processing circuitry, the first image according to a magnification factor, scaling, with the processing circuitry, the second image according to the same or a different magnification factor, and associating, with the processing circuitry, the scaled first image and the scaled second image with each other according to the magnification factor and a position of the first image relative to the second image. In certain aspects, the image processing method further includes determining the position of the first image relative to the second image based on a position of the first light source relative to the second light source. In certain aspects, the position of the first light source and the position of the second light source are fixed by a construction of the optical sensor system. In certain aspects, the associating further comprises stitching the scaled first image and the scaled second image together into a composite image. In certain aspects, the associating further comprises determining a transformation between the scaled first image and the scaled second image, wherein the transformation includes a translation between a position of the scaled first image and a position of the scaled second image, wherein the image processing method further comprises comparing the scaled first image and the scaled second image to reference biometric image data based on the transformation. In certain aspects, the scaling the first image comprises upscaling the first image, and the scaling the second image comprises upscaling the second image.

According to an embodiment, a non-transitory computer readable storage medium is provided that contains program instructions for execution by a processor, wherein execution of the program instructions cause an electronic device including the processor to perform image processing as described herein, e.g., any of the various image processing method embodiments described herein.

According to an embodiment, a computer program product is provided that causes an electronic device or processing system to perform image processing as described herein, e.g., to perform any of the various image processing method embodiments described herein.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying figures. The use of the same reference numbers in different instances in the description and the figures may indicate similar or identical items.

FIGS. 4A-4B show a series of plan views which illustrate an example of object imaging using a temporal pattern, in accordance with some embodiments.

Figure 12:
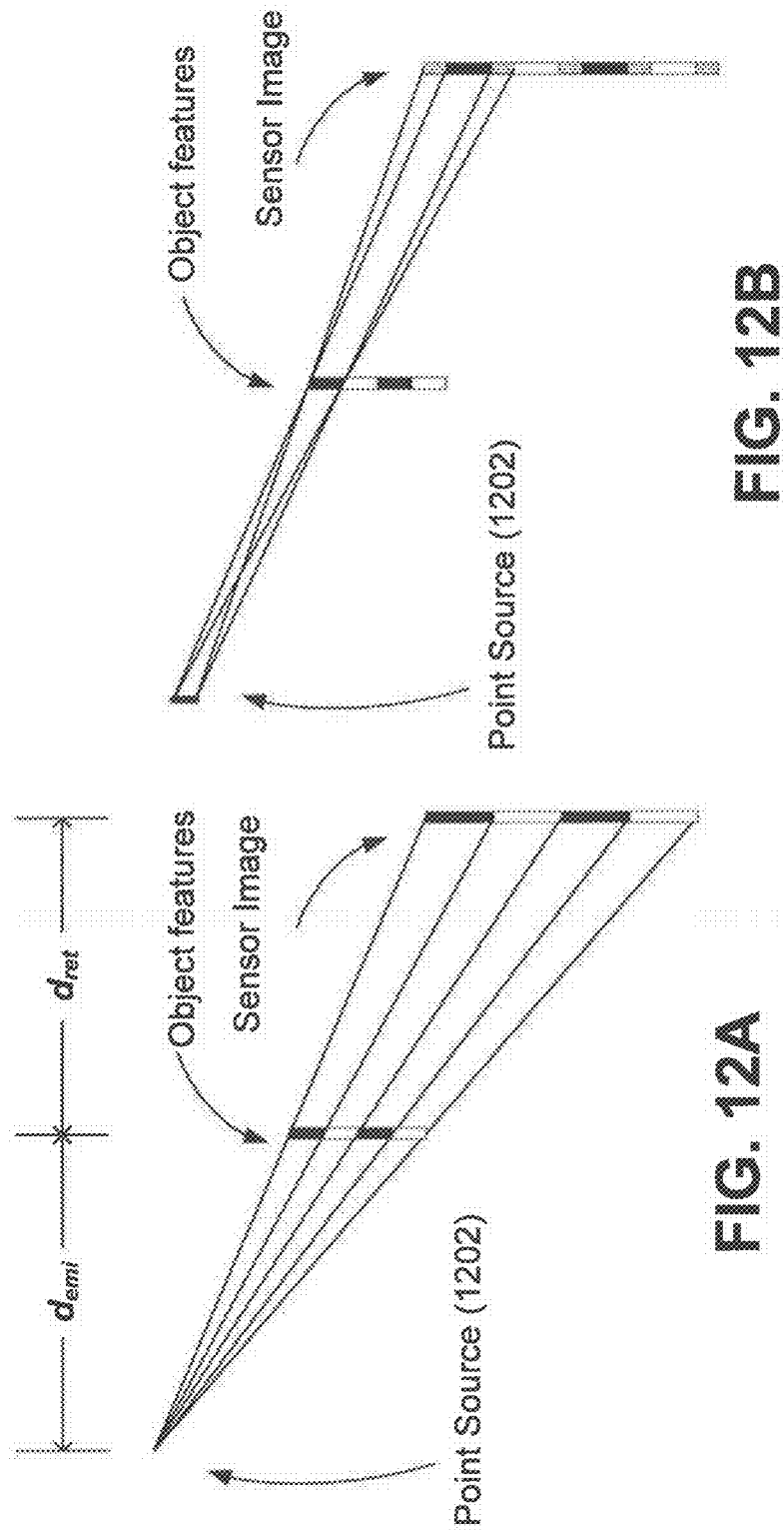

FIGS. 12A-12B show schematic examples of point sources for sensing, in accordance with some embodiments: FIG. 12A shows an ideal point source with the illumination and return optical paths being the same distance, resulting in 2× magnification at the sensor plane; FIG. 12B shows a wide light source or wide cluster of light sources utilized as a point source, resulting in some blurring at the sensor plane, but the object features can still be resolved in the sensor image based on point source optical principles.

Figure 13:
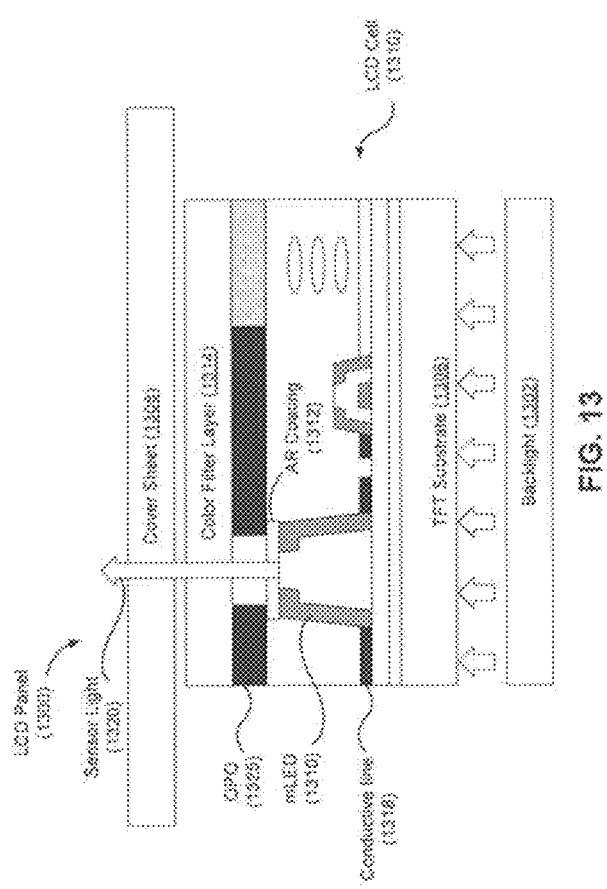

FIG. 13 depicts an example of a micro-LED disposed in an LCD cell, in accordance with some embodiments.

Figure 14:
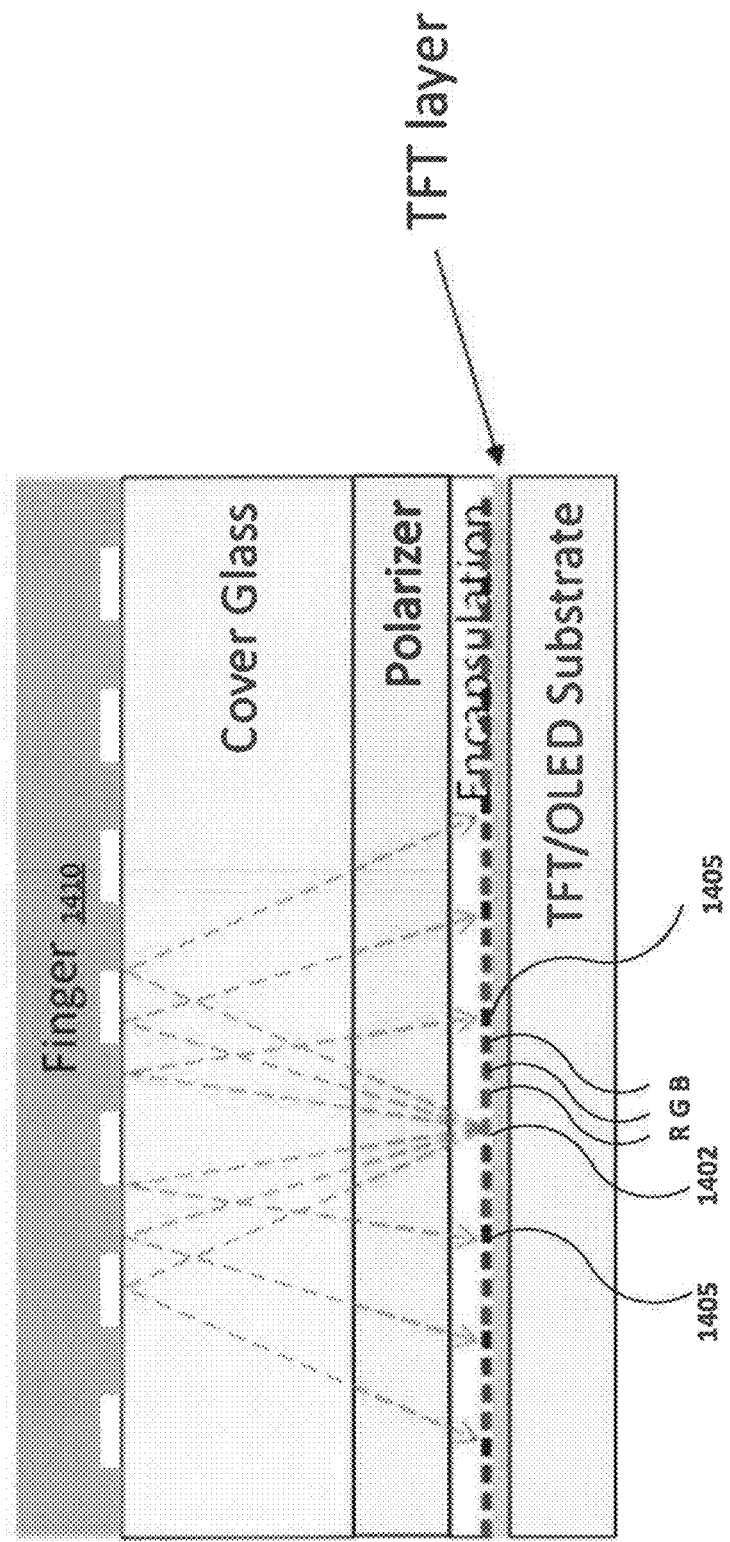

FIG. 14 illustrates a cross section of an in-display optical fingerprint sensor with discrete micro-LEDs as light sources for illuminating the finger, according to an embodiment.

FIG. 15A shows a cross section of an in-display optical sensor with dedicated "bright OLED pixels" as light sources for illuminating an object/finger, according to an embodiment.

Figure 15B:
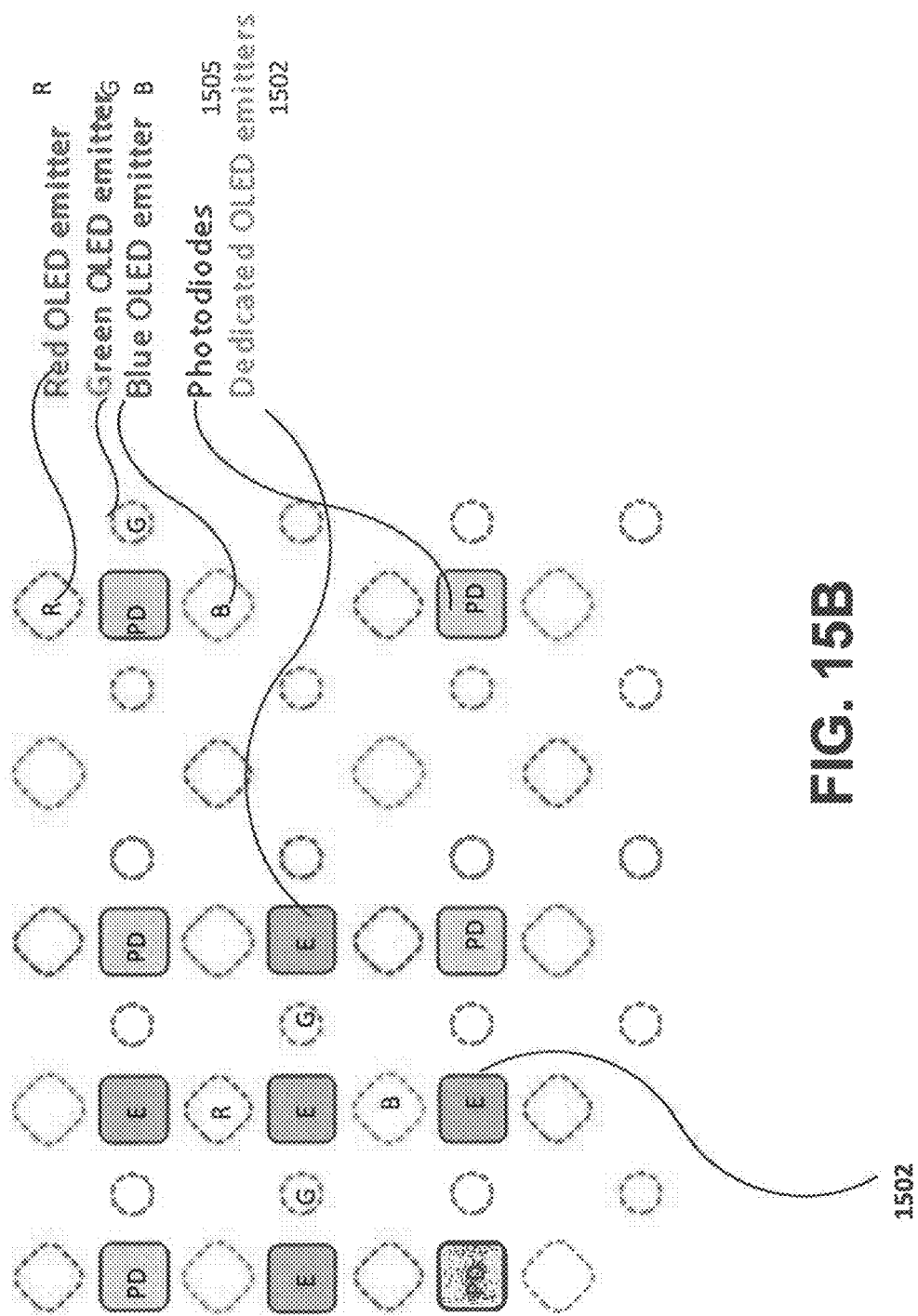

FIG. 15B shows an example layout of photodiodes and dedicated OLED emitters interspersed between red, green and blue OLED display emitters/subpixels according to an embodiment.

FIG. 15C shows an example layout of photodiodes and dedicated OLED emitters interspersed between red, green and blue OLED display emitters/subpixels, including a cluster of dedicated OLED emitters hard-wired together and operated as a single point source illuminator by an OLED driver circuit according to an embodiment.

Figure 16A:
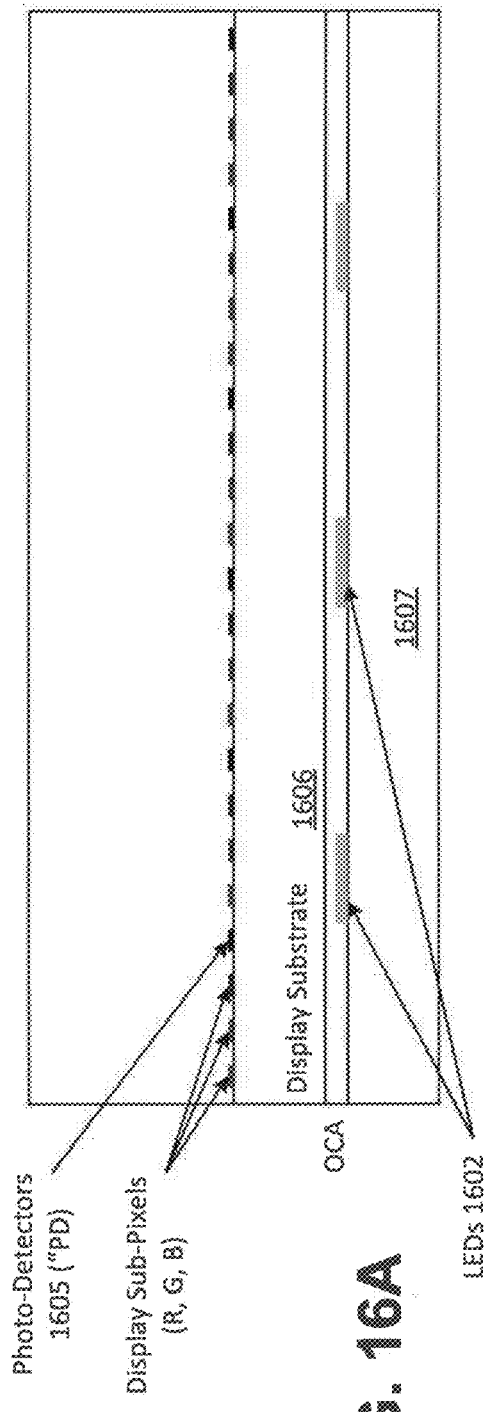

FIG. 16A shows LEDs bonded to a separate substrate which may be bonded to the back of an OLED substrate e.g., using an optically clear adhesive (OCA), according to an embodiment.

Figure 16B:
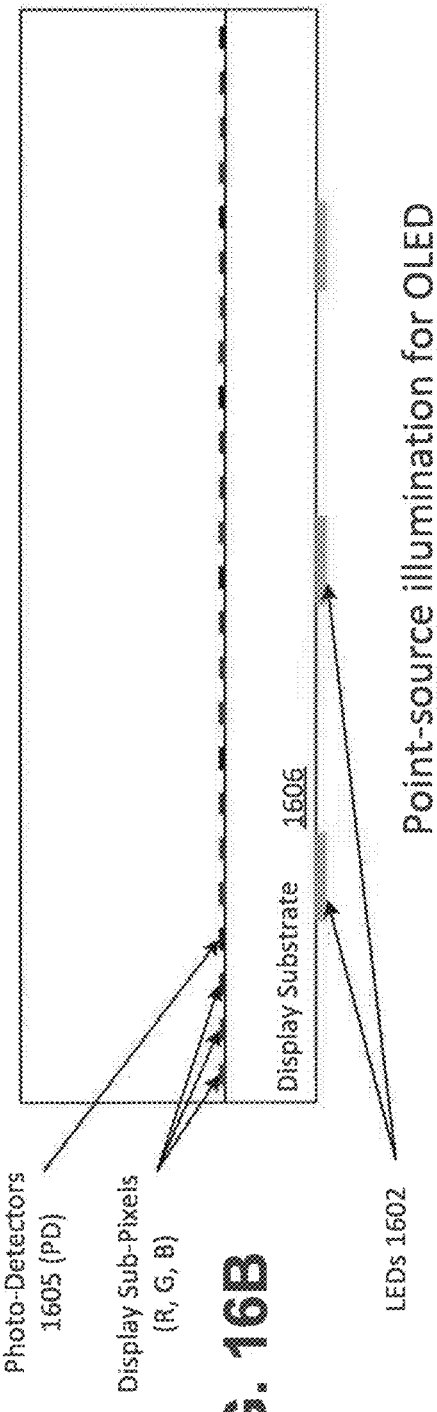

FIG. 16B shows LEDs bonded to the back of an OLED substrate according to an embodiment.

Figure 16C:
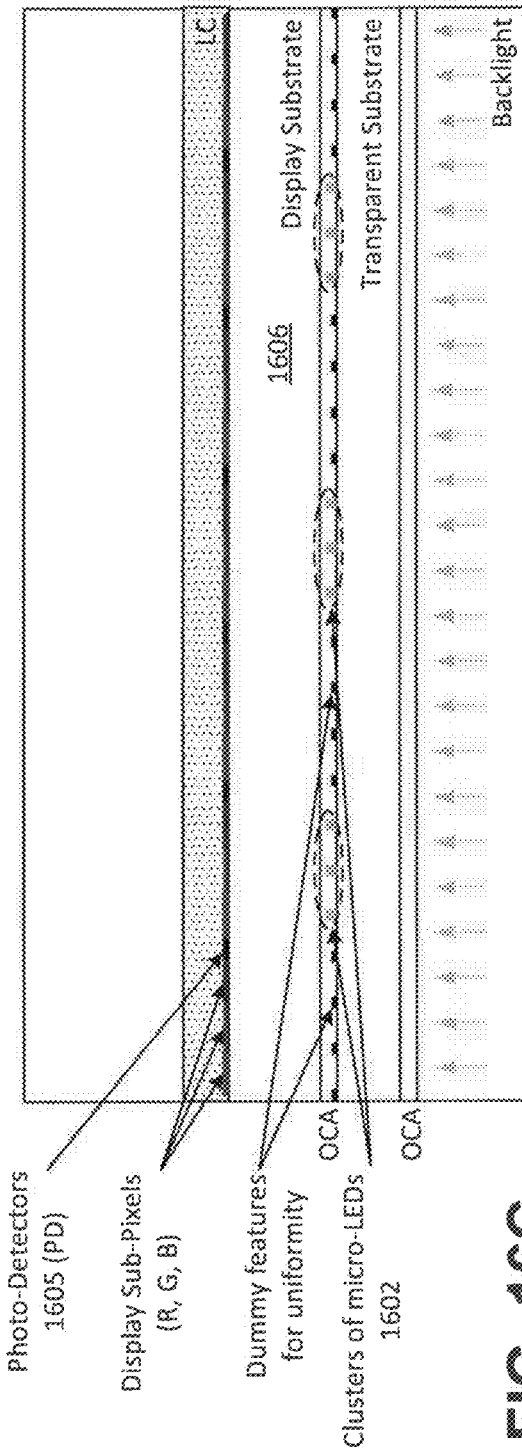

FIG. 16C shows micro-LEDs bonded to a separate transparent substrate, which is located between the backlight and TFT substrates of an LCD display according to an embodiment.

Figure 16D:
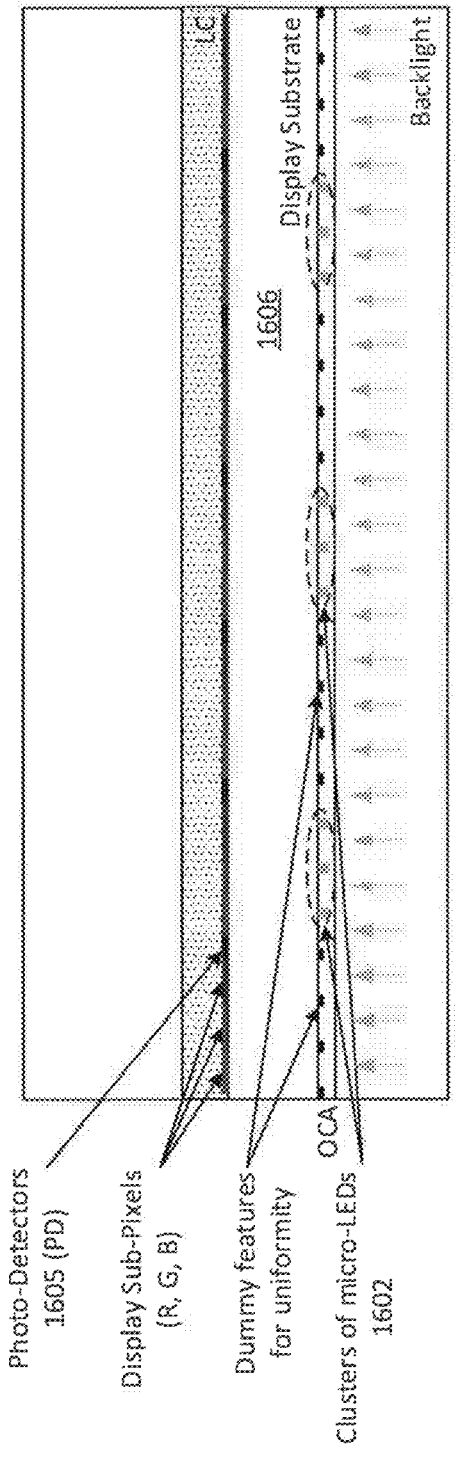

FIG. 16D shows micro-LEDs bonded to the back of an LCD display TFT substrate according to an embodiment.

FIG. 17 shows an example of a micro-LED/dummy features arrangement under an LCD backplane according to an embodiment.

Figure 18A:
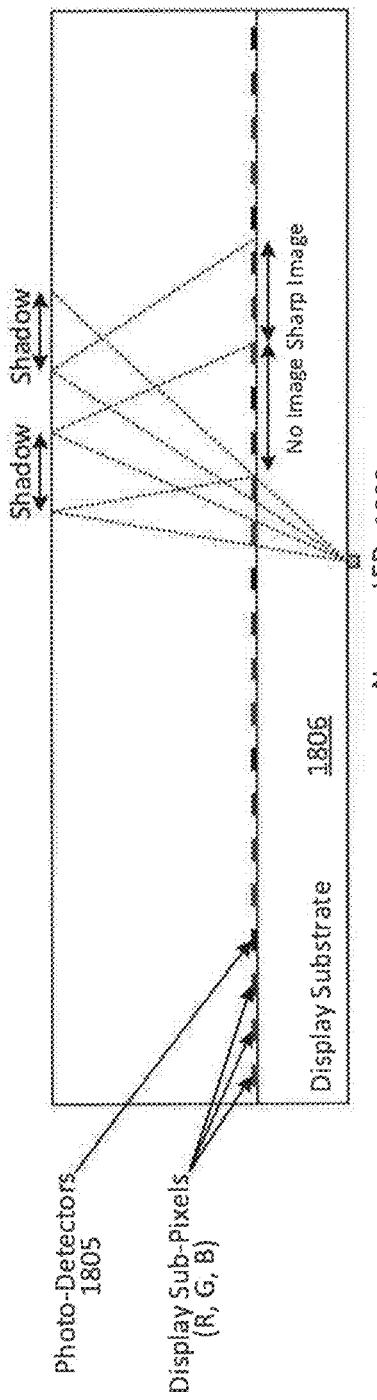
Figure 18B:
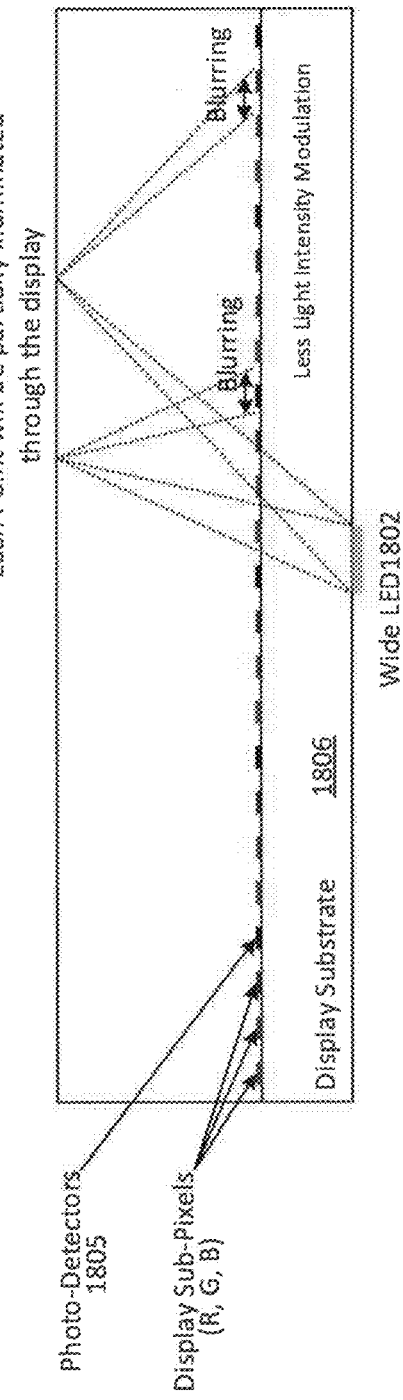

FIGS. 18A-18B illustrate LED size vs. image quality; FIG. 18A illustrates a small LED used to illuminate the sensing region, which may prevent capturing a useful image from the shadowed locations in the sensing region; FIG. 18B illustrates that use of a larger LED may result in a blurring effect as the light arrives on the sensor from different angles.

Figure 19A:
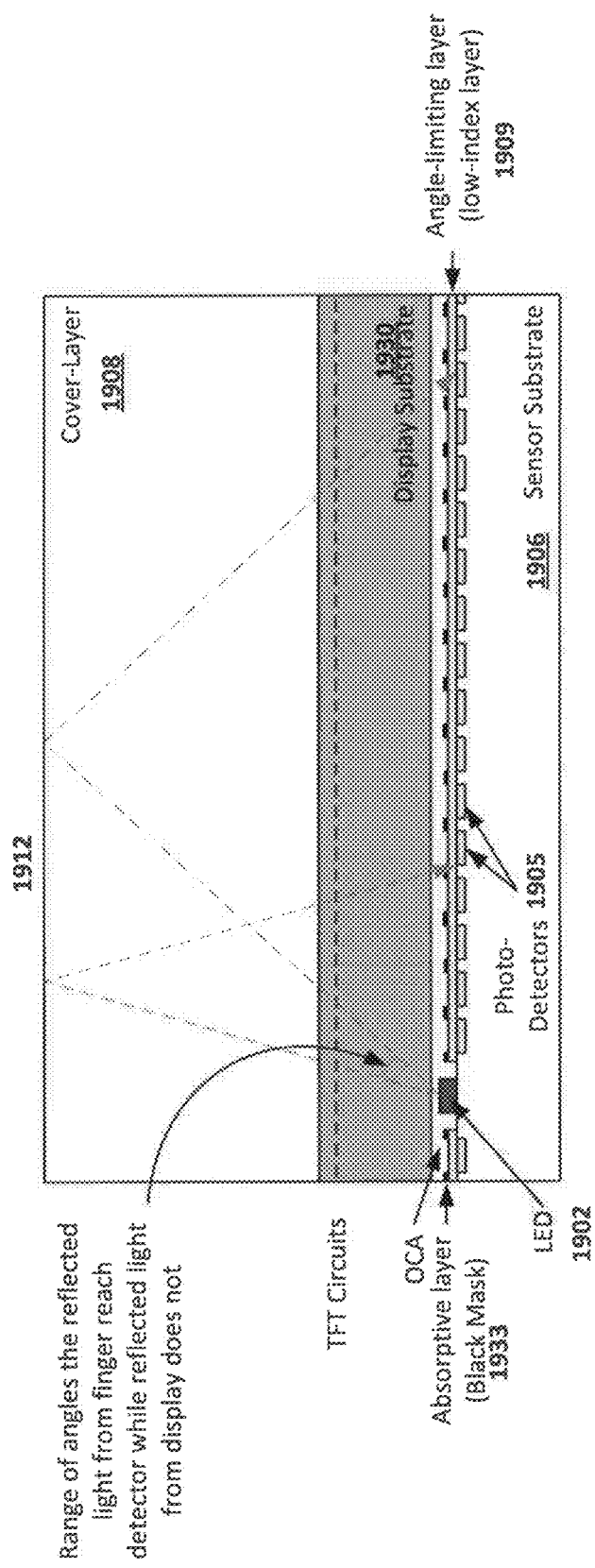
Figure 19B:
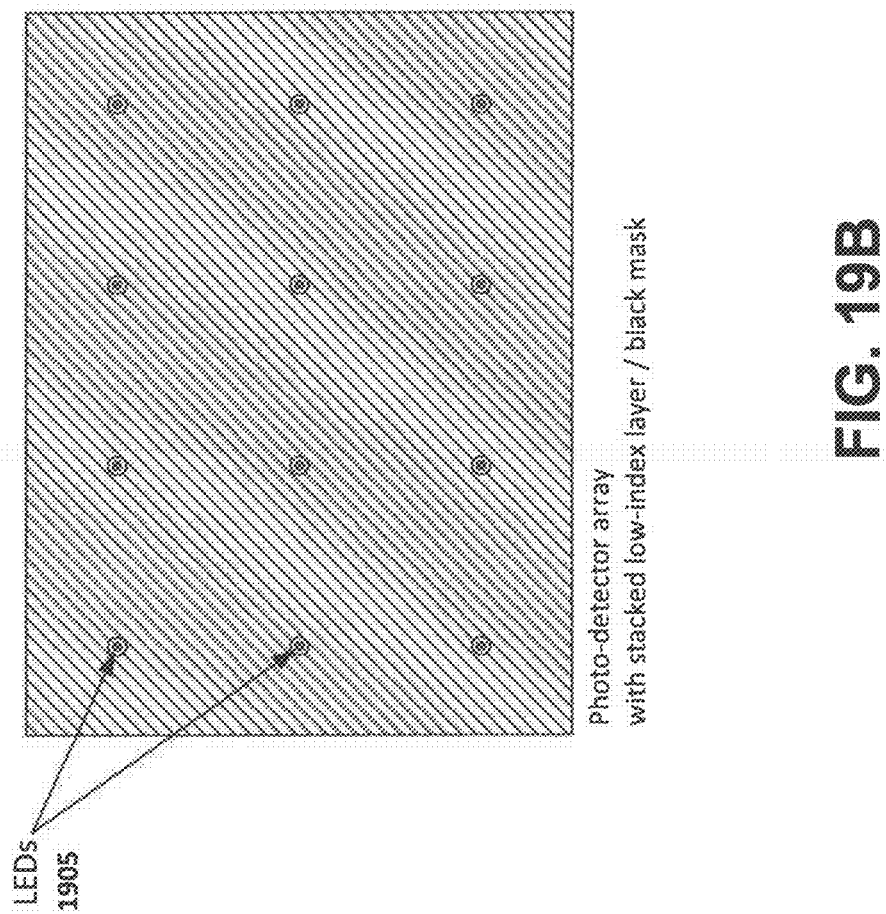

FIGS. 19A-19B illustrate an under-display optical fingerprint sensor according to an embodiment: FIG. 19A is a side view of the under-display optical fingerprint sensor; FIG. 19B shows a photo-detector array including a light-absorptive coating (e.g., black mask) over the parts of the sensor substrate not occupied by the photo-detectors.

Figure 20A:
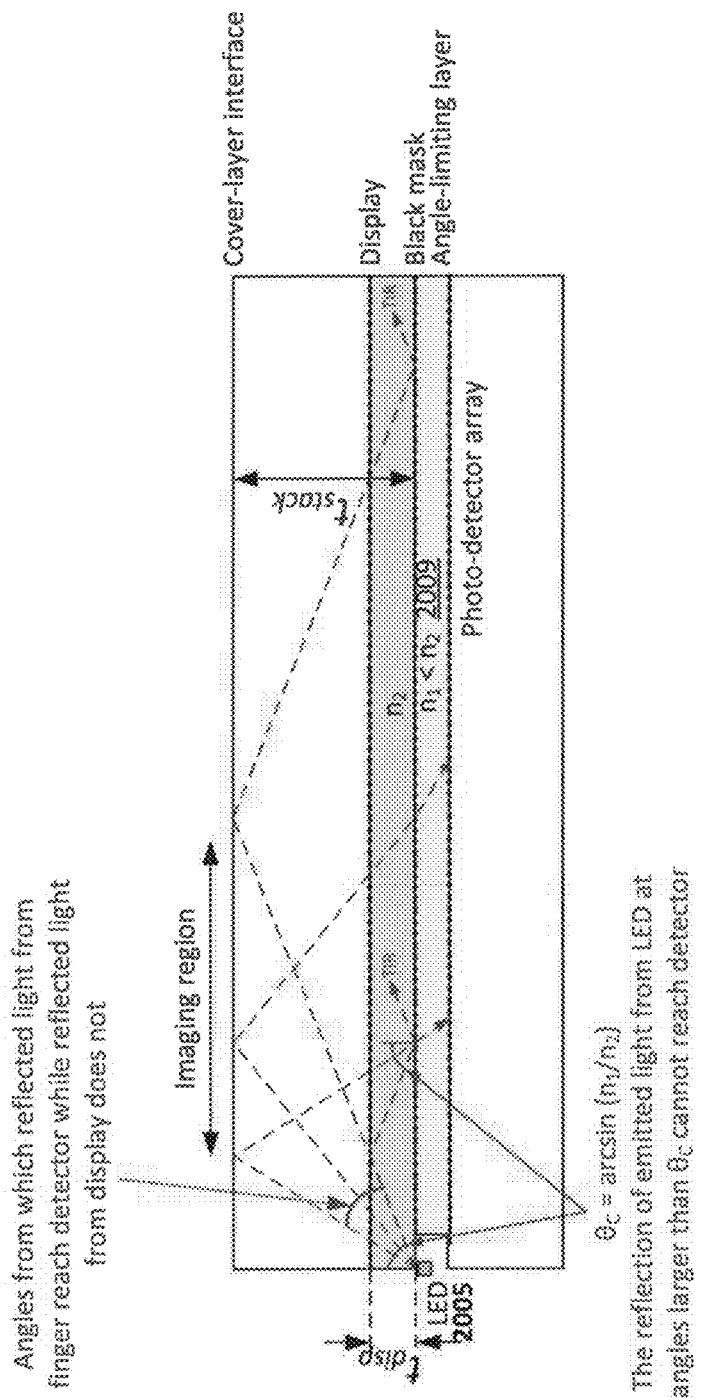

FIG. 20A is a schematic side-view of an under-OLED optical fingerprint sensor (FPS), according to an embodiment, showing an imaging region (part of sensing region) and a range of angles from which the reflected light from finger arrives at the photo-detector while the reflected light from display does not.

Figure 20B:
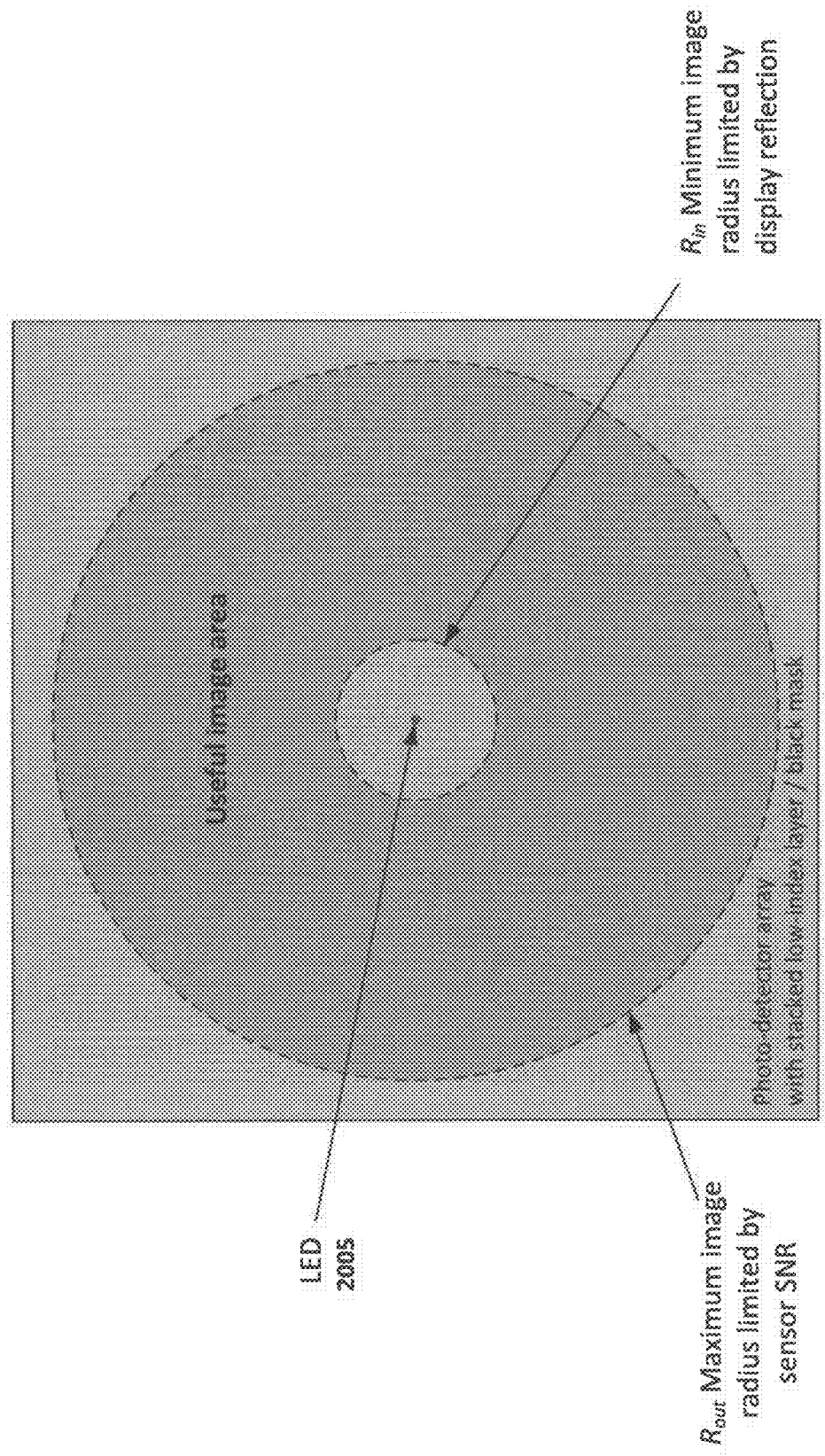

FIG. 20B is a schematic top view of the under-OLED optical FPS of FIG. 20A, showing the useful imaging area.

Figure 21:
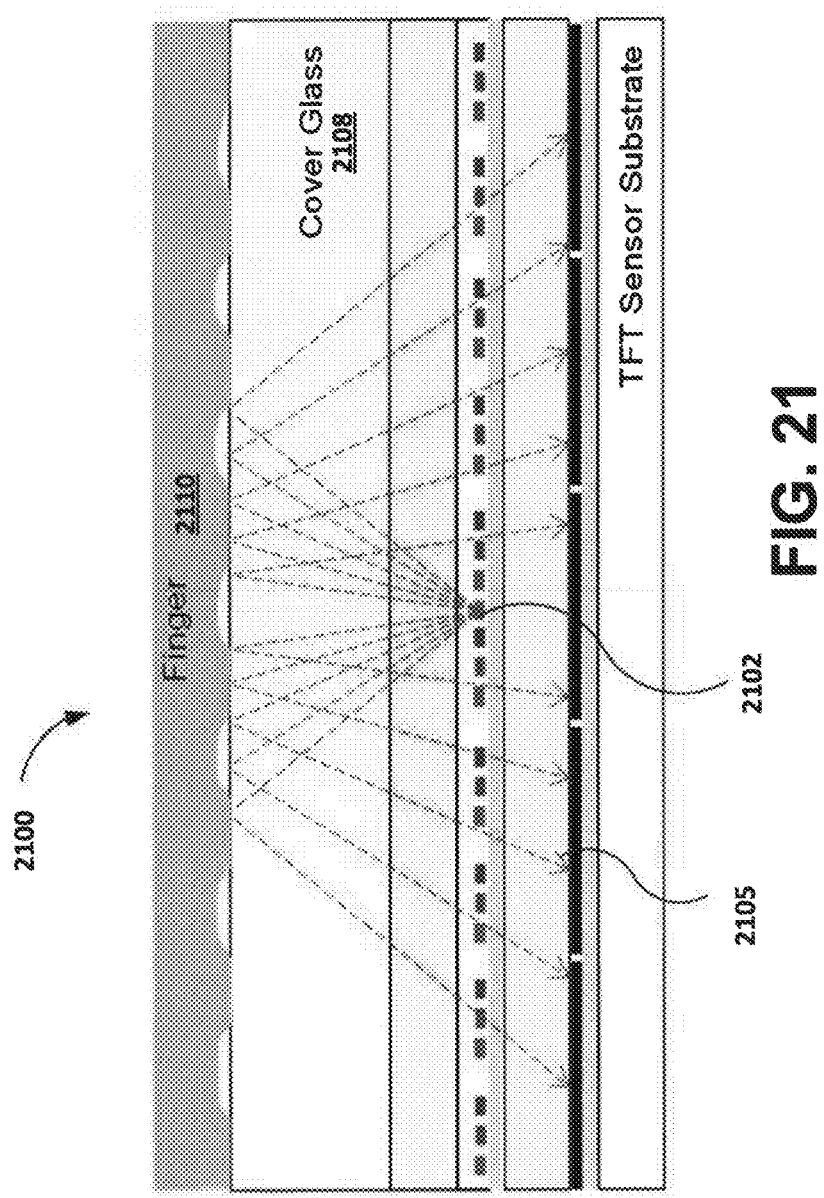

FIG. 21 shows an in display FPS stack-up according to an embodiment.

Figure 22:
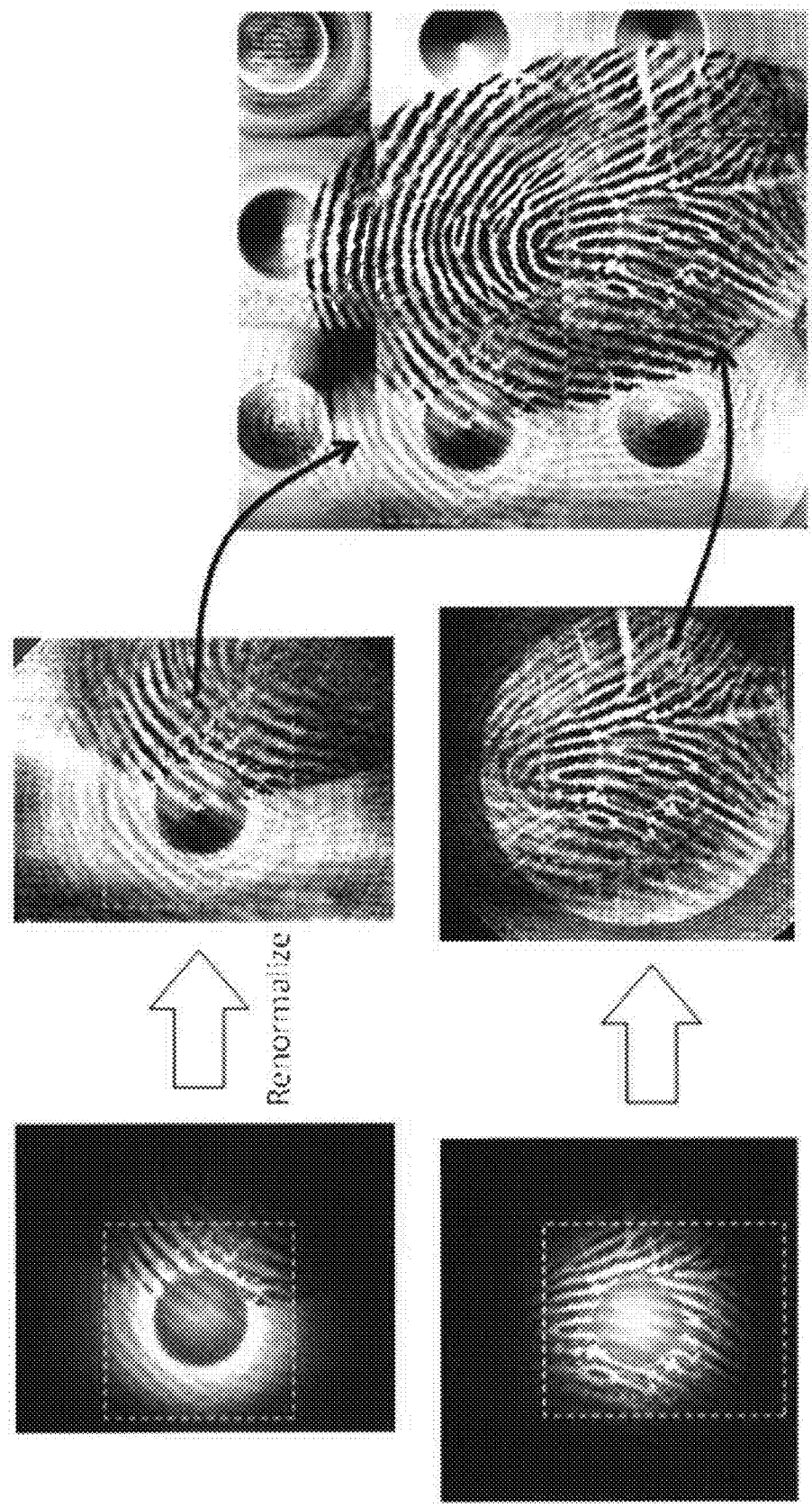

FIGS. 22A, 22B and 22C illustrate assembly of multiple partial finger images into a single finger image according to an embodiment; FIG. 22A shows two partial finger images; FIG. 22B shows the brightness and contrast of the two partial finger images after being renormalized/brightness-corrected; FIG. 23C shows a composite image of a larger portion of the finger—the central portions of each of the two renormalized images are centered on the respective light source (LED) locations in the composite image.

Figure 23:
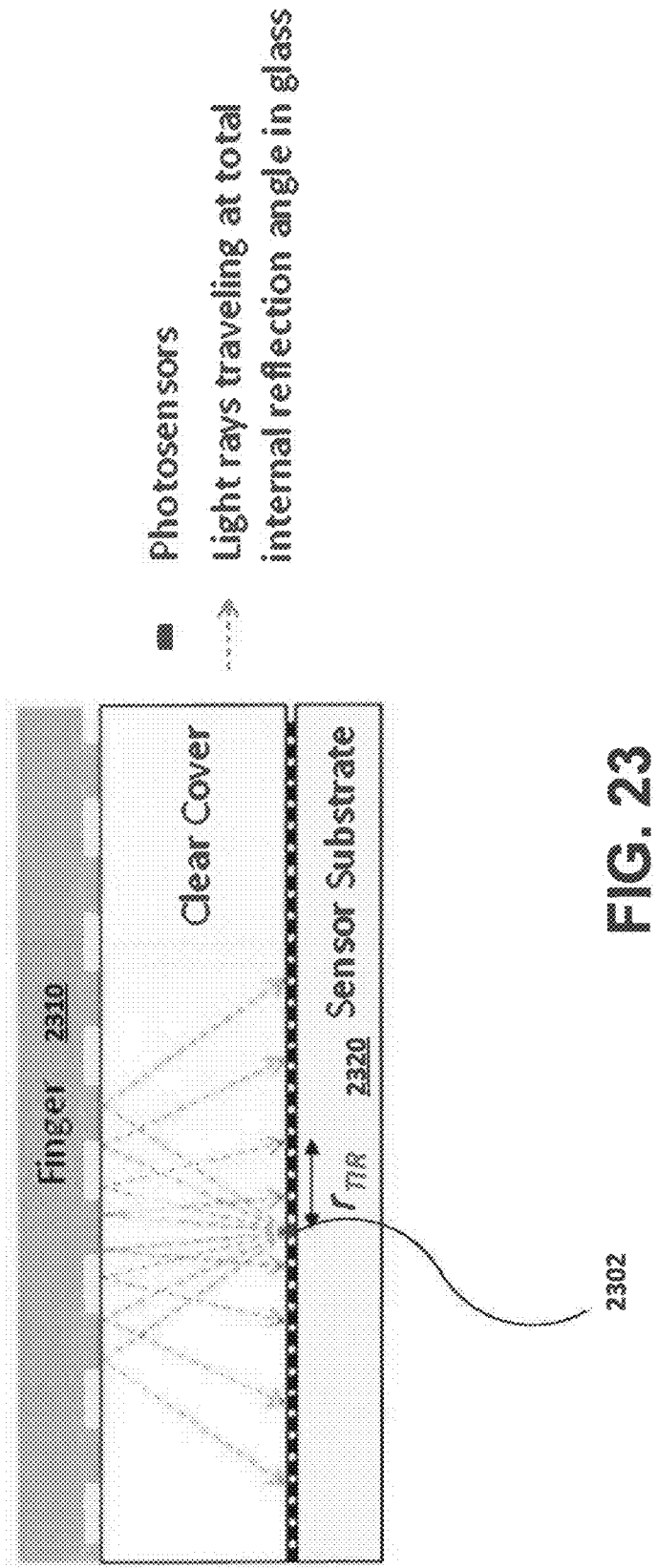

FIG. 23 shows a cross section of a fingerprint image sensor under a clear cover layer according to an embodiment; the finger is illuminated by light only from the light source, and the image is captured by the photosensors on the sensor substrate.

Figure 24A:
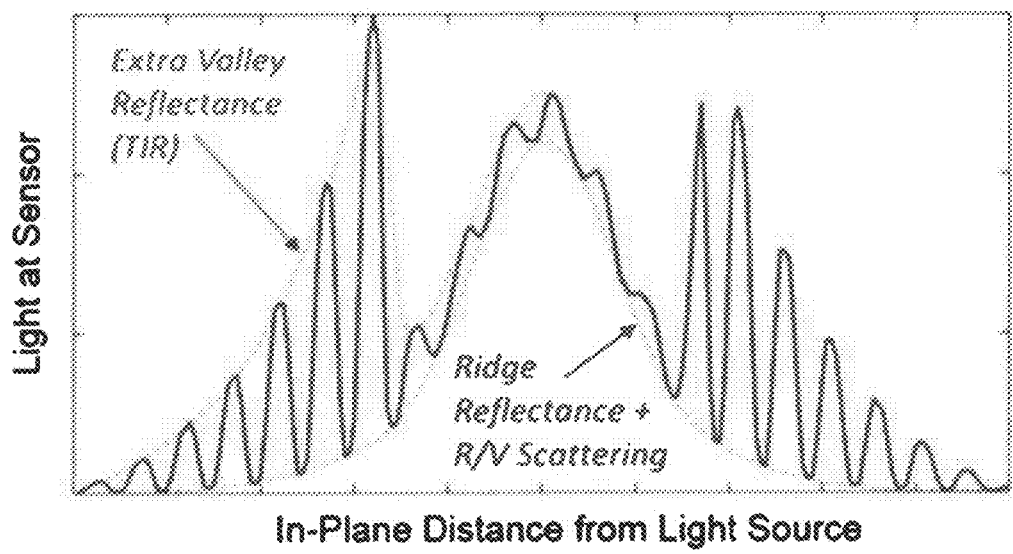

FIG. 24A shows a simulation of light intensity received at a sensor, including the dependence of the intensity on the distance from the illumination source; the sharp changes in light intensity may be reduced by the normalization method described herein.

Figure 24B:
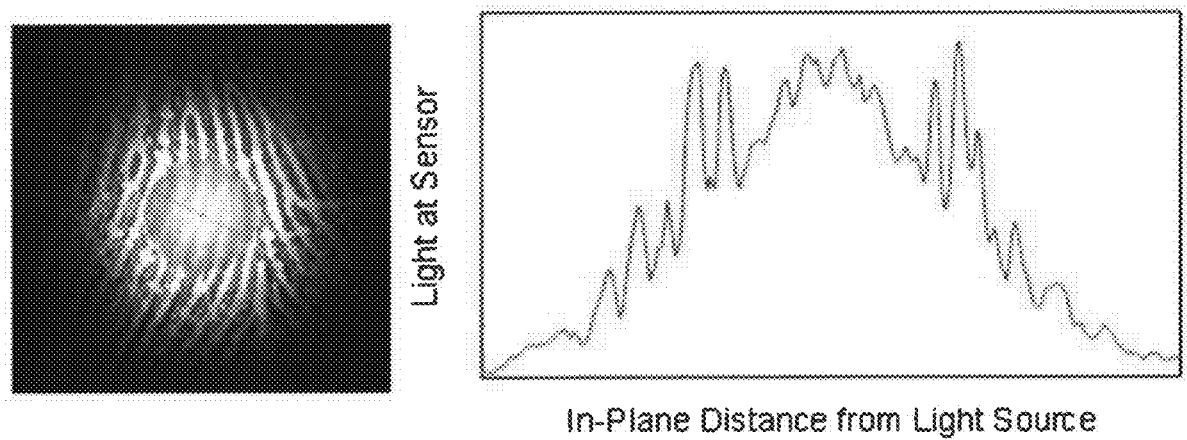

FIG. 24B shows measured light intensity at a sensor for a sensor geometry similar to the simulation of FIG. 24A.

Figure 25A:
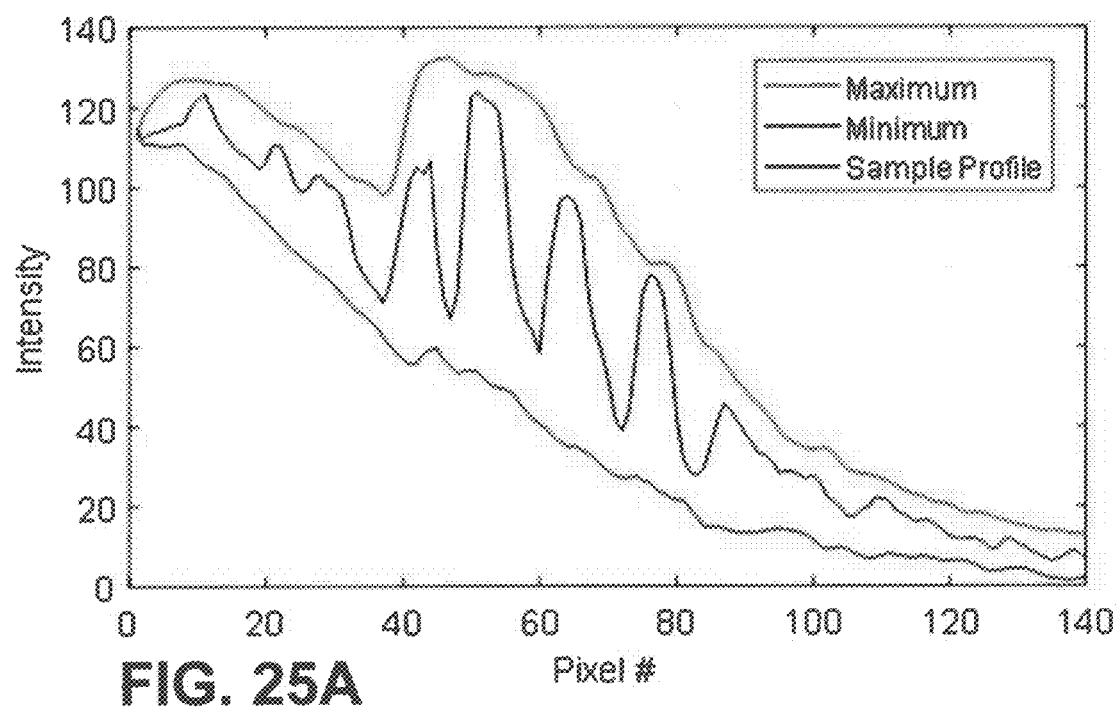

FIG. 25A shows an example of minimum and maximum brightness in an image as a function of distance from the illumination source, along with a sample intensity profile through the center of the image.

Figure 25B:
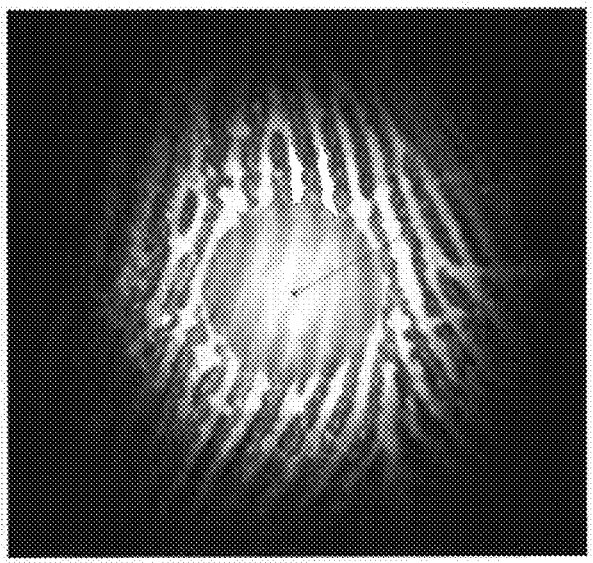

FIG. 25B shows an example of an original fingerprint image.

Figure 25C:
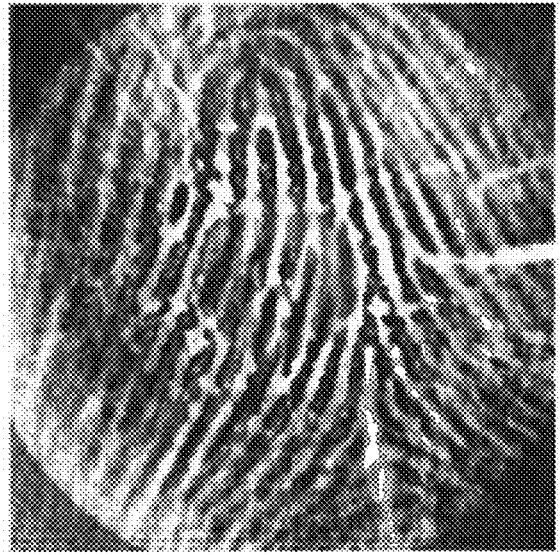

FIG. 25C shows the image of FIG. 25B after undergoing brightness-correction image processing according to an embodiment.

Figure 26:
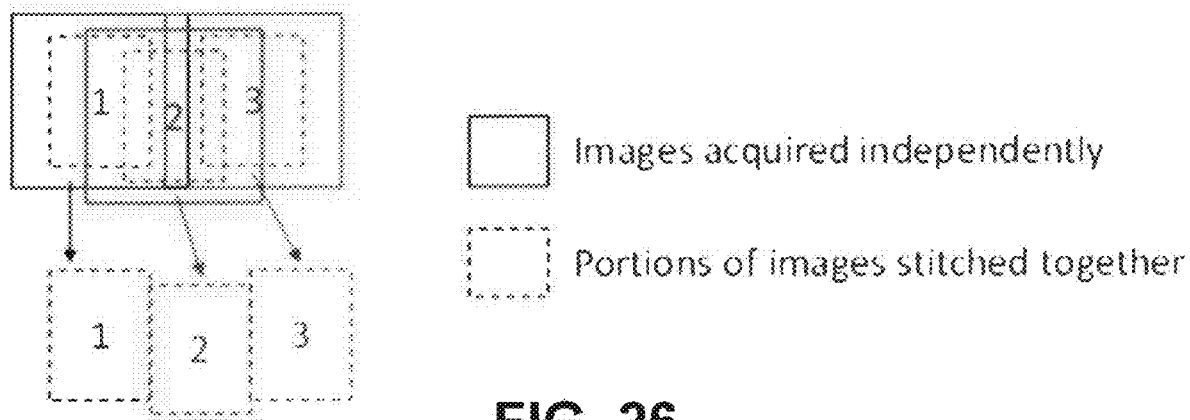

FIG. 26 is a depiction of an image stitching process used to create the composite image shown in FIG. 22C; sections of the independently acquired images are stitched together, with portions of each image placed into the (lower) composite image, with each portion centered at the LED locations (after the LED locations have been scaled up by the finger-to-imager magnification ratio).

Figure 27:

FIG. 27 illustrates results of image stitching using a median thresholding method according to an embodiment.

Figure 28:
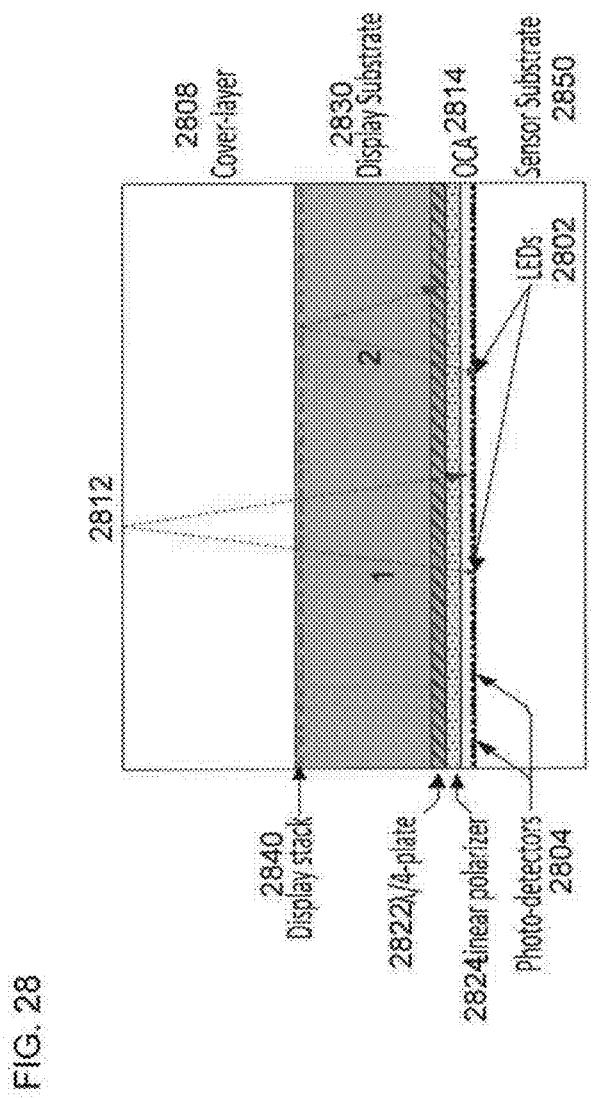

FIG. 28 illustrates an embodiment of an optical fingerprint sensor for fingerprint imaging through a display using an under-display (e.g., point source illumination) scheme including a circular polarizer to absorb the light that is reflected from the display while allowing the reflections from a finger to arrive at the detector.

FIG. 29A shows a typical display stack-up.

FIG. 29B shows a display stack-up including a thin film absorber layer according to an embodiment.

Figure 30:
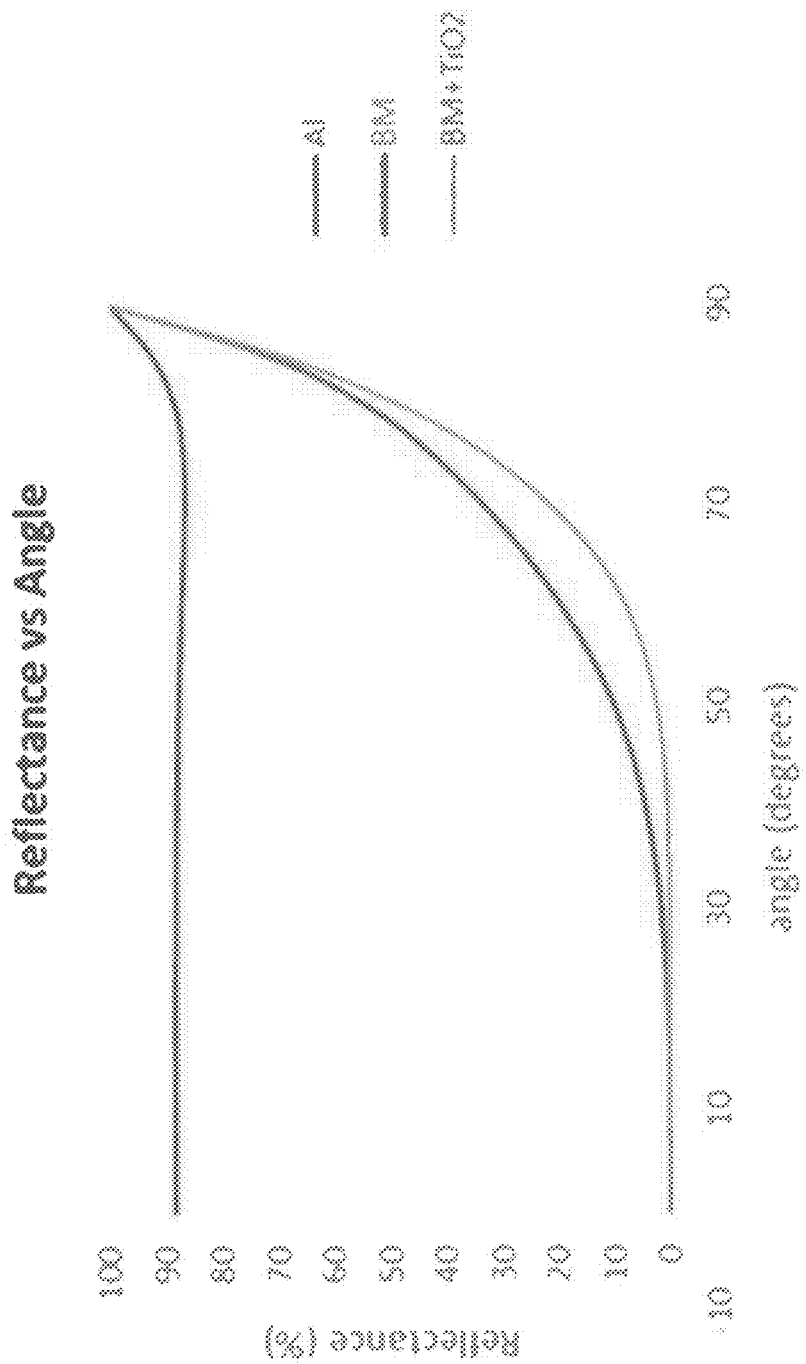

FIG. 30 shows comparison of performance of bare metal lines (e.g., FIG. 29A) vs. performance with a thin film stack (e.g., FIG. 29B).

Figure 31:
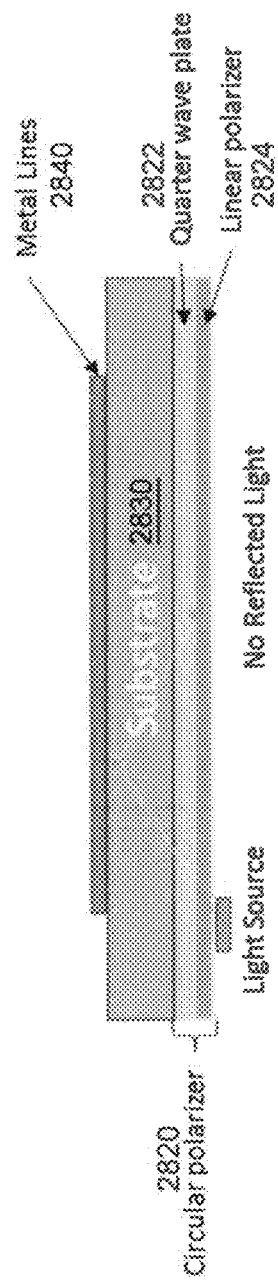

FIG. 31 illustrates another embodiment of an optical fingerprint sensor for fingerprint imaging through a display, including a circular polarizer to absorb the light that is reflected from the display while allowing the reflections from a finger to arrive at the detector.

Figure 32:
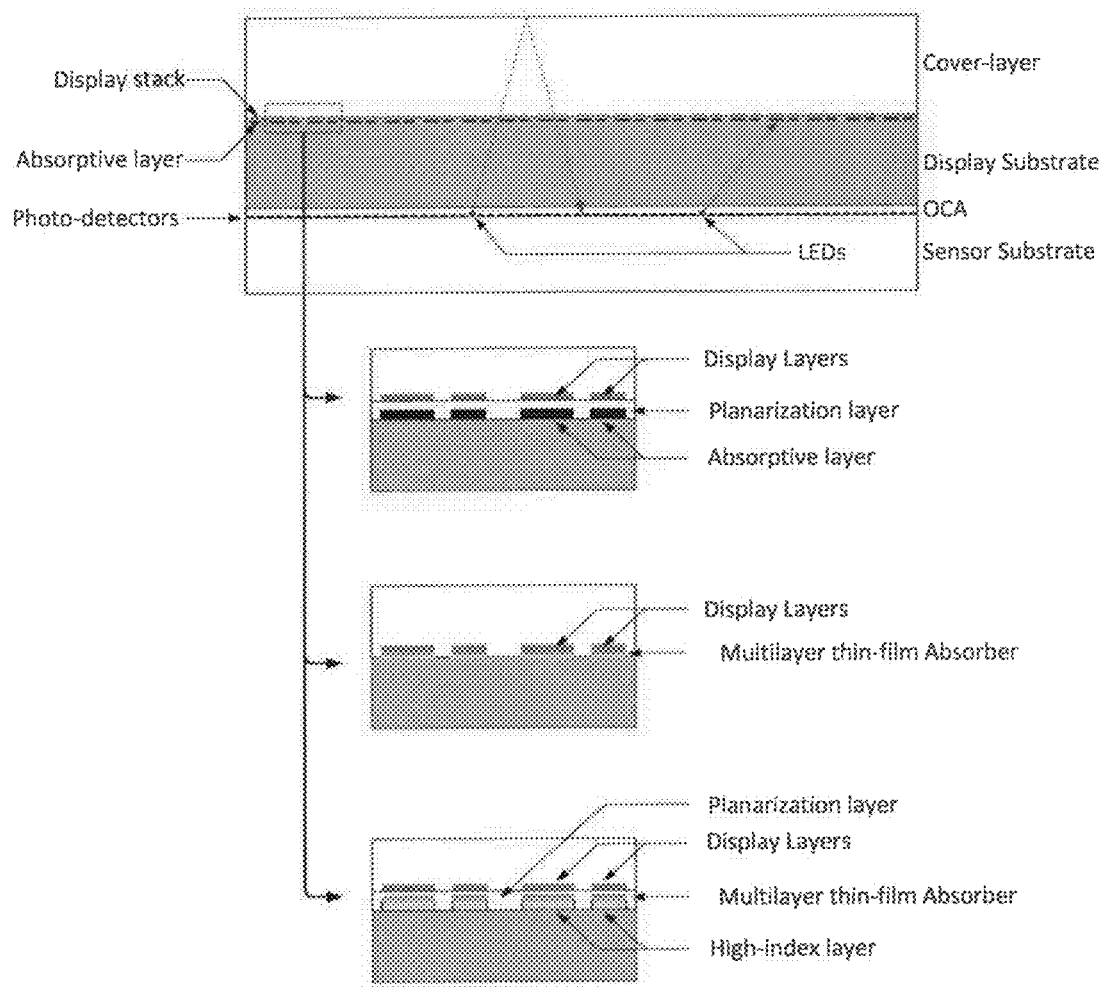

FIG. 32 shows different configurations of an absorptive layer under the display to minimize the display reflections, in accordance with some embodiments.

DETAILED DESCRIPTION

The following detailed description is exemplary in nature and is not intended to limit the invention or the application and uses of the invention. Furthermore, there is no intention to be bound by any expressed or implied theory presented in the following detailed description or the appended drawings.

Turning to the drawings, and as described in detail herein, embodiments of the disclosure provide methods, devices and systems useful to image, e.g., optically image, an input object such as a fingerprint.

Figure 1:
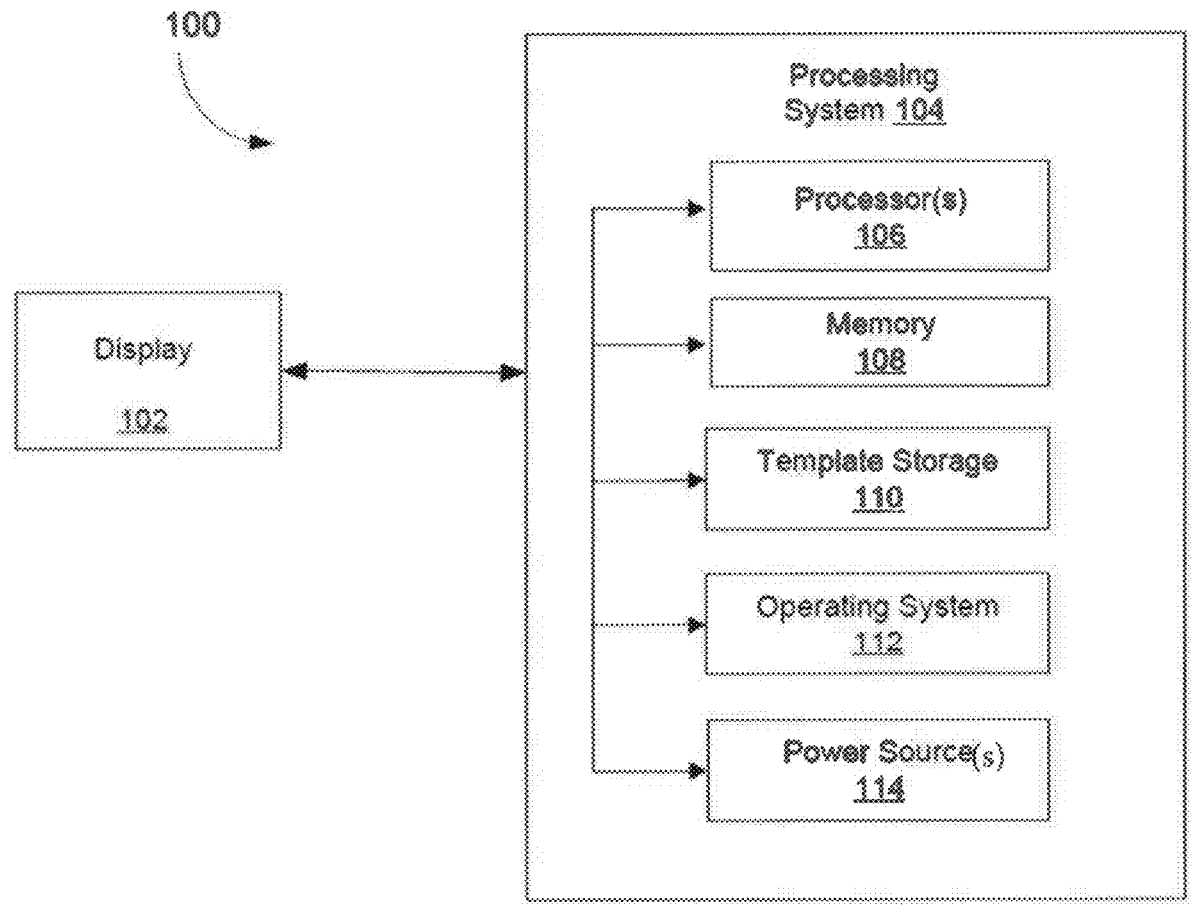
FIG. 1 is a block diagram of an example of an electronic system that includes a display device and a processing system, according to an embodiment.

FIG. 1 is a block diagram of an example of an electronic system 100 that includes a display 102 and a processing system 104. The display (or "display device") 102 may also be used as a sensor for imaging.

By way of example, basic functional components of the electronic device 100 utilized during capturing, storing, and validating a biometric match attempt are illustrated. The processing system 104 may include processor(s) 106, memory 108, template storage 110, operating system (OS) 112, and power source(s) 114. Processor(s) 106, memory 108, template storage 110, and operating system 112 may be connected physically, communicatively, and/or operatively to each other directly or indirectly. The power source(s) 114 may be connected to the various components in processing system 104 to provide electrical power as necessary.

As illustrated, the processing system 104 may include processing circuitry including one or more processor(s) 106 configured to implement functionality and/or process instructions for execution within electronic device 100. For example, processor 106 executes instructions stored in memory 108 or instructions stored on template storage 110 to normalize an image, reconstruct a composite image, identify, verify, or otherwise match a biometric object, or determine whether a biometric authentication attempt is successful. Memory 108, which may be a non-transitory, computer-readable storage medium, may be configured to store information within electronic device 100 during operation. In some embodiments, memory 108 includes a temporary memory, an area for information not to be maintained when the electronic device 100 is turned off. Examples of such temporary memory include volatile memories such as random access memories (RAM), dynamic random access memories (DRAM), and static random access memories (SRAM). Memory 108 may also maintain program instructions for execution by the processor 106.

Template storage 110 may comprise one or more non-transitory computer-readable storage media. In the context of a fingerprint sensor device or system, the template storage 110 may be configured to store enrollment views or image data for fingerprint images associated with a user's fingerprint, or other enrollment information, such as template identifiers, enrollment graphs containing transformation information between different images or view, etc. More generally, the template storage 110 may store information about an input object. The template storage 110 may further be configured for long-term storage of information. In some examples, the template storage 110 includes non-volatile storage elements. Non-limiting examples of non-volatile storage elements include magnetic hard discs, solid-state drives (SSD), optical discs, floppy discs, flash memories, or forms of electrically programmable memories (EPROM) or electrically erasable and programmable (EEPROM) memories, among others.

The processing system 104 may also host an operating system (OS) 112. The operating system 112 may control operations of the components of the processing system 104. For example, the operating system 112 facilitates the interaction of the processor(s) 106, memory 108, and template storage 110.

According to some embodiments, the processor(s) 106 implements hardware and/or software to obtain data describing an image of an input object. In some implementations, the processor(s) 106 may also determine whether there is a match between two images, e.g., by aligning two images and compare the aligned images to one another. The processor(s) 106 may also operate to reconstruct a larger image from a series of smaller partial images or sub-images, such as fingerprint images when multiple partial fingerprint images are collected during a biometric process, such as an enrollment or matching process for verification or identification.

The processing system 104 may include one or more power source(s) 114 to provide power to components of the electronic device 100. Non-limiting examples of power source(s) 114 include single-use power sources, rechargeable power sources, and/or power sources developed from nickel-cadmium, lithium-ion, or other suitable material as well power cords and/or adapters, which are in turn connected to electrical power. A power source 114 may be external to the processing system 104 and/or electronic device 100.

Display 102 can be implemented as a physical part of the electronic system 100, or can be physically separate from the electronic system 100. As appropriate, display 102 may communicate with parts of the electronic system 100 using various wired and/or wireless interconnection and communication technologies, such as buses and networks. Examples technologies may include Inter-Integrated Circuit ($I^2C$), Serial Peripheral Interface (SPI), PS/2, Universal Serial bus (USB), Bluetooth®, Infrared Data Association (IrDA), and various radio frequency (RF) communication protocols defined by the IEEE 802.11 standard. In some embodiments, display 102 is implemented as a fingerprint sensor to capture a fingerprint image of a user. More generally, the components of display 102, or components integrated in or with the display (e.g., one or more light sources, detectors, etc.) may be implemented to image an object. In accordance with some embodiments, display 102 may use optical sensing for object imaging including imaging biometrics such as fingerprints.

Some non-limiting examples of electronic systems 100 include personal computing devices (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras).

In some embodiments, the processing system 104 includes display driver circuitry, LED driver circuitry, receiver circuitry or readout circuitry for operating or activating light sources, or for receiving data from or reading out detectors in accordance with some embodiments described elsewhere in this document. For example, the processing system 104 may include one or more display driver integrate circuits (ICs), LED driver ICs, OLED driver ICs, readout ICs, etc.

Figure 2:
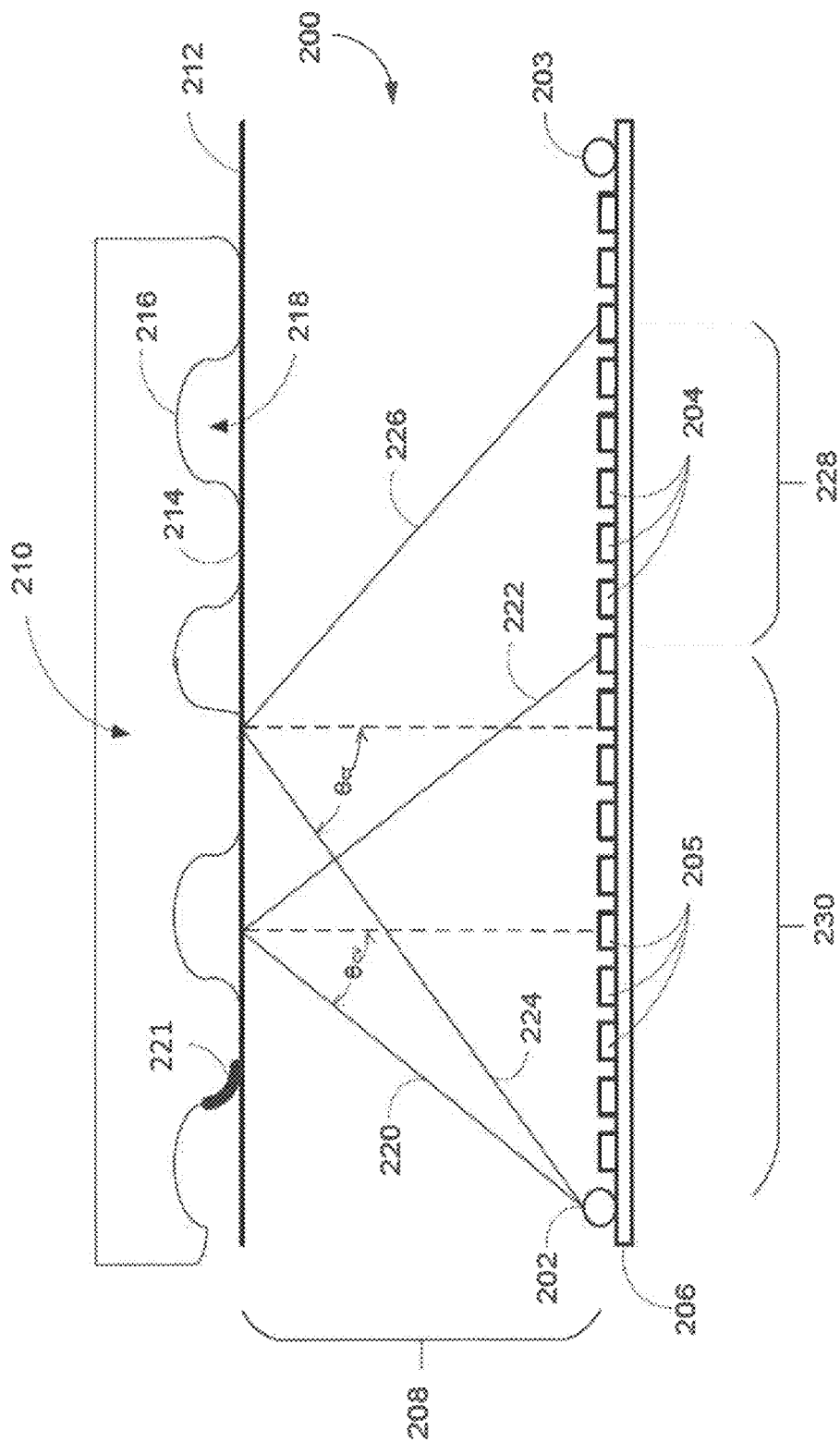
FIG. 2 illustrates an example of a display system according to the present disclosure.

FIG. 2 illustrates an example of an optical display system 200 according to the present disclosure. The optical display system 200 (also referred to as "display 200") includes light sources, e.g., light sources 202 and 203, photosensors, e.g., detector pixels 204 and 205, a substrate 206, and a cover layer 208. An input object 210 is imaged by the display 200 in accordance with some embodiments. As described above, the display 200 may be a separate device or may be incorporated as part of various devices including mobile phones, media devices, and any other suitable electronic device 100.

The light sources 202 and 203 are of a suitable type described below (e.g., OLEDs, micro-LEDs, etc.). In some embodiments, the light sources 202 and 203 may include native display elements (e.g., one or more native OLED pixels/emitters), or dedicated emitters integrated in or with the display (e.g., micro-LEDs integrated in or with an OLED or LCD display). Although only two light sources 202, 203 are shown in FIG. 2, any number and any arrangement of light sources may be used. For example, only one light source may be used, two light sources may be used, or an array of multiple light sources may be used. The light sources 202, 203 may transmit light of the same wavelength or may transmit light of differing wavelengths (e.g., different colors). Moreover, wavelengths other than visible light may be transmitted.

The photosensors or detector pixels 204 and 205 may detect light transmitted from light sources 202, 203. Examples of types of photosensors are CMOS sensors, phototransistors and photodiodes. Thin film transistor-based sensors may also be used in accordance with some embodiments.

Although the light sources 202, 203 and photosensors 204, 205 are depicted as distinct elements, in some embodiments the same type of element may be used to both transmit light and detect transmitted light. For example, the light sources 202, 203 themselves may be reverse-biased to function as detector pixels, using LED, OLED, or another suitable display driver technology. The light sources 202, 203 can be individually reverse biased to function as detector pixels, or may be collectively reverse-biased, e.g., to function as row s or columns of detector pixels. Further, all of the light sources 202, 203 may be addressable in a reverse biased state, or a smaller subset may be addressable in a reverse bias state to minimize the amount of additional routing circuitry that is included, in which case the display 200 may include a special area of fingerprint sensing corresponding to those light sources 202, 203 that can be set to a reverse biased detector state. In addition, although the detector pixels 204, 205 are shown on the same substrate 206 as the light sources 202, 203, the detector pixels 204, 205 can be otherwise arranged within the device, for example, on a different plane from the light sources 202, 203.

The cover layer 208 may include a cover lens, cover glass, or cover sheet, which protects the inner components of the display 200, such as the light sources 202, 203 and the detector pixels 204, 205. The cover layer 208 may be made of any suitable material such as chemically strengthened glass, crystalline materials (e.g., synthetic sapphire), transparent polymeric materials, and the like. The cover layer 208 may also include one or more additional layers associated with display and/or touch screen functionality, such as capacitive touch screen functionality. The cover layer 208 may be transparent thereby allowing light from light sources 202, 203 and the native display elements (e.g., native OLED emitters) to be transmitted and observed outside of the display 200. A top surface of the cover layer 208 forms a sensing surface or input surface 212, which provides a contact area for the input object 210.

The input object 210 is an object to be imaged and may include a biometric object such as a fingerprint. The input object 210 may have various characteristics, for example, ridges 214 and valleys 216. Due to their protruding nature, the ridges 214 contact the sensing surface 212 of the cover layer 208. In contrast, the valleys 216 generally do not contact the sensing surface 212 and instead form a gap 218 between the input object 210 and the sensing surface 212. The input object 210 may have other characteristics 221, such as moisture, stain, or ink, that do not create significant structural differences in portions of the input object 210, but which may affect its optical properties.

The light sources 202, 203 transmit beams of light within the cover layer 208 and the transmitted light becomes incident on the sensing surface 212 of the cover layer 208 at various angles. Depending on the angles, some of the transmitted light is reflected and some of the transmitted light is refracted. However, for cases where no fingerprint ridge is present on the sensing surface 212, light beams which arrive at the sensing surface 212 at an angle exceeding a critical angle $\theta c$ undergo total internal reflection, i.e., all light from the transmitted beam exceeding the critical angle is reflected at the sensing surface 212.

As will be appreciated, since the medium above the sensing surface 212 may vary, the critical angle at various points along the sensing surface 212 may likewise vary. For example, the ridges 214 of the input object 210 and gaps 218 formed within the valleys 216 of the input object 210 may have different indices of refraction. As a result, different critical angles may exist at the boundaries between the sensing surface 212 and ridges 214 as compared to the boundaries formed by the gaps 218 and the sensing surface 212. These differences are illustratively shown in FIG. 2. Line 220 represents a beam of light transmitted from the light source 202 at the critical angle ($\theta cv$) for a gap 218 and sensing surface 212 boundary, and line 222 represents the corresponding reflected beam. Line 224 represents a beam of light transmitted at the critical angle ($\theta cr$) for a ridge 214 and sensing surface 212 boundary, and line 226 represents a corresponding reflected beam. Relative to light source 202, region 228 depicts an area on the substrate 206 that is bounded by reflected light resulting from light beams transmitted at the critical angles $\theta cv$ and $\theta cr$, or in other words is bounded by reflected beams 222 and 226.

In accordance with some embodiments, detector pixels 204 falling within region 228 are used to detect reflected light to image part of input object 210 when light source 202 is illuminated. With respect to the detection of ridges and valleys, region 228 is an area of relatively high contrast. The relative high contrast occurs because light reflected from the sensing surface 212 in contact with valleys 216 (e.g., air) undergoes total internal reflection whereas light reflected from the sensing surface 212 in contact with the input object 210 (e.g., skin) does not. Thus, light beams transmitted from light source 202 which have an angle of incidence at the sensing surface falling between $\theta cv$ and $\theta cr$ are reflected and reach detector pixels 204 falling within region 228.

In accordance with another aspect of the disclosure, detector pixels 205 falling within region 230 (relative to light source 202) may also be used to image the input object 210. In particular, transmitted beams from light source 202, which become incident on the sensing surface 212 with angles smaller than both critical angle of ridge ($\theta cr$) and critical angle of valley ($\theta cv$) result in reflected beams falling within region 230. Due to scattering, the contrast of reflected beams falling within region 230 from ridges 214 and valleys 216 may be less than the contrast of reflected beams falling within high contrast region 228. However, depending on factors such as the sensitivity of the detector pixels 204, 205 and resolution requirements, region 230 may still be suitable for sensing ridges 214 and valleys 216 on the input object 210. Moreover, region 230 may be suitable for detecting non-structural optical variations in the input object 210 such as moisture or stains or ink 221.

It will be appreciated that the reflected light beams detected in region 228 may provide a magnified view of a partial image of the input object 210 due to the angles of reflection. The amount of magnification depends at least in part upon the distance between the light source 202 and the sensing surface 212 as well as the distance between the detectors 204 and the sensing surface 212. In some implementations, these distances may be defined relative to the normal of these surfaces or planes (e.g., relative to a normal of the sensing surface or relative to a plane containing the light source or detectors). For example, if the light source 202 and the detector pixels 204 are coplanar, then the distance between the light source 202 and the sensing surface 212 may be equivalent to the distance between the detectors 204 and the sensing surface 212. In such a case, an image or partial image of the input object 210 may undergo a two-times magnification (2×) based on a single internal reflection from the sensing surface 212 reaching the detector pixels 204 in region 228.

The critical angles $\theta_{cr}$ and $\theta_{cv}$ resulting from ridges 214 and gaps 218 at the sensing surface 212 are dependent at least in part on the properties of the medium in contact with the boundary formed at the sensing surface 212, which may be affected by a condition of the input object 210. For example, a dry finger in contact with the sensing surface 212 may result in a skin to air variation across the sensing surface 212 corresponding to fingerprint ridges and valleys, respectively. However, a wet finger in contact with the sensing surface 212 may result in a skin to water or other liquid variation across the sensing surface 212. Thus, the critical angles of a wet finger may be different from the critical angles formed by the same finger in a dry condition. Thus, in accordance with the disclosure, the intensity of light received at the detector pixels 204, 205 can be used to determine the relative critical angles and/or whether the object is wet or dry, and perform a mitigating action such as processing the image differently, providing feedback to a user, and/or adjust the detector pixels or sensor operation used for capturing the image of the input object. A notification may be generated to prompt correction of an undesirable input object condition. For example, if a wet finger is detected, a message may be displayed or an indicator light may be lit to prompt the user to dry the finger before imaging.

Figure 3:
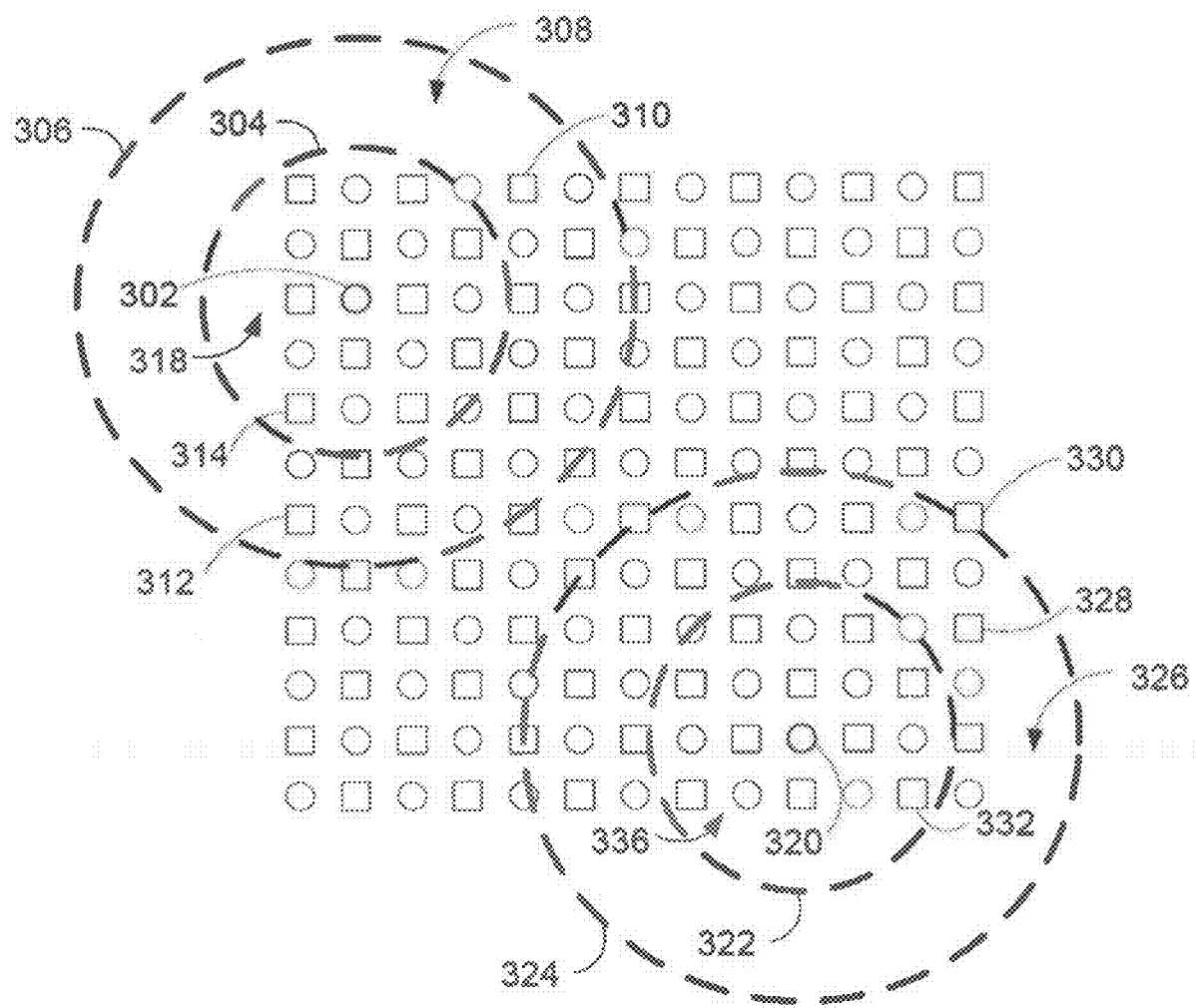
FIG. 3 illustrates a plan view of an example of a sensor according to some embodiments, wherein various display pixels (circles) and detector pixels (squares) are located on the same plane or parallel planes, and wherein the sensing surface lies in a plane that is parallel to the detector pixel plane and the display pixel plane.

FIG. 3 illustrates a plan view of an example of a sensor according to some embodiments, wherein various display elements or pixels (circles) and detector pixels (squares) are located on the same plane or parallel planes, and wherein the sensing surface lies in a plane that is parallel to the detector pixel plane and the display pixel plane. In the example, a light source corresponding to display pixel 302 is illuminated for imaging a portion of the input object 210 (FIG. 2). Concentric circles 304 and 306 illustrate boundaries of a high contrast region 308, which as described above depend at least in part on factors such as the dimensions of the display as well as the critical angles $\theta_{cr}$ and $\theta_{cv}$.

In certain embodiments, when the light source corresponding to display pixel 302 is illuminated, detector pixels falling within the high contrast region 308, such as detector pixels 310 and 312 may be used to detect reflected light from the display pixel 302 to image a portion of the input object. In other embodiments, or in combination with the collection of data from region 308, detector pixels, such as detector pixels 314 falling within region 318 may be used.

Also shown in FIG. 3 is a second light source corresponding to a second display pixel 320. Concentric circles 322 and 324 illustrate boundaries of a second high contrast region 326, which corresponds to display pixel 320. Detector pixels within region 326, such as detector pixels 328 and 330, may be used to collect data corresponding to the object to be imaged. In other embodiments, or in combination with the collection of data from region 326, detector pixels, such as detector pixel 332 falling within region 336 may be used. In some implementations, an entirety of the detector array is read out and portions of the image falling outside of the region of interest are filtered out or discarded. In other implementations, the detector array is selectively read out or scanned to capture image data from only the region of interest in accordance with the currently active light source.

In the example of FIG. 3, high contrast region 308 and high contrast region 326 are non-overlapping. It will be understood, however, that regions 308 and 326 may overlap. In the case of overlapping high contrast regions, light sources 302 and 320 may be illuminated at different times, as discussed in connection with FIGS. 4A-4B below. Alternatively, provisions may be made to distinguish the light transmitted from light source 302 as compared to the light transmitted from light source 320 in which case light source 302 and 320 may be simultaneously illuminated while data is collected within their respective high contrast regions. When display pixels 302 and 320 are simultaneously illuminated as part of object imaging, FIG. 3 provides an example of object imaging using a spatial pattern.

It will be understood that FIG. 3 illustrates only the illumination of two light sources and each light source includes corresponding detection regions with which data is collected for partial images of the input object. In operation, the system and method contemplate the illumination of as many light sources as desired to capture enough partial images to make up a larger image, or complete image of the object, and one light source may be suitable in some implementations. It will also be understood that various display elements or pixels may be independently used for displaying visual information simultaneously while selected light sources (which may be part of or separate from the display) are illuminated for object imaging. For example, a light source may be used that is significantly brighter than the light from surrounding display light from display images, allowing the optical sensor signal to be strong enough to be discriminated from a noisy background caused by display. Alternatively, the display pixels may be locally turned off or dimmed in a region surrounding the currently active sensor light source during sensing.

FIGS. 4A-4B show a series of plan views which illustrate an example of object imaging using a temporal pattern, in accordance with some embodiments. In FIG. 4A, a display pixel is used as a light source. When light source 402 is illuminated, concentric circles 404 and 406 identify the boundaries of high contrast area 408. In this configuration, detector pixels within the high contrast area 408, such as detector pixels 410 and 412, may be used to collect data corresponding to ridges and valleys, or other surface features, from input object 212 to be imaged. Alternatively, or in combination with the foregoing, detector pixels within region 411, which is radially inward from boundary 404, may be used. In some implementations, other detector pixels outside the region 406 may be used.

FIG. 4B represents the same set of display pixels and detectors pixels as FIG. 4A, but at a different time. Light source 414 is illuminated. As will be noted, the concentric circles 416 and 418 identifying the boundaries of corresponding high contrast region 420 have moved relative to the high contrast region 408 of FIG. 4A. Thus, the subset of detector pixels falling in the high contrast area have changed, although some pixels may fall with both high contrast areas 408 and 420 such as detector pixel 412.

In the example of FIGS. 4A and 4B, high contrast regions 408 and 420 overlap. However, illumination of the light sources 402 and 414 are temporally spaced. For example, light source 402 is illuminated or activated. After the data is collected from within region 408, light source 402 is turned off or deactivated. Light source 414 is then illuminated or activated and data is collected from within region 420. After data is collected from within region 420, light source 414 is turned off. This process continues using as many display pixels, and in any sequence, as desired to capture enough partial images to form a larger or complete image or representation of the input object as desired. As previously described, this disclosure also contemplates the simultaneous illumination of multiple display pixels having non-overlapping high contrast areas as well as simultaneous illumination of multiple display pixels having overlapping high contrast areas provided, for example, that the reflected light received from the different illumination pixels can be resolved or determined.

Figure 5:
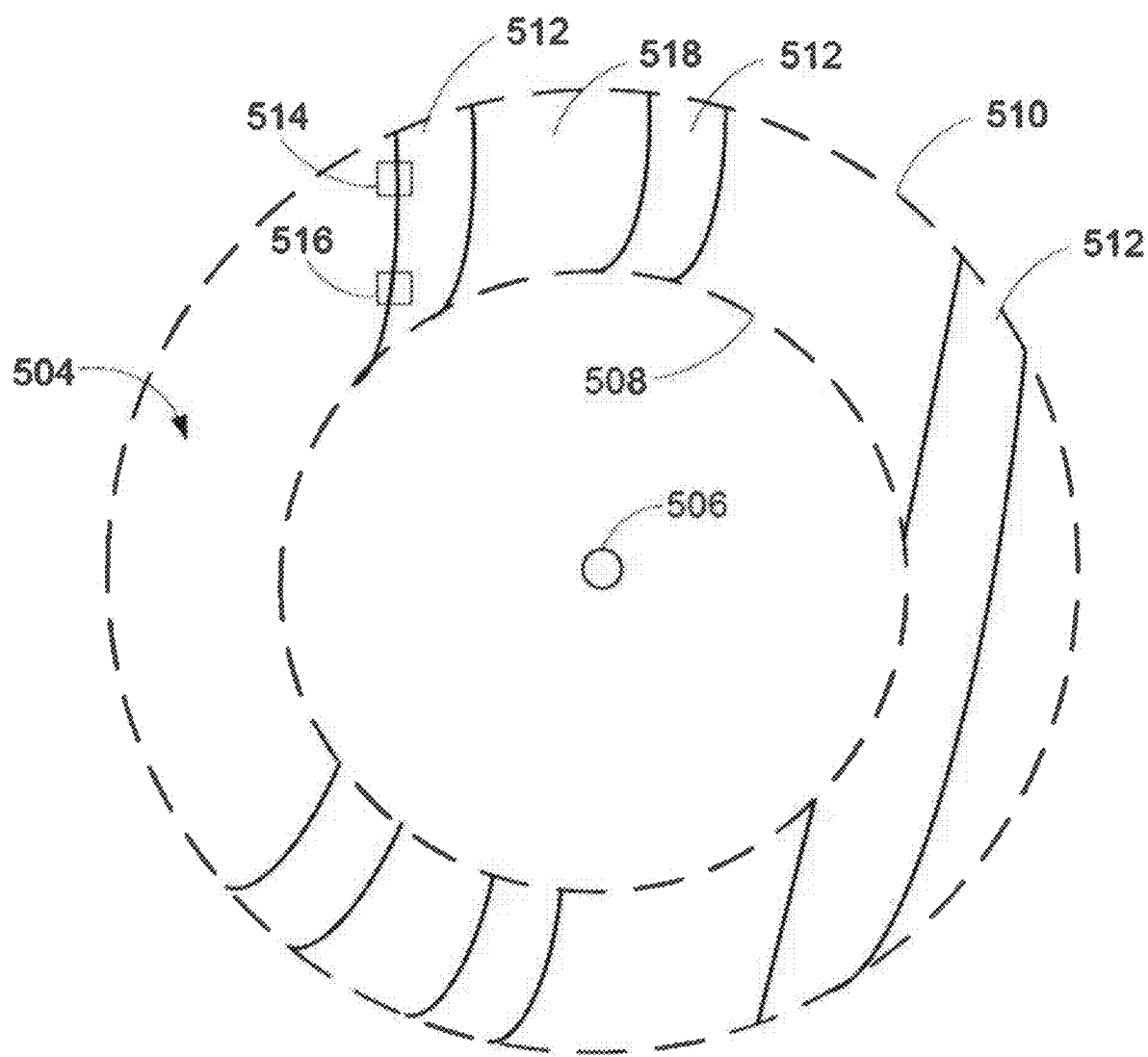
FIG. 5 illustrates a plan view of a partial image of an object superimposed onto a high contrast region, which is imaged during illumination of a display pixel.

FIG. 5 illustrates a plan view of a partial image of an object superimposed onto a high contrast region 504, which is imaged during illumination of display pixel 506. Concentric circles 508 and 510 show the boundaries of the high contrast region 504. Portions 512 correspond to ridges of the input object. Other areas within the high contrast region 504 correspond to valleys 518 of the input object. As previously described, due to the angles of reflection undergone by light transmitted by display pixel 506, the ridges and the valleys detected in the high contrast region 504 may be magnified as compared the actual ridges and valleys on the object. The amount of magnification may depend on the geometry of the display, including the distance between the display pixels, detector pixels, and the sensing region. Moreover, detector pixels further away from the display pixel 506, e.g., detector pixel 514, may receive lower intensity reflected light as compared to detector pixels closer to the display pixel, e.g., detector pixel 516 because the intensity of light decreases in relation to the distance it travels in the various display layers.

In some applications, image data from various partial images obtained during patterned illumination (e.g., sequential or simultaneous illumination of display pixels as described herein) of the individual display pixels is combined into composite image data of the input object. The partial image data may be aligned based on known spatial relationships between the illumination sources in the pattern. By way of example, the partial image data may be combined by stitching together the partial images into a larger image, or by generating a map that relates the image data from the various partial images according to their relative alignments. Demagnification of the images may be useful prior to such piecing together or mapping. In addition, it may be useful to apply a weighting function to the image data to account for the different intensities of light received at detector pixels having different distances from the display pixels. In some applications, if pixels inside of region 508 are used, the resulting data from the various partial images may be deconvolved to reconstruct the larger image. Alternatively, the data inside of this region may convey sufficient information for some applications, so that no deconvolution is used.

Figure 6:
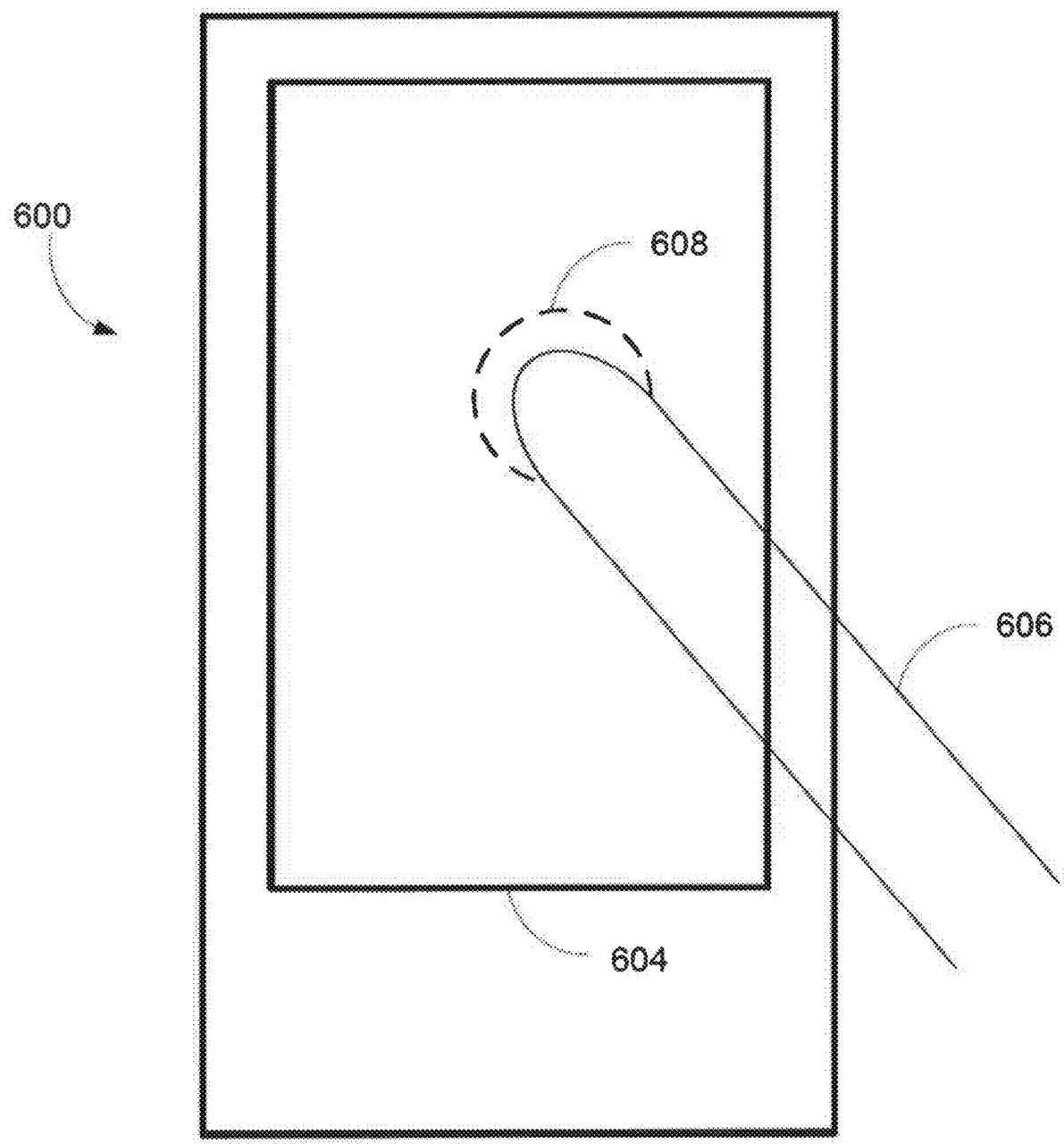
FIG. 6 illustrates a way to provide feedback during imaging of an object using a display according to the present disclosure.

FIG. 6 illustrates a way to provide feedback during imaging of an object using a display according to the present disclosure. Such feedback may be used, for example, to provide feedback to a user during acquisition of a fingerprint image in an enrollment and/or authentication process.

As shown, the device 600 includes an active display area 604. The active display area 604 may encompass a portion of a surface of the device 600 as shown, or it may encompass the entire device surface or multiple portions of the device surface. Also, the sensing surface or input surface may encompass a portion of the active display area 604, or the sensing surface may encompass the entire active display area 604 or multiple portions of the active display area 604. An object 606, such as a finger, is placed over (e.g., proximal to or in contact with) the active display area 604. One or more light sources (not shown) underneath the object 606 are illuminated according to a pattern to image part or all of the object 606 in accordance with the description herein. During or after imaging of the object 606, display pixels or other light sources at or about the perimeter of the object 606 may be illuminated to provide a visually perceptible border 608. The displayed border 608 may change in appearance to signify status. For example, while the object 606 is being imaged and/or during an authentication period, the border could be a first color (e.g., yellow). Once the imaging and authentication is completed, the color could change to a second color (e.g., green) if the authentication is successful or a third color (e.g., red) if the authentication is unsuccessful. It will be appreciated that changes in color provide one example of how the border 608 may be altered to signal status to the user. Other changes in the appearance of the border, such as a change from dashed line to a solid line, or an overall change in the shape of the border could be employed as well.

Figure 7:
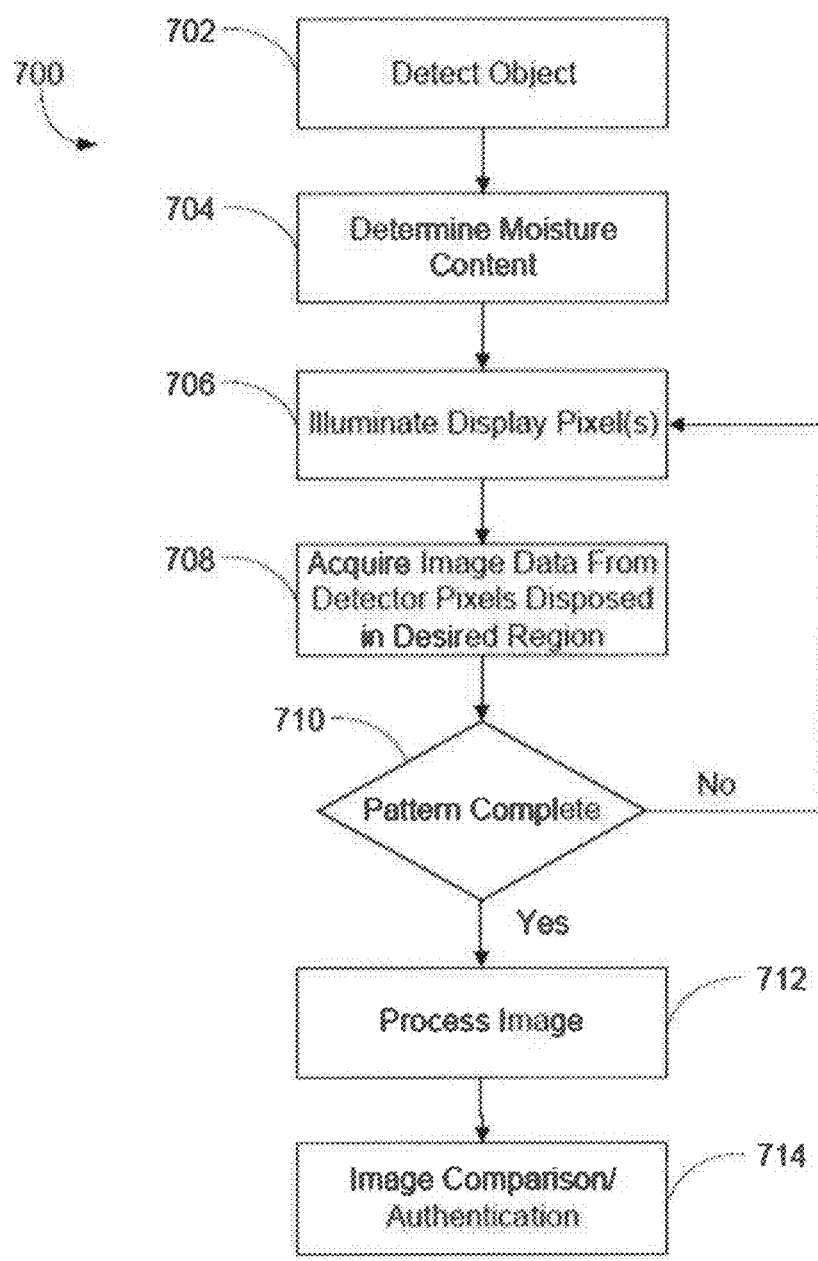
FIG. 7 illustrates a method of obtaining, processing and performing matching of an image of an input object, such as a fingerprint.

FIG. 7 illustrates a method 700 of obtaining, processing and performing matching of an image of an input object, such as a fingerprint. By way of example, matching may be used for biometric authentication or biometric identification. It will be appreciated that the steps and sequence of steps are by way of example only. Steps may be eliminated or the sequence modified without departing from the present disclosure.

In step 702, the presence of an input object proximal to or in contact with the sensing surface of the display is detected. Such detection may occur, for example, as the result of detection of changes of intensity in light received at detector pixels in the display. Alternatively, presence of the input object may be detected via capacitive sensing or other conventional techniques using a touch screen for example.

In step 704, moisture content of the input object to be imaged is determined. The moisture content can be determined, for example, by illuminating display pixels to determine the inner boundary of the high contrast area. By comparing the determined inner boundary of the high contrast to an expected boundary for a dry object, the relative moisture content can be estimated. The moisture content can be used for various purposes. For example, the detected moisture content can be used as a metric of expected image quality. The detected moisture content may also be used to establish the boundaries of high contrast and, therefore, used to establish which detector pixels will be used to collect data when a given light source is illuminated as part of the imaging process. The detected moisture content may also be used to notify the user that a suitable image cannot be obtained. The user may then be instructed to dry the object (e.g., finger) and initiate another imaging attempt.

In step 706, one or more light sources (e.g., display pixels, separate LEDs, etc.) are illuminated to image the input object. The light sources to be illuminated and sequence of illumination depend on the illumination pattern used. If a spatial pattern is used, multiple spatially separated light sources are simultaneously illuminated. If a temporal pattern is used, different light sources, or different clusters of light sources that are collectively operated as a point source, are illuminated at different times. As previously described, the pattern used for imaging may include a combination of temporal and spatial patterns. For example, a first set of display pixels may be illuminated first where the corresponding high contrast areas are non-overlapping. This may then be followed by a second set of distinct display pixels being illuminated, which likewise provide non-intersecting high contrast regions and so on. The display pixels illuminated and sequence of illumination may be guided by a touch position detected by capacitive sensor or touch screen, for example.

It is further contemplated that multiple display pixels may be illuminated even though they provide overlapping high contrast areas. In such an arrangement, the display pixels transmit light of different wavelengths (e.g., colors), which can be separately detected to resolve different partial images of the object. Alternatively, techniques such as code division multiplexing (CDM) may be used to transmit the light. In such an arrangement, the collected data may be de-convolved to resolve the different subparts of the fingerprint. Other methods to distinguish between light transmitted from different display pixels may be used provided that light transmitted from different display pixels can be detected and distinguished.

In step 708, image data is obtained from appropriate detector pixels. The appropriate detector pixels will, for example, be the detector pixels in the corresponding high contrast region(s) for the display pixel(s) illuminated. However, as previously described, a region inside of the high contrast region may be used. Further, in some implementations, the entire detector array is read out or scanned and then the undesired pixel region can be filtered out with image processing.

In step 710, a determination is made as to whether the illumination pattern is complete. The pattern is complete when data for all of the partial images that will make up the entirety of a desired image of the object is collected. If the pattern is not complete, the process returns to step 706. In step 706, the next light source or set of light sources is illuminated.

In step 712, the collected data for the various partial images undergo processing. By way of example, the processing may include demagnification of the image data and/or normalization or the application of weighting factors to the image data to account for the different intensities of light detected at detector pixels further away from the light sources. The processing may further include combining the data for the various partial images into a complete image or creating a template that relates the partial images to one another even though they are kept separate. The image data from the various partial images may be combined according to the known geometric relationships between the pixels in the pattern. The image data may also be combined based on other parameters, such as the thickness of the cover layer, which provides additional information about the light beam paths from the illumination and detector pixels to the sensing surface to resolve physical transformations between the partial images. The thickness of the cover layer may be pre-defined or may be computed at image capture time based on the location of the inner boundary of the high contrast region. For example, the location of the inner boundary may be closer or further away from the illuminated display pixel for thinner or thicker cover layers, respectively.

In step 714, the image data may be compared to previously stored images of the object. For example, an image of a fingerprint taken during an authentication attempt may be compared to previously stored enrollment views of the fingerprint. If a match is detected, the user is authenticated. If a match is not detected, authentication may be denied. As another example, an image of a fingerprint taken during a control input may be compared to previously stored enrollment views of the fingerprint to identify which finger provided the input. If a match is detected to a specific finger, a finger specific display response or other device operation may then be initiated based on the identified finger.

As described in connection with FIG. 6, the user may be provided with feedback during the process described in connection with FIG. 7. For example, a colored border may be provided around the user's finger during imaging and/or while the authentication process is underway. Once those processes are complete, the color of the border may change to signify completion of imaging and the results of the authentication. For example, a green border signifies authentication is successful whereas a red border signifies that the authentication failed.

After image processing, the collected data for the object may be stored for later use, e.g., in memory 108 or template storage 110.

Figure 8:
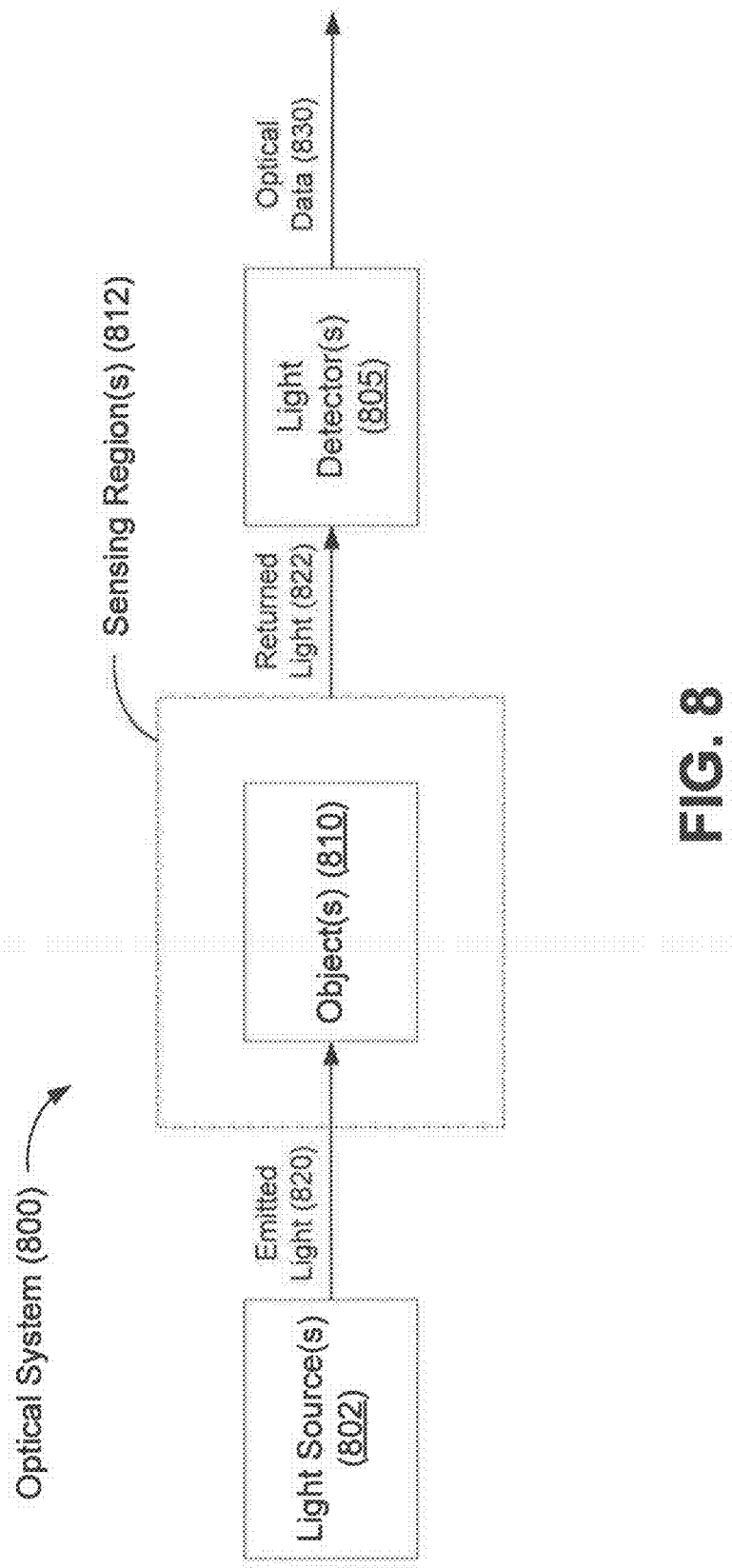
FIG. 8 depicts a schematic diagram of an optical system, in accordance with various embodiments.

FIG. 8 depicts a schematic diagram of an optical system 800, in accordance with some optical system embodiments. The optical system 800 is configured to optically detect one or more objects 810 and includes one or more light sources 802, one or more sensing regions 812, and one or more light detectors (or "optical detectors") 805. When operated, the light source(s) 802 emits emitted light 820 towards the sensing region(s) 812, and the emitted light 820 interacts with the object(s) 810 when the object(s) 810 is disposed in the sensing region(s) 812. The light detector(s) 805 detects returned light 822 returning from the sensing region(s) 812 and converts the returned light 822 into optical data 830.

The sensing region(s) 812 encompasses one or more spaces or areas in which the optical system 800 is capable of detecting the object(s) 810 and capturing sufficient information associated with the object(s) 810 that is of interest to the optical system 800. The sensing region(s) 812 is optically coupled to both the light source(s) 802 and the light detector(s) 805, thereby providing one or more illumination optical paths for the emitted light 820 to reach the sensing region(s) 812 from the light source(s) 802 and one or more return optical path(s) for the returned light 822 to reach the light detector(s) 805 from the sensing region(s) 812. The illumination optical path(s) and the detection optical path(s) may be physically separate or may overlap, in whole or in part. In some implementations of the optical system 800, the sensing region(s) 812 includes a three-dimensional space within a suitable depth or range of the light source(s) 802 and the optical detector(s) 805 for depth imaging or proximity sensing. In some implementations, the sensing region(s) 812 includes a sensing surface (e.g., a sensor platen) having a two dimensional area for receiving contact of the object(s) 810 for contact imaging or touch sensing. In some implementations, the sensing region(s) 812 may encompasses a space or area that extends in one or more directions until a signal to noise ratio (SNR) or a physical constraint of the optical system 800 prevents sufficiently accurate detection of the object(s) 810.

The light source(s) 802 includes one or more light emitters (e.g., one or more light emitting devices or materials) configured to illuminate the sensing region(s) 812 for object detection. In some implementations of the optical system 800, the light source(s) 802 includes one or more light emitting diodes (LEDs), lasers, or other electroluminescent devices, which may include organic or inorganic materials and which may be electronically controlled or operated. In some implementations, the light source(s) 802 includes a plurality of light sources, which may be arranged in a regular array or irregular pattern and which may be physically located together or spatially segregated in two or more separate locations. The light source(s) 802 may emit light in a narrow band, a broad band, or multiple different bands, which may have one or more wavelengths in the visible or invisible spectrum, and the light source(s) 802 may emit polarized or unpolarized light. In some implementations, the light source(s) 802 includes one or more dedicated light emitters, which are used only for illuminating the sensing region(s) 812 for object detection. In some implementations, the light source(s) 802 includes one more light emitters associated with one or more other functions of an electronic system, such as emitters or display elements used for displaying visual information or images to a user.

The light detector(s) 805 includes one or more light sensitive devices or materials configured to detect light from the sensing region(s) 812 for object detection. In some implementations of the 800, the light detector(s) 805 includes one or more photodiodes (PDs), charge coupled devices (CCDs), phototransistors, photoresistors, or other photosensors, which may include organic or inorganic materials and which may be electronically measured or operated. In some implementations, the light detector(s) 805 includes a plurality of light sensitive components, which may be arranged in a regular array or irregular pattern and may be physically located together or spatially segregated in two or more separate locations. In some implementations, the light detector(s) 802 includes one or more image sensors, which may be formed using a complementary metal-oxide-semiconductor (CMOS), a thin film transistor (TFT), or charge-coupled device (CCD) process. The light detector(s) 805 may detect light in a narrow band, a broad band, or multiple different bands, which may have one or more wavelengths in the visible or invisible spectrum. The light detector(s) 805 may be sensitive to all or a portion of the band(s) of light emitted by the light source(s) 802.

The object(s) 810 includes one or more animate or inanimate objects that provide information that is of interest to the optical system 800. In some implementations of the optical system 800, the object(s) 810 includes one or more persons, fingers, eyes, faces, hands, or styluses. When the object(s) 810 is positioned in the sensing region(s) 812, all or a portion of the emitted light 820 interacts with the object(s) 810, and all or a portion of the emitted light 820 returns to the light detector(s) 805 as returned light 822. The returned light 822 contains effects corresponding to the interaction of the emitted light 820 with the object(s) 810. In some implementations of the optical system 800, when the emitted light 820 interacts with the object(s) 810 it is reflected, refracted, absorbed, or scattered by the object(s) 810. Further, in some implementations the light detector(s) 805 detects returned light 822 that contains light reflected, refracted, or scattered by the object(s) 810 or one or more surfaces of the sensing region(s) 812, and the returned light 822 is indicative of effects corresponding to the reflection, refraction, absorption, or scattering of the light by the 810. In some implementations, the light detector 805 also detects other light, such as ambient light, environmental light, or background noise.

The light detector(s) 805 converts all or a portion of the detected light into optical data 830 containing information regarding the object(s) 810, and corresponding to the effects of the interaction of the emitted light 820 with the object(s) 810. In some implementations, the optical data 830 includes one or more images, image data, spectral response data, biometric data, or positional data. The optical data 830 may be provided to one or more processing components for further downstream processing or storage.

Components of the optical system 800 may be contained in the same physical assembly or may be physically separate. For example, in some implementations of the optical system 800, the light source(s) 802 and the optical detector(s) 805, or subcomponents thereof, are contained in the same semiconductor package or same device housing. In some implementations, the light source(s) 802 and the light detector(s) 805, or subcomponents thereof, are contained in two or more separate packages or device housings. Some components of the optical system 800 may or may not be included as part of any physical or structural assembly of the optical system 800. For example, in some implementations, the sensing region(s) 812 includes a structural sensing surface included with a physical assembly of the optical system 800. In some implementations, the sensing region(s) 812 includes an environmental space associated with the optical system 800 during its operation, which may be determined by the design or configuration of the optical system 800 and may encompass different spaces over different instances of operation of the optical system 800. In some implementations, the object(s) 810 is provided by one or more users or environments during operation of the optical system 800, which may include different users or environments over different instances of operation of the optical system 800.

The optical system 800 may include one or more additional components not illustrated for simplicity. For example, in some implementations of the optical system 800, the optical system 800 includes one or more additional optics or optical components (not pictured) included to act on the light in the optical system 800. The optical system 800 may include one or more light guides, lenses, mirrors, refractive surfaces, diffractive elements, filters, polarizers, spectral filters, collimators, pinholes, or light absorbing layers, which may be included in the illumination optical path(s) or return optical path(s) and which may be used to modify or direct the light as appropriate for detection of the object(s) 810.

Figure 9:
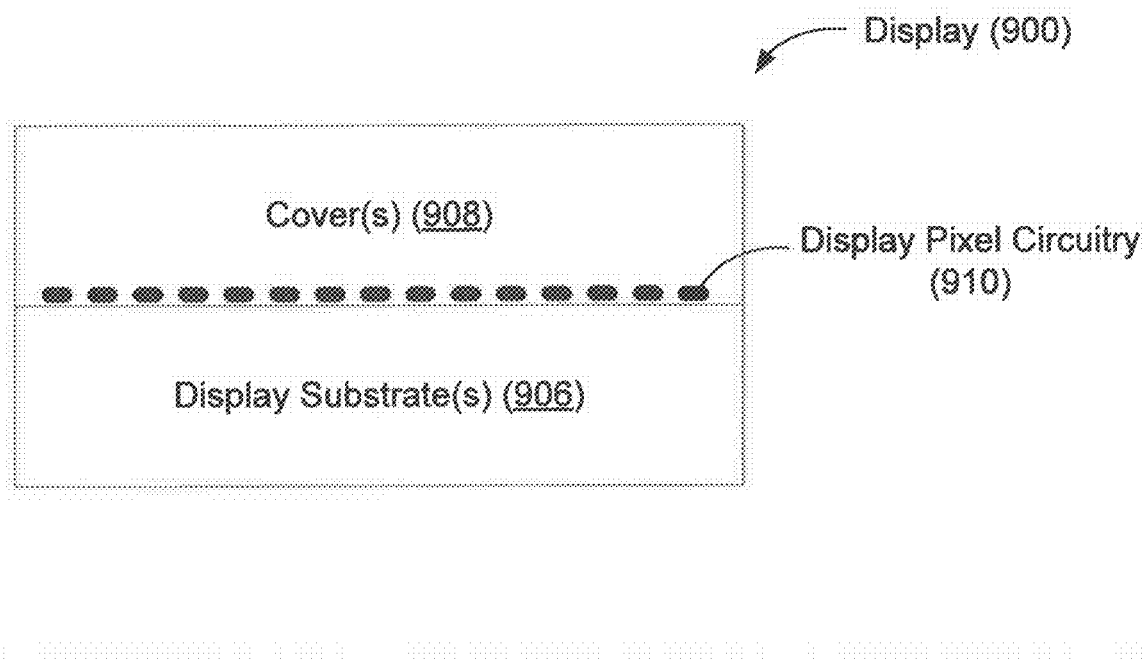
FIG. 9 depicts a schematic diagram of a display in accordance with various embodiments.

FIG. 9 depicts a schematic diagram of a display 900 in accordance with some display embodiments. The display 900 includes one or more display substrates 906, display pixel circuitry 910, and one or more cover layers or covers 908.

The display 900 is an electronic visual display device for presenting images, video, or text to one or more viewers or users. The display 900 includes display pixel circuitry 910 (e.g., one or more electrodes, conductive lines, transistors, or the like) disposed fully or partially over the display substrate(s) 906 for operating one or more display elements or display pixels in the display 900. The display pixel circuitry 910 may be disposed over the display substrate(s) 906 directly on a surface of the display substrate(s) 906 or on one or more intervening layers that are disposed on the display substrate(s) 906. The display substrate(s) 906 includes one or more supporting layers for carrying the display pixel circuitry 910 or components of the display 900. The cover(s) 908 includes one or more layers (e.g., one or more passivation layers, planarization layers, protective cover sheets, or the like) disposed over the display substrate(s) 906 and disposed over the display pixel circuitry 910. In some implementations of the display 900, the display 900 forms a flat, curved, transparent, semitransparent, or opaque display panel. In some implementations, the display 900 includes a plurality of layers arranged in a display stack. The display stack may include all layers making up a display panel or any plural subset of stacked layers in a display panel.

The display 900 may utilize a suitable technology for displaying two or three-dimensional visual information, such as organic light emitting diode (OLED) technology, micro-LED technology, liquid crystal display (LCD) technology, plasma technology, electroluminescent display (ELD) technology, or the like. In some implementations of the display 900, the display pixel circuitry 910 includes an active matrix or passive matrix backplane. In some implementations, the display 900 is an emissive or non-emissive display. In some emissive implementations of the display 900, the display pixel circuitry 910 controls or operates pixel values of a plurality of light emitting display pixels, and the display pixels are top emitting or bottom emitting. In some non-emissive implementations of the display DIS, the display pixel circuitry 910 controls or operates pixel values of a plurality of transmissive or reflective display pixels. In some implementations, the display 900 presents visible images that are viewable from one or more sides of the display that may be above the cover side, below the substrate side, or around the display.

Figure 10:
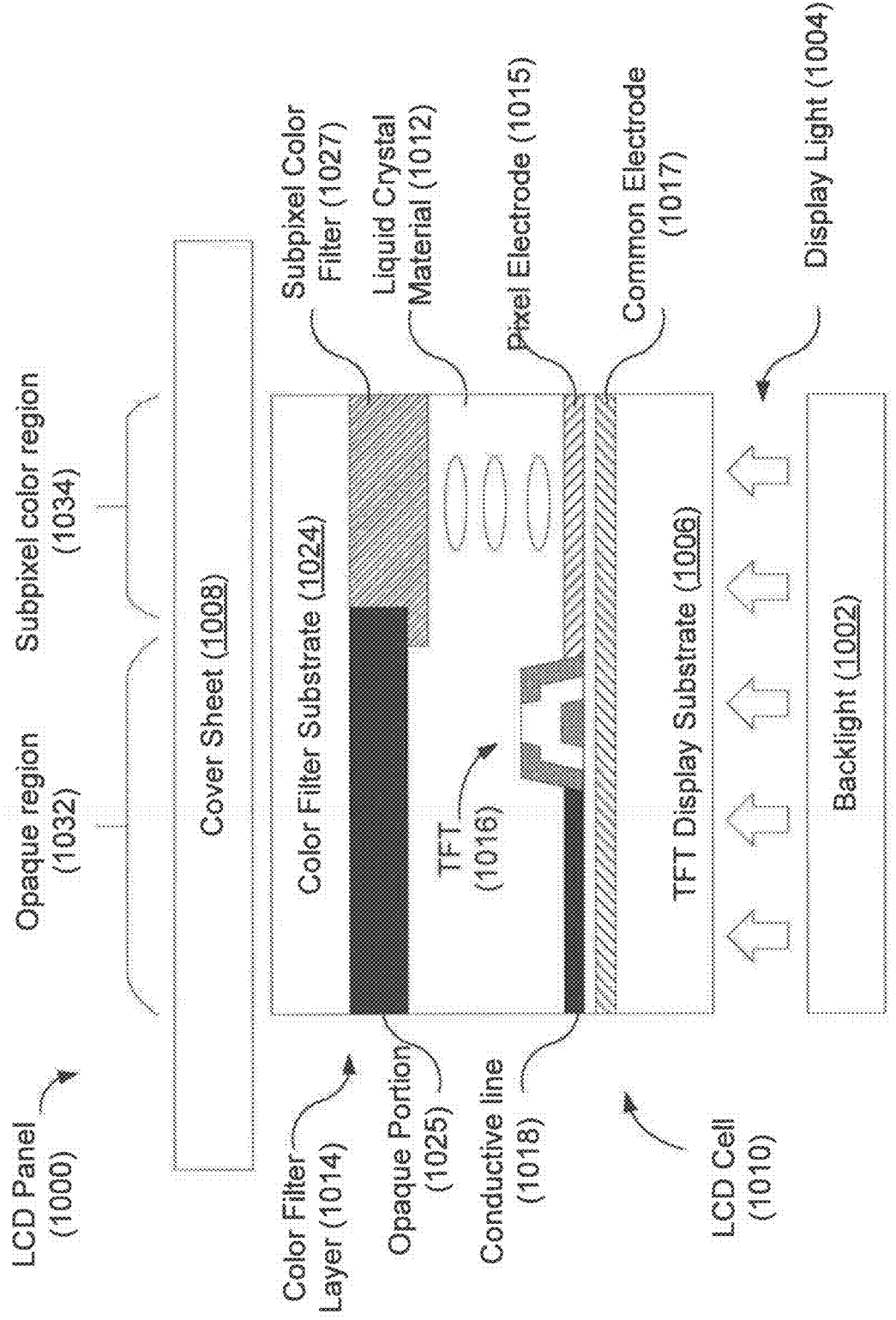
FIG. 10 depicts a schematic diagram of a liquid crystal display (LCD) panel, in accordance with various LCD display embodiments.

FIG. 10 depicts a schematic diagram of a liquid crystal display (LCD) panel 1000, in accordance with some LCD display embodiments.

The LCD panel 1000 includes an LCD cell 1010 and a display illuminator, e.g., a backlight 1002, for illuminating the LCD cell 1010 with display light 1004. The backlight 1002 includes one or more emissive, reflective, or refractive components (e.g., one or more LEDs, prism arrays, brightness enhancement films, etc.) for providing display light 1004 to the LCD cell 1010. The backlight 1002 may also include a polarizer, or a polarizer may be disposed over the backlight 1002, to filter a polarization of light reaching the LCD cell 1010.

The LCD panel 1000 includes a transparent thin film TFT display substrate 9061006 made of glass or another suitable material over which display pixel circuitry can be formed. A liquid crystal material 1012 is disposed over the transparent thin film transistor (TFT) display substrate 1006, and the liquid crystal material 1012 is sandwiched between the TFT display substrate 1006 and a color filter layer 1014. Display pixel circuitry associated with operation of the LCD panel 1000, including a TFT 1016, a conductive line 1018, and electrodes are disposed over the TFT display substrate 1006. The conductive line 1018 may be used for transmitting signals associated with the subpixel, such as control signals for operating the TFT 1016 or subpixel data associated with subpixel values of displayed frames. The TFT 1016 may be used for switching or controlling signals transmitted through the display pixel circuitry, and although one transistor is shown in the figure, in some implementations of the LCD panel 1000 multiple transistors may be included in the same subpixel.

The liquid crystal material 1012 is coupled to a common electrode 1017 and a pixel electrode 1015, which may be used to apply a voltage or electrode field to the liquid crystal material 1012 for controlling an amount of the display light 1004 passing through the subpixel, in accordance with display frame data. The application of a voltage to the pixel electrode 1015 may generate an electric field, which may alter an orientation of the liquid crystal material 1012 at the subpixel, thereby controlling an amount of light passing through the subpixel color filter 1027 to a viewing region. The LCD panel 1000 may utilize in plane switching (IPS) technology or another suitable LCD technology, in which case the arrangement of the electrodes associated with the subpixel may change in accordance with the particular LCD technology.

The color filter layer 1014 may include a color filter substrate 1024, or the color filter layer 1014 may be carried by the color filter substrate 1024, and the color filter substrate 1024 may be made of glass or another suitable material. The color filter layer 1014 includes an opaque portion 1025 (e.g., a black matrix, black mask, etc.) and a subpixel color filter 1027 (e.g., a red filter, green filter, blue filter, etc.). The opaque portion 1025 may separate the subpixel color filter 1027 from one or more neighboring subpixel color filters, such as a neighboring subpixel color filter belonging to a different pixel or a neighboring subpixel color filter belonging to the same pixel but a different subpixel color of the same pixel. An areal extent of the opaque portion 1025 of the color filter layer 1014 corresponds to an opaque region 1032 of the active display region of the LCD panel 1000, and an areal extent of the subpixel color filter 1027 corresponds to a subpixel color region 1034 of the active display region of the LCD panel 1000. The LCD panel 1000 further includes a transparent cover sheet 1008 disposed over the LCD cell 1010. In some implementations of the LCD panel 1000, the cover sheet 1008 includes a chemically hardened glass layer, sapphire, or a transparent plastic material.

In FIG. 10 one subpixel of the LCD panel 1000 and some display pixel circuitry components associated with the subpixel are shown, but it should be understood that the LCD panel 1000 may include a plurality of pixels and subpixels, as well as additional display pixel circuitry and other components that are not shown in FIG. 10.

In some implementations, a light source separate from the display illuminator, such as a micro-LED point source, is disposed in, under, or over the 1010.

Figure 11:
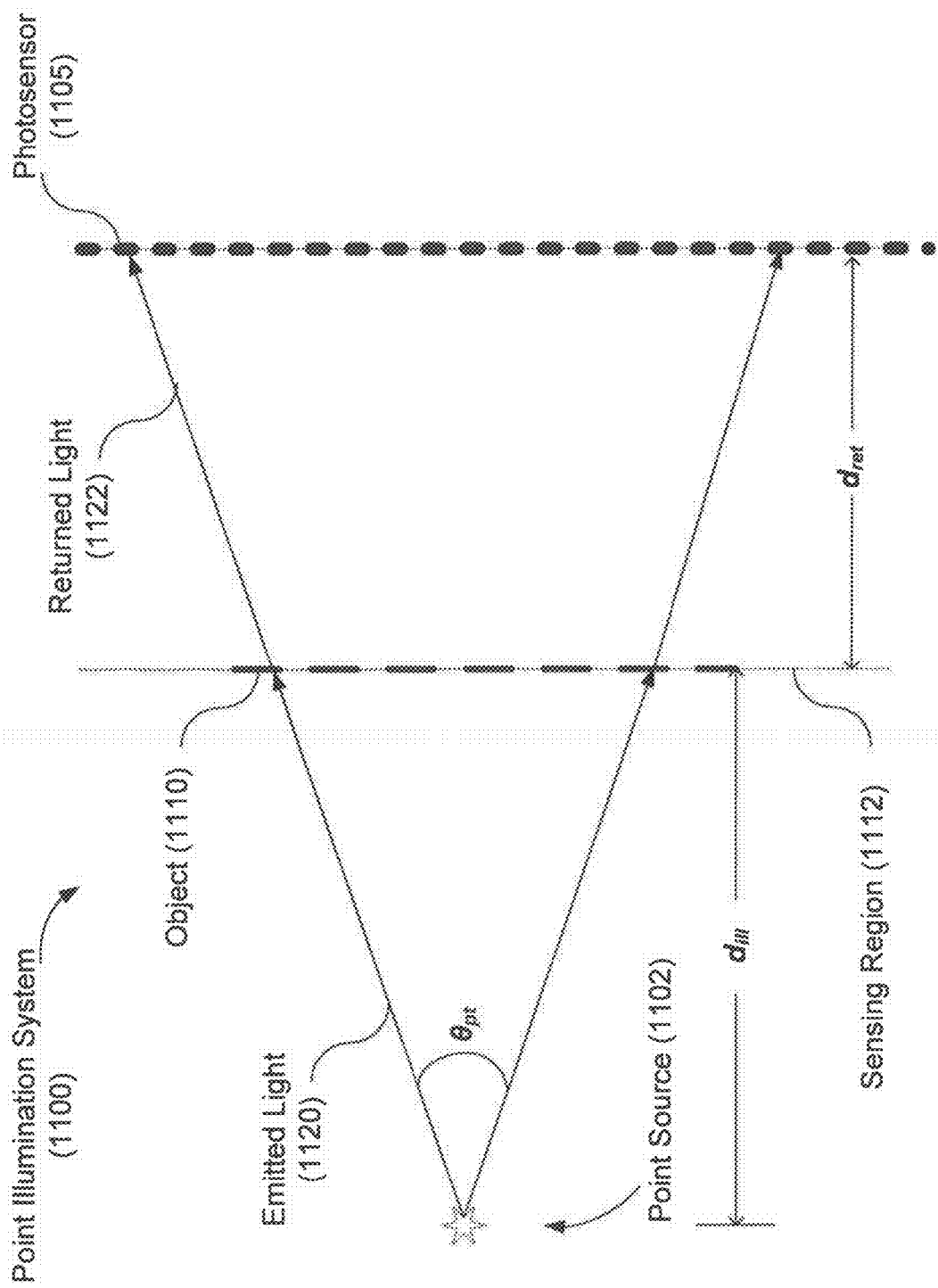
FIG. 11 shows an example of a point source based optical system in accordance with various embodiments.

FIG. 11 shows an example of a point source based optical system (or point illumination system) 1100 in accordance with certain embodiments. Light emitted from the point source 1102 diverges, but light rays from the emitted light 1120 and returned light 1122 substantially do not cross over each other to allow for an image of an object 1110 proximal a sensing region 1112 to be resolved at the photosensor plane 1105. In implementations, the point source 1102 is be a true point source or approximates a point source sufficiently to resolve a feature of the object 1110.

FIGS. 12A-12B show schematic examples of point sources for sensing, in accordance with some embodiments. In FIG. 12A, an ideal point source is shown and the illumination path distance ($d_{emi}$) and return optical path distance ($d_{ret}$) are the same, resulting in 2× magnification at the sensor plane. In FIG. 12B, a wide light source or wide cluster of light sources is utilized as a point source. This results in some blurring at the sensor plane, but the object features can still be resolved in the sensor image based on point source optical principles.

FIG. 13 depicts an example of a LCD Panel 1300 including a micro-LED (mLED) 1310 disposed in an LCD cell 1310, including an anti-reflective coating 1312, in accordance with some embodiments. Light 1320 emitted by mLED 1310 passes through a transparent region in an opaque portion 1325 into cover layer 1308 as shown.

The various optical display systems and display panels disclosed herein are suitable for use with optical biometric sensing, including optical fingerprint sensing. In optical fingerprint sensors, a collimated or point light source may be used to illuminate the finger, which allows high contrast images of fingerprint ridges and valleys to be obtained by taking advantage of the much higher reflectance (e.g., Total Internal Reflection or "TIR") at an air/glass interface (valleys) than at a skin/glass interface (ridges).

However, it can be difficult to provide such illumination in a small, thin form factor optical sensor, especially in the active area of a display. FIG. 14 illustrates a cross section of an in-display optical sensor with a discrete light source 1402, e.g., a micro-LED, for illuminating the input object 1410, e.g., finger. With reference to FIG. 14, multiple light sources 1402 located at various positions in or on the display of a display device act as light sources to allow high-contrast TIR images of an input object (e.g., fingerprint) to be obtained at various locations across the display.

Bright LEDs can be placed to the side of, or below, or in the same layer of a display (e.g., to the side of, below or in the same layer as display elements). When a light source is placed below the display, much of the light can be lost, as it is blocked by the display, which may have a net transmittance of between 2%-50%, with the net transmittance being especially low for OLED displays. In the case of LCDs, it can be difficult to illuminate the input object (e.g., finger) from below the display due to the air gaps between backlight film layers, the diffusers, and the brightness enhancement film (BEF). Some embodiments useful for addressing these problems for under display sensor light sources are described herein. FIG. 14 shows an embodiment with a sensor illumination source 1402 located or positioned above the display layer(s), in both OLED and LCD displays, enhancing both the optical efficiency, and improving the optical resolution of the sensor by retaining a true point source illumination source, and in some implementations, by increasing the effective magnification of the sensor by placing the light source closer to the finger 1410.

In some implementations, micro-LEDs can be fabricated at a range of sizes down to a few micrometers on a side or larger. Such small (and bright, compared to OLED display pixels) light sources enable illuminating a portion of a finger to obtain high contrast images of fingerprint features, e.g., ridges and valleys. These small micro-LEDs can be placed directly on a silicon IC or on a TFT array. By placing a plurality of micro-LED light sources across a display (or a portion thereof), these micro-LEDs can be used to illuminate successive portions of a finger, allowing images of portions of a finger to be captured in sequence (or in parallel, if for example, the distance between micro-LEDs is sufficiently large that the portions of the finger and sensor being used to collect the images do not interfere with each other). In the case of cell phone displays, for example, the interaction distance may be on the order of a few millimeters.

In LCD and OLED display embodiments, the light source(s) 1402 may be placed on top of the TFT active matrix in locations that do not unduly interfere with the display operation or appearance. For OLED displays, the locations of the light source(s) 1402 may be between the red (R), green (G) and blue (B) OLED display emitters/subpixels, as depicted in FIG. 14. For LCDs, the light source(s) 1402 may be located anywhere that is not part of the clear aperture area of the LCD.

If external sunlight (or other ambient light) coming through the finger 1410 is very bright and interferes with the fingerprint image collection, in an embodiment a blue or green light may be used as a light source 1402, and an optional wavelength-selective filter (not shown) may be located over the photodetectors to block any light not coming from the micro-LED light sources.

In cases where the photosensor 1405 areal density is quite high and there is not much room available for additional micro-LEDs in the TFT/display array, in an embodiment, one or more photosensors 1405 can be replaced or covered by a micro-LED, and each corresponding pixel value in the sensor's images can be obtained by interpolating the values of nearby pixels. Various elements, e.g., cover glass, TFT, substrate encapsulation, etc. not specifically described with reference to FIG. 14 may be similar to like elements in other embodiments described herein and are not described further.

FIGS. 15A, 15B and 15C show OLED display embodiments including one or more dedicated OLED emitters operating as light sources for illuminating a sensing regions. FIG. 15A shows a cross section of an in-display optical sensor with a dedicated "bright OLED pixel" as a light source 1502 (also designated as "E") for illuminating an object/finger. FIG. 15B shows an example layout of photodiodes and multiple dedicated OLED emitters 1502 interspersed between red (R), green (G) and blue (B) OLED display emitters/subpixels according to an embodiment. FIG. 15C shows an example layout of photodiodes 1505 (also designated "PD") and dedicated OLED emitters 1502 (also designated "E") interspersed between red (R), green (G) and blue (B) OLED display emitters/subpixels, including a cluster of dedicated OLED emitters (E) 1502 hardwired together and operated as a single point source illuminator by an OLED driver circuit 1510 according to an embodiment. Various elements, e.g., cover glass, TFT, substrate encapsulation, etc. not specifically described with reference to FIG. 15A may be similar to like elements in other embodiments described herein and are not described further.

In these OLED display embodiments, the micro-LEDs are replaced (or supplemented) with dedicated OLED emitters 1502 or pixels that are capable of being driven at higher currents and intensities than other OLED display pixels. In some cases, OLED display emitters are not driven at a brightness much greater than 500 cd/m$^2$, to avoid premature aging and dimming of the OLED display, especially for blue emitters. This may correspond to an optical power output of the order of several nanowatts per OLED emitter/subpixel. Because point-source finger illumination schemes may sometimes use a light source that is no wider than the approximate feature sizes being imaged (such as 50-100 µm for some fingerprint sensors), this one or more adjacent or non-adjacent OLED display pixels can be illuminated simultaneously, requiring no more than a few tens of nanowatts of optical power.

Some light sources may only emit a small amount of light that may not be sufficient to obtain fingerprint images under some operating conditions (in daylight, for example). Thus, in some implementations a brighter small (e.g., <200 µm) light source is used. Although small (e.g., <20 µm wide) LEDs are capable of providing as much as 1 milliwatt of optical power, in some implementations it can be difficult to place such small LEDs between the OLED display emitters without unduly degrading the display appearance.

In some embodiments in accordance with FIGS. 15A, 15B and 15C, this dilemma can be addressed by placing additional OLED pixels or subpixels (or using existing OLED pixels) dedicated to optical sensing or illuminating the sensing region in between the OLED display pixels, and driving those dedicated OLED sensor pixels, subpixels, or emitters at a higher brightness level than non-dedicated display OLED display emitters, but for shorter durations than needed for display operation not using dedicated OLED sensor pixels.

In some embodiments, dedicated OLED sensor illumination emitters/subpixels can be placed in the dark areas between a non-dedicated OLED display's subpixels (e.g., red, green and blue subpixel emitters). These dedicated emitters could be distributed in a sparse fashion across an OLED display, or one or more of these could be located in a subset of the display. In some implementations, multiple dedicated OLED sensor emitters could be clustered to form larger (and brighter) multi-pixel illumination sources that are collectively operated together as a single point illumination source. The color (primary emission wavelength) of these dedicated pixels may be chosen to optimize the amount of light emitted, maximize their lifetime, and provide illumination that is compatible with the optical requirements for reading fingerprint images in potentially bright ambient light conditions. The dedicated OLED sensor emitters may all emit light in the same or similar wavelengths, or in some implementations, differently colored dedicated OLED emitters can be utilized together for multispectral optical sensing or other purposes.

The brightness at which the dedicated emitters can be driven may be chosen to provide enough light for fingerprint images to be collected, while preserving the dedicated emitters' lifetimes. OLED aging (time to a specific drop in brightness) is sometimes described as following a power-law of the form)

$$t_{bright}/t_{ref}=(L_{ref}/L_{bright})^\alpha$$

in which $L_{ref}$ and $L_{bright}$ are the reference and bright illumination levels, respectively, $\alpha$ is an acceleration factor, which can vary between 1.2-1.9 for various OLED device constructions, and $t_{ref}$ and $t_{bright}$ are the lifetimes while operating at the reference and bright illumination levels.

Because the dedicated emitters can be illuminated for far less time during an average day (e.g., less than 20 seconds in total according to one example usage) than the non-dedicated display emitters (e.g., up to several hours according to one example usage), the dedicated emitters can be driven at much brighter intensities (e.g., as much as 100× or more) than the non-dedicated OLED display pixel emitters, thereby providing enough light for fingerprint sensing applications.

These bright, dedicated OLED emitters may include modified TFT pixel circuitry to provide the higher drive currents necessary to produce more light, and the display/sensor driver ICs or peripheral circuitry may be designed to accommodate this short flash mode of operation when acquiring images.

Because there is a relatively small amount of space between the OLED emitters in high-resolution (e.g., 300+ dpi) displays that is available for photodiodes/photosensors, it may be preferable to replace individual photodiodes or photosensors with dedicated OLED emitters rather than requiring that the two sit side-by-side in an already crowded pixel. In this case, although the image read by the sensor would be missing sensor data at individual pixel locations, those missing pixel values may be interpolated based on surrounding pixel intensities, since fewer sensor light sources may be used than photosensors. Alternatively, the photosensors can be placed below the display substrate, some implementations of which are described elsewhere herein.

For some imaging applications and pixel pitches, it may not be necessary to include one photodiode 1505 per display element or pixel, as depicted in FIG. 15B (e.g., for imagers with large magnification factors, where the desired finger image resolution (e.g., in ppi) is smaller than the display/sensor pixel pitch). In some embodiments, the density of dedicated OLED emitters 1502 and photodiodes 1505 may be different, with dedicated emitters or clusters of dedicated emitters distributed across the display. Redundant dedicated emitters or clusters of dedicated emitters can be implemented such that the image sensor may switch to using a different emitter, or cluster, or set of clusters, to illuminate the finger and acquire images, for example, when a particular dedicated emitter or cluster begin to age or darken. Using such an approach, image post-processing may utilize knowledge of the locations of the changed active dedicated emitters or emitter clusters. Because the distances between active dedicated emitter clusters can be large in some embodiments (e.g., several millimeters), it is possible to drive these dedicated emitters at an even higher brightness that may produce premature aging, and then switch to new dedicated emitters or emitter clusters when the brightness has dropped to an unacceptable level.

FIG. 15B shows an example layout in which multiple dedicated sensor OLED emitters 1502 are arranged in a cluster. Although 5 OLED emitters 1502 are shown in FIG. 15B as forming a cluster, a cluster may include two or more emitters 1502. In some implementations, the cluster can be separately driven together to be operated as a single point source or light source. Alternatively, the cluster can be hardwired together as shown in FIG. 15C. A driver circuit 1510 may drive the same current onto separate electrodes of the cluster of dedicated OLED emitters 1502 without requiring separate channels or separate wiring in TFT display layers for the individual emitters of the cluster.

With reference now to FIGS. 16A, 16B, 16C, 16D, 17, 18A and 18B, certain embodiments provide an illumination source for an optical sensor, e.g., optical fingerprint sensor, using a point source illumination (or approximated point source illumination). In certain embodiments, a display device may include one or more LEDs 1602 bonded on the back of a display backplane (TFT) substrate 1606 or one or more LEDs bonded to a separate substrate 1607 that is be bonded/adhered to the backplane (TFT) substrate 1606. In some embodiments, these techniques may be implemented in an OLED (with a transparent substrate) or LCD display.

In-display optical fingerprint sensor embodiments based on point source illumination provide higher SNRs compared with collimator-based optical fingerprint sensors (FPSs) because the collimating filter (collimator) does not need to be used and bright axillary sources with intensities considerably higher than the display can be used to directly illuminate the finger (transmission through display can be 5-10% while a 1/10 aspect ratio collimator has a transmission of 0.5%, as an example). Moreover, collimator-based optical FPSs are difficult to implement in displays other than OLEDs, while the in-display optical FPS based on point source illumination can be implemented on other displays such as LCDs.

In the embodiments shown and described with reference to FIGS. 16A, 16B, 16C, 16D, 17, 18A and 18B an array of photo-detectors 1605, 1805 ("PD") is integrated in the backplane of the display and one or several point sources are used to illuminate the object, e.g., finger. The light from a point source reflected back from the finger/cover-glass interface or finger input surface and a magnified image (polar magnified around the point source) of the interface is captured on the photo-detector array. Embodiments using a point source (or arrays of point sources) for LCD and OLED displays are described herein.

For an OLED display, one or several LEDs 1602 can be bonded to the back of the display substrate 1606 as shown in FIG. 16B. Alternately, the one or more LEDs 1602 can be bonded to a separate substrate 1607 which may be bonded to the back of the OLED substrate 1606 as shown in FIG. 16A, e.g., using an optically clear adhesive (OCA).

For an LCD display, one or a cluster of micro-LEDs 1602 may be used as a point source for illumination. It may be useful to use a cluster of closely spaced micro-LEDs to avoid shadowing effect (as will be explained below). One or more micro-LEDs 1602 may be bonded to the back of the display TFT substrate as shown in FIG. 16D, or bonded to a separate transparent substrate 1607, which is located between the backlight and TFT substrates as shown in FIG. 16C. As shown in FIG. 17, to improve the uniformity of the display, in one embodiment, dummy light blocking features (patterns) 1705 are included across a portion of the display or across the entire display with the same size and pattern of the LED clusters. The dummy features 1705 may reduce the total brightness of the display but may improve the uniformity. The dummy pattern may include opaque features that periodically vary in accordance with a pattern formed by the micro-LEDs, an example of which is shown in FIG. 17. For example, the dummy pattern disposed over the backlight may include a plurality of light blocking features disposed between the backlight and the display substrate.

For an LED placed under the backplane, the light that illuminates the sensing region (e.g., finger in sensing region) can be blocked by TFTs, metal lines, OLED pixel elements, a black mask (in case of LCD), etc. Therefore, for example, if a small LED is used to illuminate the finger, parts of the finger may not be illuminated, which may prevent capturing a useful image from the shadowed location. On the other hand, a larger LED may result in a blurring effect as the light arrives on the sensor from different angles. This has been schematically illustrated in FIGS. 18A and 18B. In one embodiment, a maximum LED size or maximum LED cluster size allowed is selected. For example, a rough estimate for maximum LED size can be the resolution multiplied by the magnification factor. The magnification factor may depend on the distances between the light source, the sensor, and the cover-layer interface or sensing/input surface.

The distance between individual LEDs or each cluster of LEDs may depend on the sensitivity and dynamic range of photo-detectors (photosensors) as well as the output power of the source and location of the display and the source with respect to the cover-layer interface. The useful area on the detector is usually determined by the intensity of the source and dynamic range and noise in the detector, because the intensity of the light arriving at the detector follows an inverse relationship with the square of the radius. For a fixed light intensity, the noise of the sensor may determine the maximum imaging radius. This may result in a useful imaging area on the finger that is given by the useful image area on the detector divided by the magnification factor. For a fixed radius of the useful image, if a continuous image of the finger is needed, the light sources could have close distances so the finger images taken using each source overlap or meet.

Turning now to FIGS. 19A, 19B, 20A and 20B, additional optical sensor systems are described in accordance with certain embodiments. In the embodiments shown in FIGS. 19A, 19B, 20A and 20B, the sensor systems include an array of photo-detectors 1905, one or more LEDs 1902, a coating layer 1909 covering the photo-detector array 1905 (but not over the LED(s) 1902) with a refractive index lower than the refractive index of the display or a display layer 1930, and a light-absorptive coating 1933 (e.g., black mask) over the parts of the sensor substrate 1906 that is not occupied by the photo-detectors 1905. The low-index layer 1909 limits the angles from which the light reflects from the display and arrives at the photo-detectors 1905, hence, a portion of the sensor detects the light that is reflected from the finger/cover-layer interface 1912 while a majority of the light that is reflected from the display stack is rejected. The light-absorptive layer 1933 may prevent light from multiple reflection between the display and sensor that can reduce and blur the image quality by expanding the effective size of the illumination source.

A cross-section schematic of the sensor system showing the path of the light reflected from the display and the cover-layer interface is shown in FIG. 20A. LED 2005 provides ample light at an angle $\theta_c$ for imaging. A low index material 2009 is stacked between the photo-detectors and display (but not over the LED 2005) with an index m satisfying $\theta_c = \sin^{-1}(n_1/n_2)$ where nz is the index of the display substrate. This layer causes light coming toward the sensor at angles larger than $\theta_c$ to be reflected back. Hence, the reflected light from the display only reaches the photo-detector inside a radius smaller than $$R_{in} = 2 \times t_{disp} \times \tan \theta_c$$

Outside a radius larger than $R_{out} = 2 \times t_{stack} \times \tan \theta_c$, the specular-reflected light from cover-layer interface may not reach the sensor.

As a result, the region of the sensor between $R_{in}$ and $R_{out}$ radii around the LED 2005, as shown in FIG. 20B, captures an image that is mostly from the specular-reflected light from the finger/cover-layer interface while the specular-reflected light from the display will be rejected from display/low-index layer interface. As an example, assuming an angle of 65°, $n_2=1.4$, $t_{stack}$ of 1 mm, $t_{disp}$ of 0.2 mm:

$R_{in}=0.86$ mm
$R_{out}=4.29$ mm
$n_1=1.27$

It should be understood that the cross section schematic of FIG. 20A is not necessarily to scale so the thickness of the low-index layer 2009 may be smaller than the display substrate thickness $t_{disp}$.

Moreover, in some embodiments, the black mask or light absorptive layer is stacked below or above the low-index layer 2009.

In some embodiments, the LED 2005 is located above the photo-detector plane, for example on a separate substrate below the display. One or several closely placed LED's can be used as a single point source, however, the dimension of the source (e.g., distance between the farthest located LEDs) depends at least in part on the imaging resolution needed from the sensor. Approximately, for a resolution of R, the size of the source should be less than mR where m is the magnification ratio for the sensor.

FIG. 21 shows another embodiment of a fingerprint sensor 2100, which includes light sources 2102 at the display pixel layer and sensors 2105 below the display layer. In some implementations, the light source 2102 may include a micro-LED or bright OLED provided in the display layers as part of the display pixels used for presenting images or as dedicated sensor light source(s). Compared with photosensors in the display, the embodiment shown in FIG. 21 includes larger photosensors 2105, e.g., in the range of up 100 time bigger (e.g., than sensors 1905). Further, these photosensors 2105 do not take up space of the display layer, which is already crowded, and which frees the photosensor array from design constraints. For example, the display pixel pitch may be in the range of 40 µm to 60 µm, and the sensing pixel pitch may be made larger, e.g., 2 or 3 times larger, than the display pixel pitch.

For thin fingerprint image sensors, e.g., for mobile electronics devices, that employ point-source illumination of the finger, it is often useful to correct for a non-uniform image brightness and/or assemble a larger image from multiple partial finger images. For example, when a glass on which the finger is placed is quite thin (<1 mm), it is difficult to image a region of the finger larger than several millimeters wide when a single point light source is used to illuminate the finger. Therefore, some implementations reconstruct an image of a full finger by successively taking pictures of portions of the finger and reassembling those partial finger images into a single image of the finger. The brightness of each partial finger image may be quite non-uniform, but in a predictable and correctable way.

In some embodiments of point-source TIR (Total Internal Reflection) imaging, illuminating the object/finger with a small spot of light of roughly the same size as the features (e.g., finger ridges and valleys) to be imaged produces an image of the features within a small circle of the light source. The diameter of that circle may be several times the distance from the light source to the object/finger. One configuration of a light source 2302, sensor 2320 and a finger 2310 to be imaged, according to an embodiment, is depicted in FIG. 23. In other embodiments, the light source could be placed above or below the photosensor layer.

If an array of light sources is distributed across the sensor, each light source can illuminate a portion of the object/finger above and near it, and by combining several images captured as the light sources are illuminated in a sequence, a larger image or representation of the entire object/finger may be constructed. FIGS. 22A, 22B and 22C illustrate assembly of multiple partial finger images into a single finger image according to an embodiment. FIG. 22A shows two partial finger images, each taken in a different portion of the sensing region as defined by a light source, e.g., LED location. FIG. 22B shows the brightness and contrast of the two partial finger images after being renormalized/brightness-corrected as will be described herein. FIG. 23C shows a composite image of a larger portion of the finger—the central portions of each of the two renormalized images are centered on the respective light source (LED) locations in the composite image.

With an imaging system including a plurality of light sources, the image captured by the photosensor array may be a magnified image of the object/finger. If the light source(s) and the sensor array are in the same plane, the image magnification may be 2×, but when the light source(s) and sensor array are at different distances from the object/finger, this magnification ratio may change: when a light source is closer to the object/finger than the sensor is, the magnification ratio increases, and when a light source is farther from the object/finger than the sensor is, the magnification ratio decreases. Depending on manufacturing and assembly tolerances, and whether another clear layer (such as a screen protector) is placed on top of the cover layer, the magnification ratio may change noticeably. It is therefore desirable, in certain embodiments, to measure the magnification ratio during use rather than relying on a potentially inaccurate or outdated assumed magnification ratio.

The magnification ratio is determined, in an embodiment, by capturing an image with no object/finger present over the sensor. Such an image may look like that shown in FIG. 24B (left side). The center of the image is relatively dark, where the light ray angles from the light source to the object/finger and sensor are below the total internal reflection angle (for light attempting to leave the cover glass into air), and the image is much lighter outside that central circle, when the light ray angles exceed the total internal reflection angle. The transition from the dark central region to the brighter region occurs at the total internal reflection angle (about 42 degrees off normal for glass and air). Knowing the total internal reflection angle and distance $r_{TIR}$ (see, e.g., FIG. 23) of this transition in the captured image from the light source, the distance from the sensor to the finger, and therefore the image magnification ratio, may be determined.

Because the amount of light reaching the object/finger (and the sensor) far from the illumination source drops off quickly, images acquired may be dark near the centers of the LEDs (for light rays reflecting off the glass surface below the TIR angle), bright in a ring around this central circle (above the TIR angle), and then dark again farther from the LED as the amount of light then falls quickly with distance from the LED (see, FIG. 24B, for example). These strong average intensity variations can be reduced dramatically by using a radial brightness correction method or algorithm.

In some embodiments, a brightness correction method includes identifying the darkest and brightest intensities found in successively larger rings around the illumination source, and creating two corresponding curves or models $I_{min}(r)$ and $I_{max}(r)$ that record the brightest and darkest intensity levels as a function of the distance r from the illumination source.

Each pixel's intensity may be replaced with its fraction of the maximum-minimum brightness for all pixels at that distance from the illumination source, for example:

$$I_{new}(x, y) = \frac{I_{old}(x, y) - I_{min}(r(x, y))}{I_{max}(r(x, y)) - I_{min}(r(x, y))}$$

This may have the effect of stretching the fractional contrast to nearly 100% everywhere in the image, as long as the brightness variations depend primarily on the distance from the central illumination source.

Certain embodiments may apply brightness correction independently to each of the images of the different portions of a finger. It may be desirable to use a composite or average $I_{min}(r)$ and/or $I_{max}(r)$ that are representative of the illumination conditions of more than one of the LEDs for consistent brightness correction across multiple individual images.

In some embodiments, after brightness corrections have been applied to each of the images acquired for each single illumination source, the images are stitched together or otherwise related to or associated with each other based on the locations of the light sources and the image magnification ratios. This is done in one embodiment by shrinking each image by its magnification ratio and centering that image on its illumination source (e.g., LED) location. Another embodiment includes scaling up the LED locations by the image magnification ratio, and centering each of the unscaled images at the new scaled-up LED locations. In the examples depicted in FIG. 26 and FIG. 27, the latter method was used. FIG. 26 is a depiction of an image stitching process used to create the composite image shown in FIG. 22C; sections of the independently acquired images are stitched together, with portions of each image placed into the (lower) composite image, with each portion centered at the LED locations (after the LED locations have been scaled up by the finger-to-imager magnification ratio). FIG. 27 illustrates results of image stitching using a median thresholding method according to an embodiment.

In certain embodiments, arrays of illumination sources (such as LEDs) may be positioned so that there is some degree of overlap in the regions of the finger being illuminated by each of the LEDs. In these overlap regions, the system may decide which LED's image to use. One selection method is to choose the image that is closest to the light source. This may accomplished generally by constructing a Voronoi cell map of proximity to each light source, or, if the LED locations are placed accurately in a regular array, the nearest LED can be found using just each pixel's row and column number.

In some embodiments, an image-stitching map is constructed that uses image characteristics in addition to the LED locations to decide which portions of the LED's images are placed into which portions of the composite image or composite fingerprint representation.

In one embodiment, a thresholding method, based on contrast or distance, is used to determine the acceptable segment of the brightness-corrected LED's images. For each point of the to-be stitched image, points from the LED's images in which the point falls in the acceptable segment of the image is selected. Next, an aggregate statistic such as a weighted average or median brightness is calculated from the selected image points. The weight(s) can be based on or function of the distance, contrast, or simply equal for all of the selected images. Then, based on the calculated average brightness and a threshold value, the brightness value may be selected for the point. As an example, FIG. 27 shows the results of image-stitching using a median brightness (equal weights) and brightness threshold of 120/255. A radius of 150 pixels from center of the LED has been used to determine the acceptable segments of the LED's images.

Some alternative method embodiments of stitching the images may be based on calculating the local contrast for points in the LEDs' images. For multiple points or each point of a to-be stitched image, the brightness value from the LED image that has the highest local contrast for that point is selected. The local contrast is determined based on the statistics of brightness values in the vicinity of the pixel. One method to determine the local contrast is the degree of bimodal distribution for, e.g., the distance between modes or the sharpness of the modes.

Other method embodiments of normalizing and constructing a composite image of a finger may be developed to perform the brightness corrections, including empirical methods that do not use radial brightness corrections, or methods that build (or calculate) and store a brightness calibration map. After these image processing steps are performed, the normalized and/or composited fingerprint image may be used for fingerprint or biometric matching (e.g., verification, identification, authentication, etc.) or stored in an enrollment template or template storage (e.g., as a full image, compressed image, extracted feature set, etc.).

For embodiments with an optical sensor (e.g., an optical fingerprint sensor) located under a display with an illumination source (such as a point light source), the light may be reflected from the back of the display and degrade the quality of the image captured by the sensor. The intensity of this light can also be higher than the light reflecting or returning from the sensing surface (e.g., finger on sensing surface) and may reduce the dynamic range of the signal that can be detected. Hence, in some embodiments, methods for suppressing these reflections are provided. With reference to FIGS. 28-32, certain embodiments of an optical sensor are described for fingerprint imaging through displays using an under-display illumination scheme. Additional embodiments and aspects can be found in U.S. patent application Ser. No. 15/990,353, filed on May 25, 2018, and titled "SYSTEMS AND METHODS FOR REDUCING UNWANTED REFLECTIONS IN DISPLAY SYSTEMS INCORPORATING AN UNDER DISPLAY BIOMETRIC SENSOR", which is hereby incorporated by reference for all purposes.

The sensors of the embodiments in FIGS. 28-32 include an array of photo-detectors (photosensors), one or more light sources, such as LEDs, an optional absorptive layer under the display patterns and/or a circular polarizer (comprising a quarter wavelength retarder and a linear polarizer) located on the back of the display to minimize the reflections from display layers. An optional light-absorptive coating (black mask) is used over the parts of the sensor substrate that is not occupied by the photo-detectors or on both display and sensor side. The absorptive layer(s) and the circular polarizer reduces direct light reflections from reaching the photo-detectors without first being reflected from the glass-finger interface, hence improving the quality of captured images.

FIGS. 28-32 illustrate embodiments including a fingerprint sensor 2850 and one or more illuminations sources 2802 located under a display substrate (e.g., an OLED display) 2830. In some implementations, the light budget available to the photo-detectors 2804 can be substantially higher than collimator-based optical fingerprint sensors (OFPS). In a collimator based OFPS, the light that arrives at the sensor from above the display is attenuated by the display (e.g., in some implementations only 5% of the light passes the display) and the collimator (e.g., in some implementations 0.5% of the signal transmitted for a 1/10 collimator), resulting in only 0.025% total transmission. In contrast, using an illumination source (e.g., one or more point sources) scheme from under the display, less attenuation can result because of a double pass through the display resulting in 0.25% total transmission. However, if a light source is placed under the display, the reflection from the display may degrade the signal. For example, when an optical biometric sensor, such as an optical fingerprint sensor, with an illumination source (such as one or multiple light sources 2802) is located under the display substrate 2830, the light emitted by the illumination source 2802 may be reflected from the display (e.g., metal lines 2840 of the display stack on the display substrate 2830) to the sensor and may degrade the quality of the biometric object image captured by the sensor. The intensity of this light can also be higher than the light reflecting or returning from the object (e.g., finger) or sensing surface itself and may reduce the dynamic range of the object (e.g., finger) signal that can be detected.

In certain embodiments, suppressing these reflections at the back side of the display is accomplished using a circular polarizer layer disposed between the sensor substrate and the display. With reference to FIGS. 28-32, embodiments of an optical fingerprint sensor for fingerprint imaging through a display using an under-display illumination source scheme are shown, including a circular polarizer 2820 to absorb the light that is reflected (2) from the display while allowing the reflections (1) from a finger to arrive at the sensor. The sensors of the embodiments in FIGS. 28-32 include an array of photo-detectors (photosensors) 2804, one or more light sources 2802, e.g., LEDs, and a circular polarizer layer 2820 (including a quarter wave retarder layer or plate 2822 and a linear polarizer 2824) located between the photosensors 2804 and the back of the display substrate 2830 to minimize reflection from display layers, e.g., metal lines 2840, in the display stack. FIG. 28 is similar to FIG. 31, but includes an optional layer (e.g., optically clear adhesive or "OCA") 2814 under the display substrate 2830, as well as a cover layer 2808.

FIG. 32 shows different configurations of an absorptive layer under the display to minimize the display reflections, in accordance with some embodiments. In one embodiment, an absorption layer or black mask is deposited under the display metal patterns and covered by an insulator layer (e.g., passivation layer) that planarizes the surface of the substrate for subsequent backplane fabrication. Alternatively, a multilayer thin-film absorber can be formed directly with the metal patterns, by adding and absorber and oxide layers below the metal (see, also FIG. 29). In some embodiments, thin film absorbers can be patterned with the same step that patterns the metal layers, allowing for no change in the display backplane fabrication process. One specific example of such thin film absorber is a Cr/SiO2 stack or W/SiO2 stack where the absorber thickness is about 7 nm and the Oxide thickness is about 60 nm. Because performance of the thin film stacks may be angle dependent, another embodiment includes a high-index layer, (e.g., $TiO_2$), in combination with the multilayer thin-film absorber to reduce those effects for higher angles. FIG. 30 compares reflectance of bare metal and metal with a thin film stack.

In some embodiments, e.g., as shown in FIGS. 28 and 31, a circular polarizer positioned between the light source and the display (e.g., laminated to the bottom of the display substrate) may also reduce reflections from the display (e.g., metal layers in the display) while allowing the light from the finger sensing region to pass through due to different reflectivity characteristics of these interfaces.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An optical sensing system, comprising:
    a display substrate;
    a plurality of display elements;
    a sensor light source for illuminating a sensing region, wherein the sensor light source is separate from the plurality of display elements, and wherein the sensor light source is disposed under the display substrate; and
    a detector for detecting light from the sensing region;
    wherein the plurality of display elements comprises a color filter, a liquid crystal material disposed between the display substrate and the color filter, and a backlight disposed under the display substrate, and
    wherein the sensor light source comprises a micro LED arranged in a cluster of multiple micro LEDs.

2. The optical sensing system of claim 1, wherein the sensor light source is disposed in an opaque region of an active area of the display substrate.

3. The optical sensing system of claim 1, further comprising a dummy pattern disposed over the backlight, the dummy pattern comprising a plurality of light blocking features disposed between the backlight and the display substrate.

4. The optical sensing system of claim 1, wherein a width of the sensor light source or a width of the cluster is configured to emit light around a shadowing feature disposed in an illumination path between the sensor light source and the sensing region.

5. The optical sensing system of claim 1, wherein the plurality of display elements comprises display pixel circuitry disposed over the display substrate, wherein the optical sensing system further comprises:
    a transparent cover sheet disposed over the display pixel circuitry, wherein a top surface of the transparent cover sheet provides a sensing surface for an object;
    wherein the sensor light source is disposed under the display substrate; and
    wherein the detector includes a plurality of photosensors disposed under the display substrate.

6. The optical sensing system of claim 5, further comprising:
    a low index layer disposed below the display substrate and disposed over the plurality of photosensors, wherein the low index layer is not disposed over the sensor light source, and wherein the low index layer has an index of refraction lower than the display substrate.

7. The optical sensing system of claim 6, further comprising:
    a light absorbing layer disposed in an area between the plurality of photosensors.

8. An optical sensing system, comprising:
    a display substrate;
    a plurality of display elements;
    a sensor light source for illuminating a sensing region, wherein the sensor light source is separate from the plurality of display elements, and wherein the sensor light source is disposed under the display substrate;
    a detector for detecting light from the sensing region;
    wherein the plurality of display elements comprises a color filter, a liquid crystal material disposed between the display substrate and the color filter, and a backlight disposed under the display substrate, wherein the color filter comprises a color filter layer having an opaque portion and a plurality of different subpixel color filters, wherein the color filter layer is disposed over the liquid crystal material;
    a display pixel circuitry for applying current to the liquid crystal material, wherein the display pixel circuitry is disposed over the display substrate; and
    a transparent cover sheet disposed over the color filter, wherein a top surface of the transparent cover sheet comprises a fingerprint sensing surface disposed within an areal extent of an active area of the display substrate;
    wherein the sensor light source comprises a micro light emitting diode (LED) for illuminating a finger contacting the fingerprint sensing surface with emitted light, wherein the micro LED is disposed within the areal extent of the active area; and wherein the detector comprises a detector array having a plurality of photosensors for detecting returned light from the fingerprint sensing surface, wherein the returned light corresponds to interaction of the emitted light with the finger, wherein the plurality of photosensors are disposed within the areal extent of the active area.

9. The optical sensing system of claim 8, wherein the micro LED is disposed between the backlight and the display substrate or is disposed between the display substrate and the color filter layer.

10. The optical sensing system of claim 8, wherein the opaque portion of the color filter layer comprises a black matrix.

11. The optical sensing system of claim 8, wherein the plurality of photosensors are disposed over the display substrate.

12. An optical sensing system, comprising:
a display substrate;
a plurality of display elements;
a sensor light source for illuminating a sensing region, wherein the sensor light source is separate from the plurality of display elements, and wherein the sensor light source is disposed under the display substrate; and
a detector for detecting light from the sensing region;
wherein the detector includes a detector array disposed over the display substrate, wherein the detector array comprises a plurality of photosensors arranged a plurality of rows and a plurality of columns; wherein the sensor light source is disposed in a first position aligned with one of the rows and one of the columns, wherein the first position is free of any photosensor.

13. The optical sensing system of claim 12, further comprising:
processing circuitry coupled to the detector array, wherein the processing circuitry is configured to receive a plurality of pixel values from the plurality of photosensors, and wherein the processing circuitry is configured to determine a value of a pixel corresponding to the first position based on one or more pixel values of the plurality of pixel values.

14. The optical sensing system of claim 13, wherein the processing circuitry is configured to determine the value of the pixel by interpolating a plurality of surrounding pixel values that surround the first position.

15. An optical sensing system, comprising:
a display substrate;
a plurality of display elements;
a sensor light source for illuminating a sensing region, wherein the sensor light source is separate from the plurality of display elements, and wherein the sensor light source is disposed under the display substrate;
a detector for detecting light from the sensing region; and
a display pixel circuitry disposed over the display substrate;
wherein the plurality of display elements comprises a plurality of organic light emitting diode (OLED) sub-pixels for displaying visible images;
wherein the sensor light source includes a sensor OLED separate from the plurality of OLED sub-pixels, wherein the sensor OLED is disposed over the display substrate.

16. The optical sensing system of claim 15, wherein the sensor OLED is configured to be driven with a higher current than the plurality of OLED sub-pixels.

17. The optical sensing system of claim 15, wherein the sensor OLED is configured to emit higher intensity light than the plurality of OLED sub-pixels.

18. The optical sensing system of claim 15, further comprising one or more other sensor OLEDs in addition to the sensor OLED, wherein the sensor OLED and the one or more other sensor OLEDs are arranged in a cluster.

* * * * *